United States Patent
Kim et al.

(10) Patent No.: US 10,355,220 B2
(45) Date of Patent: *Jul. 16, 2019

(54) ORGANIC LIGHT EMITTING DISPLAY DEVICE

(71) Applicant: LG DISPLAY CO., LTD., Seoul (KR)

(72) Inventors: Shinhan Kim, Seoul (KR); Dohan Kim, Goyang-si (KR); Hyoseok Kim, Daejeon (KR); Min Yun, Suwon-si (KR); Seunghee Yoon, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 162 days.

This patent is subject to a terminal disclaimer.

(21) Appl. No.: 15/136,665

(22) Filed: Apr. 22, 2016

(65) Prior Publication Data

US 2017/0092871 A1    Mar. 30, 2017

(30) Foreign Application Priority Data

Sep. 25, 2015 (KR) .......................... 10-2015-0136854

(51) Int. Cl.
*H01L 51/00* (2006.01)
*H01L 51/50* (2006.01)

(52) U.S. Cl.
CPC ........ *H01L 51/0067* (2013.01); *H01L 51/504* (2013.01); *H01L 51/5012* (2013.01); *H01L 51/5072* (2013.01)

(58) Field of Classification Search
CPC ............. H01L 51/0072; H01L 51/0052; H01L 51/0067; H01L 51/0068; H01L 51/0073; H01L 51/5072; H01L 51/5088; H01L 51/504; H01L 51/0058; H01L 51/0054; H01L 51/0074; H01L 51/5092; H01L 51/5278
USPC .................. 428/690, 411.1; 252/301.16, 582
See application file for complete search history.

(56) References Cited

U.S. PATENT DOCUMENTS

| | | | | |
|---|---|---|---|---|
| 8,178,215 B2 * | 5/2012 | Yabe | .................... | C07D 401/14 313/502 |
| 9,590,182 B2 * | 3/2017 | Kageyama | ............ | C07C 211/61 |
| 9,624,193 B2 * | 4/2017 | Aihara | ................. | C07D 239/26 |
| 10,068,948 B2 * | 9/2018 | Yun | ...................... | H01L 51/5092 |
| 2012/0214993 A1 * | 8/2012 | Aihara | ................. | C07D 239/26 544/180 |
| 2013/0134405 A1 * | 5/2013 | Wang | ...................... | C07C 13/66 257/40 |
| 2014/0158999 A1 * | 6/2014 | Jung | ....................... | C09K 11/06 257/40 |
| 2015/0097162 A1 * | 4/2015 | Ono | .................... | H01L 51/0071 257/40 |
| 2015/0144937 A1 * | 5/2015 | Park | ...................... | H01L 51/0067 257/40 |
| 2015/0155511 A1 * | 6/2015 | Ohsawa | .............. | H01L 51/5016 257/40 |
| 2015/0236274 A1 * | 8/2015 | Hatakeyama | ....... | H01L 51/0072 257/40 |
| 2015/0303380 A1 * | 10/2015 | Kambe | ................ | C07D 487/14 257/40 |
| 2016/0043327 A1 * | 2/2016 | Yoo | ....................... | H01L 51/504 257/40 |
| 2016/0172598 A1 * | 6/2016 | Lee | ...................... | C07D 403/10 257/40 |
| 2016/0372524 A1 * | 12/2016 | Yun | ...................... | H01L 51/5092 |
| 2017/0054084 A1 * | 2/2017 | Kim | ...................... | H01L 51/0058 |
| 2017/0092870 A1 * | 3/2017 | Kim | ...................... | H01L 51/0052 |
| 2018/0090686 A1 * | 3/2018 | Yoon | .................. | H01L 51/0062 |
| 2018/0114917 A1 * | 4/2018 | Lee | ...................... | C07D 403/10 |
| 2018/0155325 A1 * | 6/2018 | Lee | ...................... | C07D 403/04 |

OTHER PUBLICATIONS

CAS reg. No. 2055648-65-0, Jan. 9, 2017. (Year: 2017).*

* cited by examiner

*Primary Examiner* — Douglas J McGinty

(74) *Attorney, Agent, or Firm* — Dentons US LLP

(57) ABSTRACT

An organic light emitting display device is disclosed. The organic light emitting display device comprising at least one light emitting part between an anode and a cathode and comprising at least one organic layer and a light emitting layer, wherein the at least one organic layer comprises a compound that includes a functional group having at least three or more nitrogen atoms and has high electron mobility, a bridge connected to the functional group, and a substituent substituted at a meta position of the bridge.

9 Claims, 6 Drawing Sheets

ORGANIC LIGHT EMITTING DISPLAY DEVICE

This application claims the priority benefit of Korean Patent Application No. 10-2015-0136854 filed on Sep. 25, 2015, which is incorporated herein by reference for all purposes as if fully set forth herein.

BACKGROUND

Field of the Invention

The present disclosure relates to an organic light emitting display device. More particularly, the present disclosure relates to an organic light emitting display device with improved efficiency and lifetime.

Discussion of the Related Art

Image displays, used for displaying a variety of information on the screen, are one of the core technologies of the information and communication era. Such image displays have been developed to be thinner, lighter, and more portable, and furthermore to have high performance With the development of the information society, various demands for display devices are on the rise. To meet these demands, research on panel displays such as liquid crystal displays (LCD), plasma display panels (PDP), electroluminescent displays (ELD), field emission displays (FED), organic light emitting diodes (OLED), etc. is actively under way.

Among these types of flat panel displays, OLED devices are advantageous in that they can be fabricated on a flexible substrate such as plastic, operate at a low voltage of 10 V or less, have lower power consumption, and deliver vivid color reproduction, as compared with plasma display panels or inorganic light emitting displays. Also, the organic light emitting display devices are spotlighted as next-generation display devices that provide rich colors for its ability to render full color images using three colors: red, green, and blue.

An organic light emitting display device can be formed by sequentially stacking an anode, a hole injection layer, a hole transport layer, a light emitting layer, an electron transport layer, an electron injection layer, and a cathode. An exciton is formed by the recombination of electrons and holes injected from the two electrodes, causing luminescent materials to emit fluorescent or phosphorescent light. The light emitting layer comprises a host and one or more dopants, or comprises two or more hosts and a dopant. The hole injection layer and the hole transport layer inject electrons from the anode into the light emitting layer, and the electron transport layer and the electron injection layer inject electrons from the cathode into the light emitting layer.

The lifetime and efficiency of the organic light emitting display device are affected by the material used and its stacked structure. In this regard, there are ongoing studies to improve the lifetime and efficiency of organic light emitting display devices.

SUMMARY

Accordingly, the present disclosure is directed to an organic light emitting display device having improved efficiency and lifetime.

To achieve this and other advantages and in accordance with the purpose of the invention, as embodied and broadly described, an exemplary embodiment of the present invention provides an organic light emitting display device comprising at least one light emitting part between an anode and a cathode and comprising at least one organic layer and a light emitting layer, wherein the at least one organic layer comprises a compound that includes a functional group having at least three or more nitrogen atoms that has high electron mobility, a bridge connected to the functional group, and a substituent substituted at a meta position of the bridge.

The substituent maximizes the effect of triplet-triplet annihilation by breaking a conjugation of the compound.

The at least one organic layer includes an electron transport layer.

The at least one light emitting part comprises at least two or more light emitting parts, and one of the at least two or more light emitting parts is a blue light emitting part and the another one of the at least two or more light emitting parts is a yellow-green light emitting part.

The organic layer is included in the blue light emitting part.

The compound having the substituent at the meta position of the bridge enhances efficiency and lifetime and reduces operating voltage compared to the compound having a substituent at a para position of the bridge.

The compound is represented by the following Chemical Formula 1:

[Chemical Formula 1]

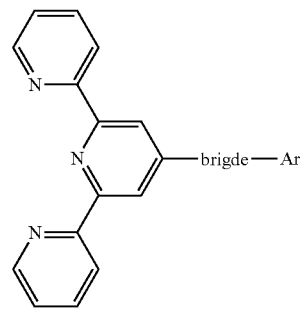

wherein the bridge includes one among biphenyl and naphthylphenyl, Ar is substituted at the meta position of the bridge, Ar includes a substituted or unsubstituted heteroaromatic group having 1 to 3 nitrogen atoms that has a molecular weight of 400 or less.

The compound represented by Chemical Formula 1 includes one among the following compounds represented by Chemical Formulae 2 to 5:

[Chemical Formula 2]

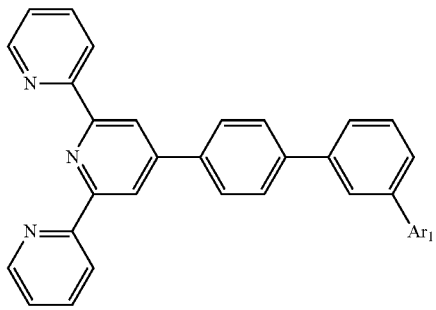

[Chemical Formula 3]

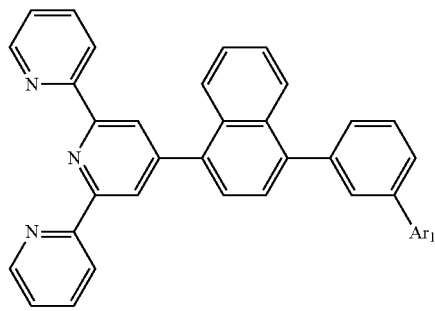

[Chemical Formula 4]

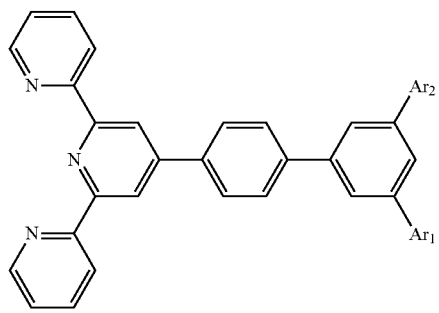

[Chemical Formula 5]

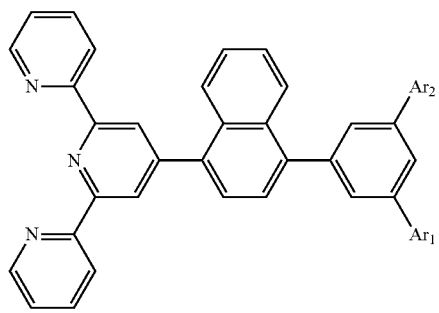

wherein, in Chemical Formulae 2 to 5, Ar₁ includes a substituted or unsubstituted heteroaromatic group having 1 to 3 nitrogen atoms that has a molecular weight of 400 or less, and in Chemical Formulae 4 and 5, Ar₂ includes a substituted or unsubstituted heteroaromatic group having 1 to 3 nitrogen atoms that has a molecular weight of 400 or less.

The compound represented by Chemical Formula 1 includes one among the following compounds:

1-1

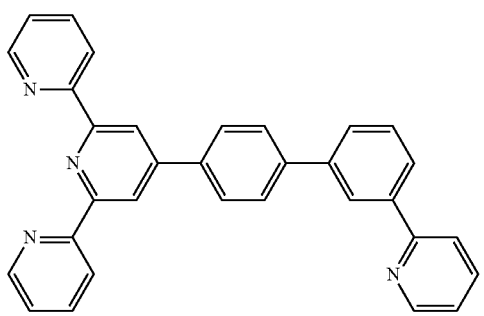

1-2

1-3

1-4

1-5

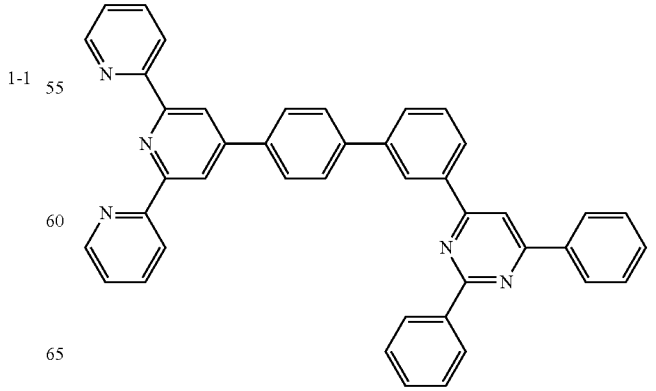

1-6
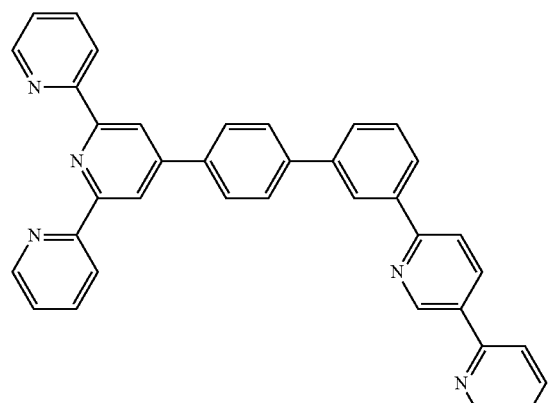
1-7
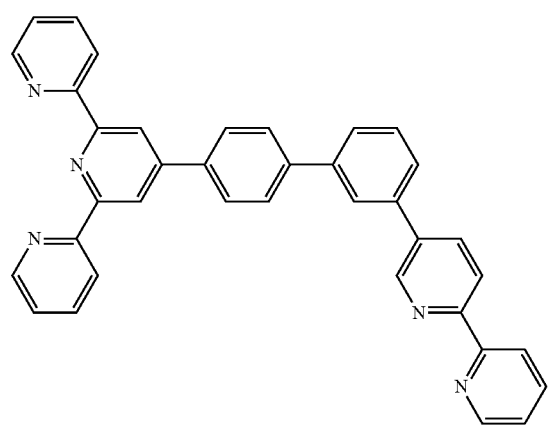
1-8
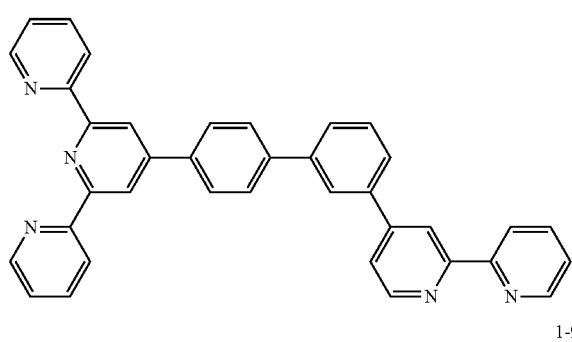
1-9
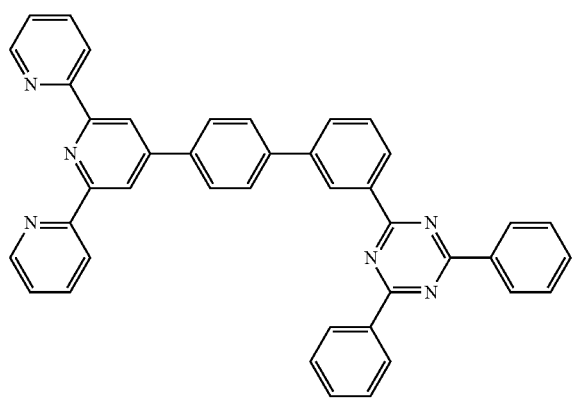
1-10
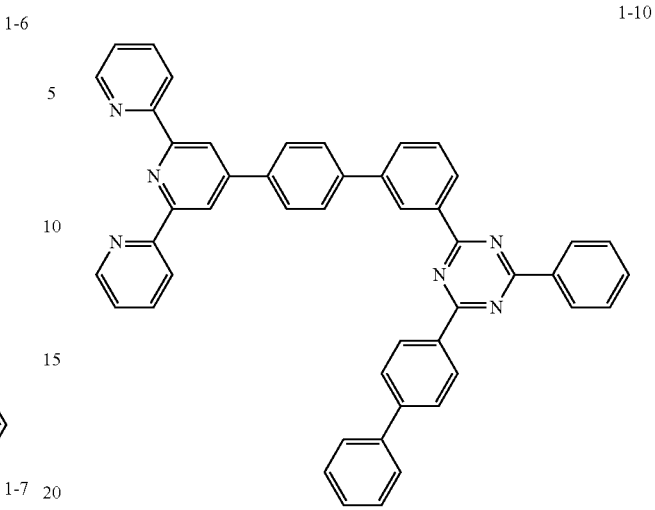
1-11
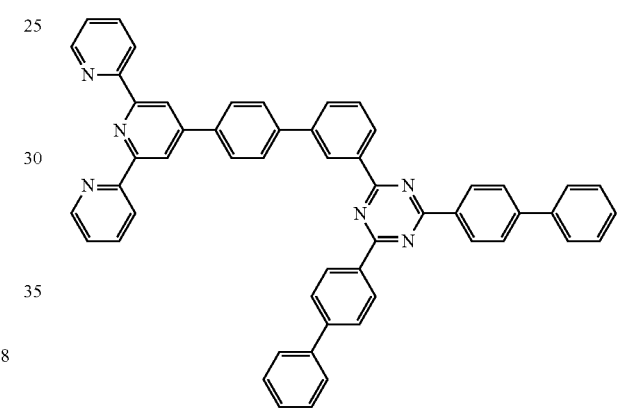
2-1
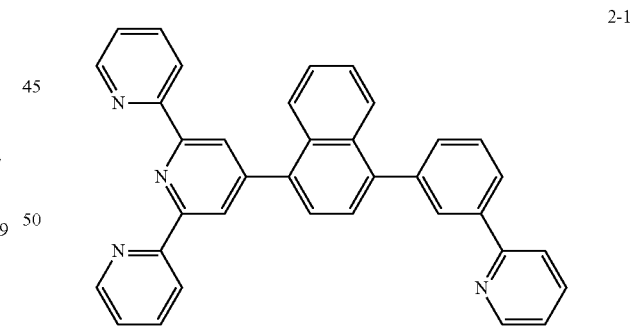
2-2
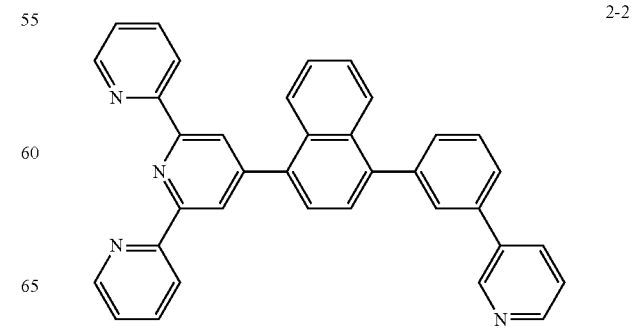

2-3
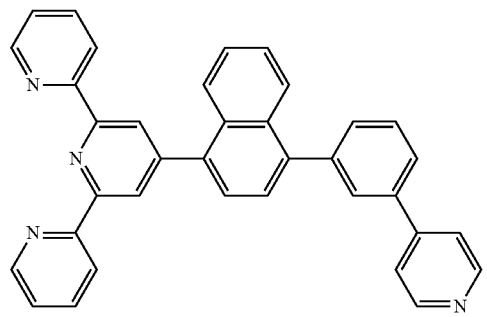
2-4
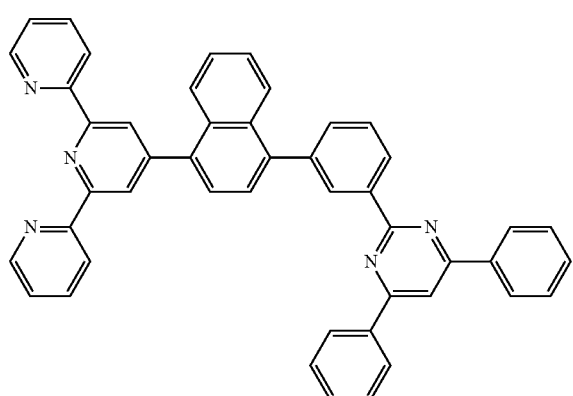
2-5
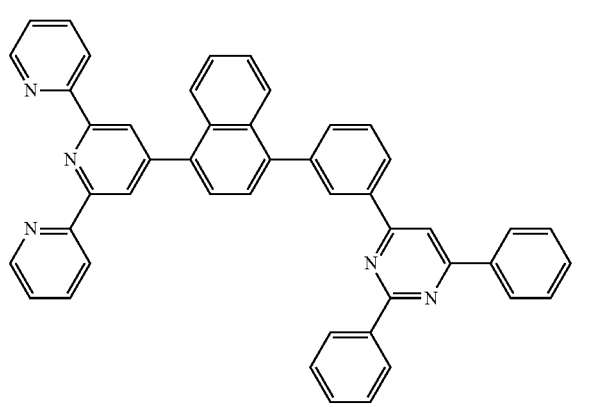
2-6
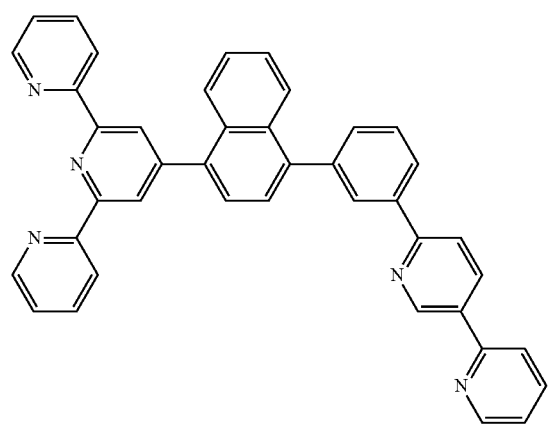
2-7
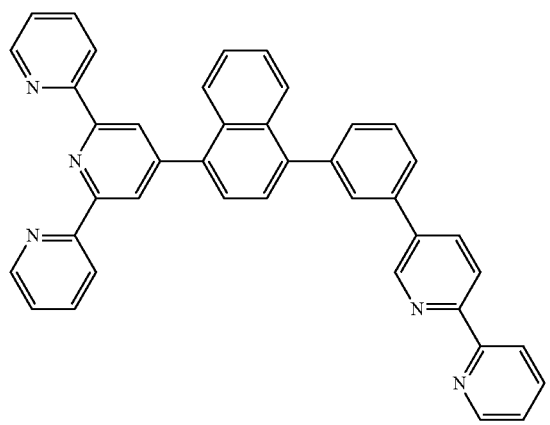
2-8
2-9
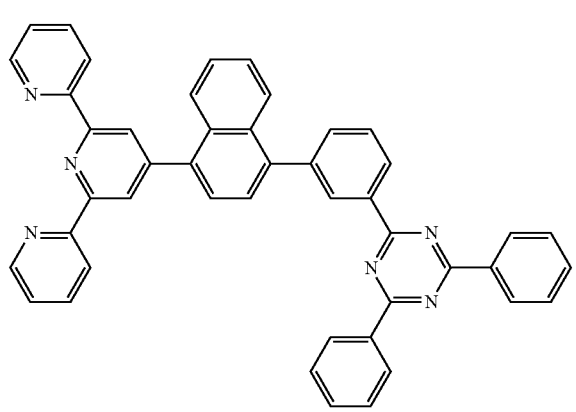

2-10
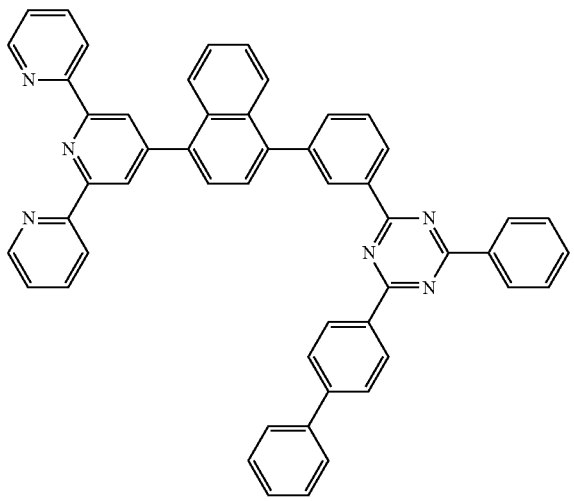
2-11
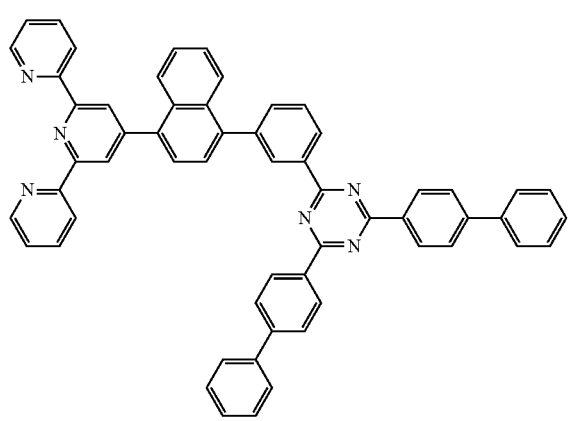
3-1
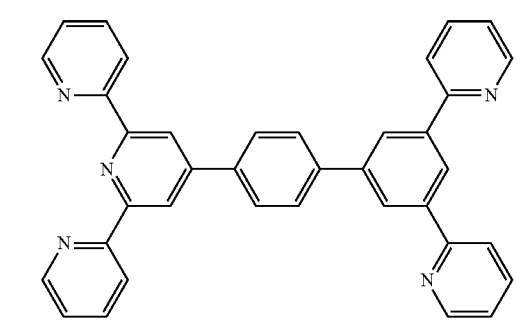
3-2
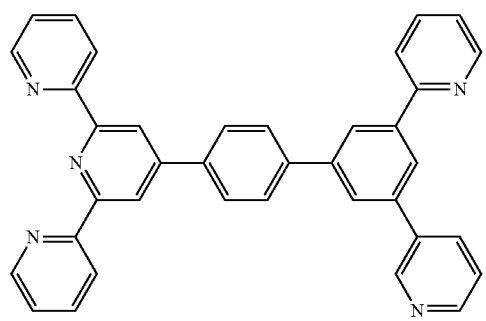
3-3
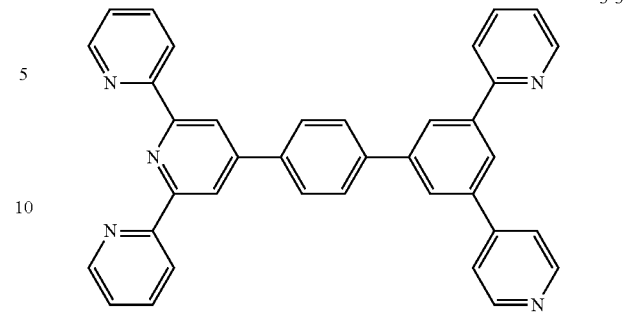
3-4
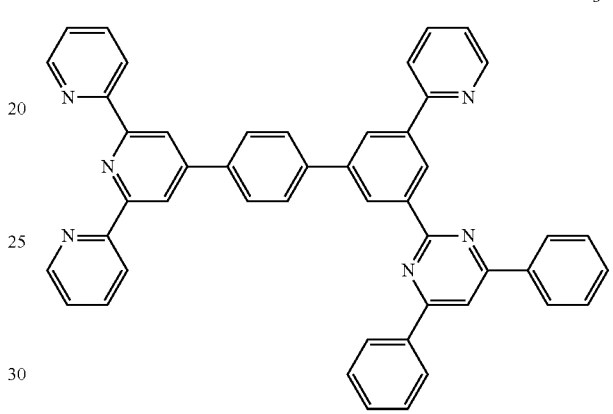
3-5
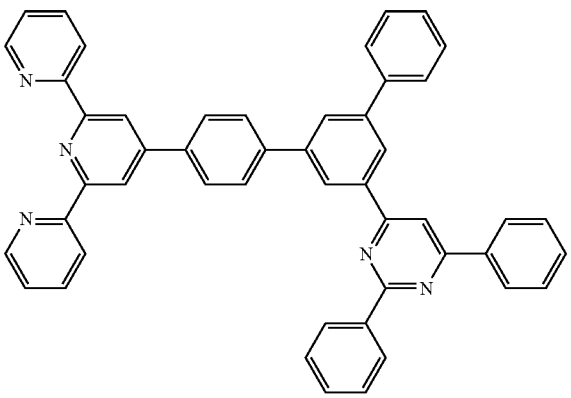
3-6

3-10
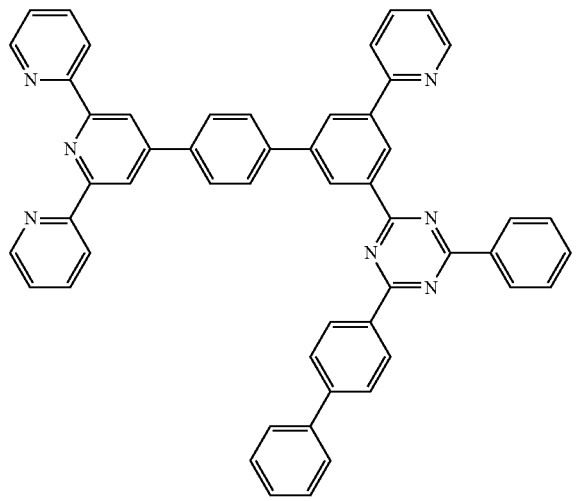
3-11
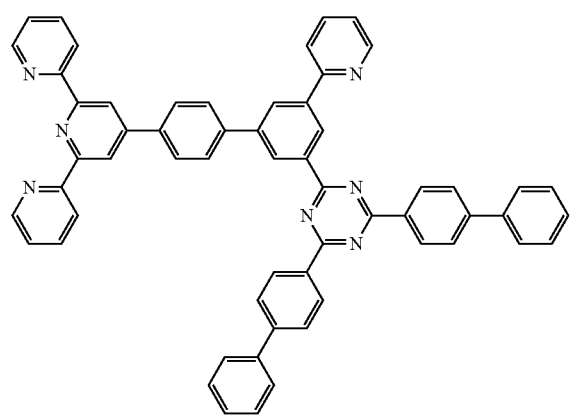
3-12
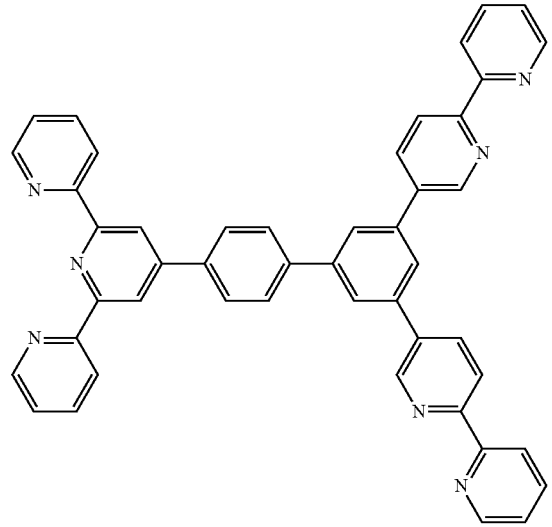
3-13
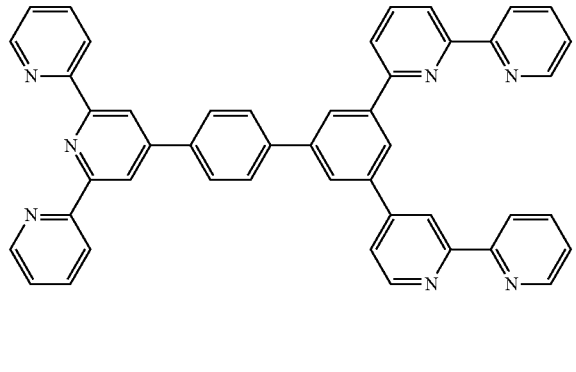
3-14
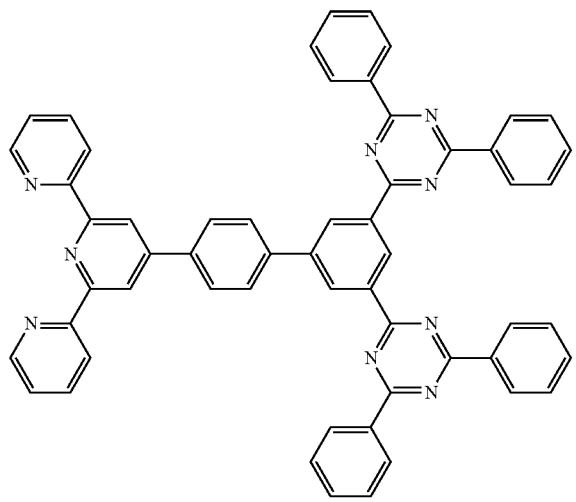
3-15
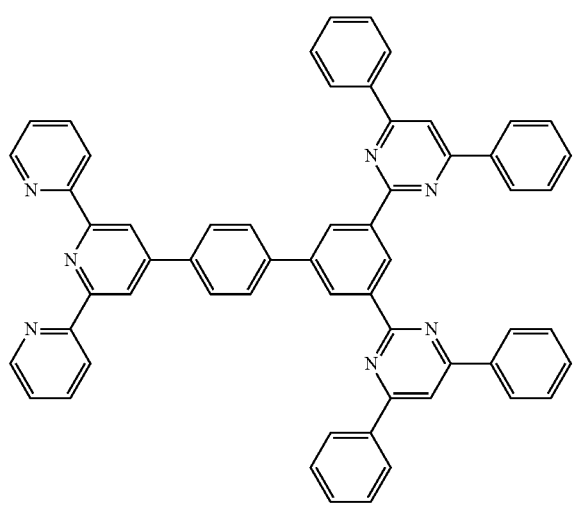

3-16
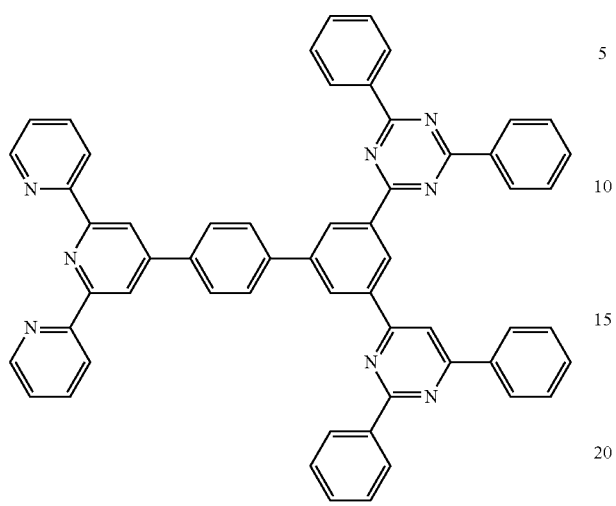
3-17
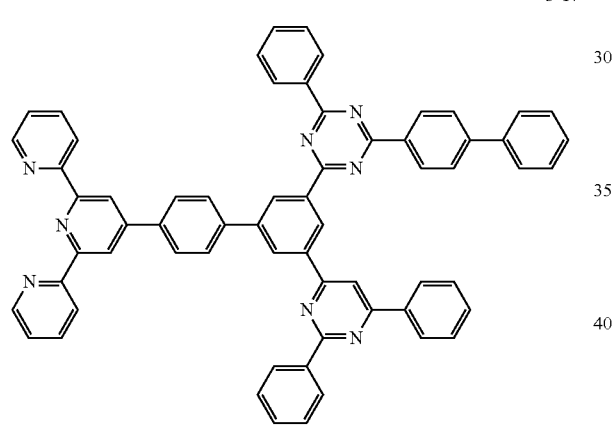
3-18
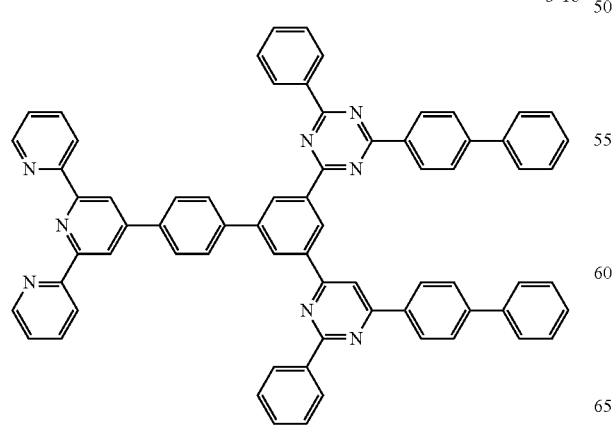
4-1
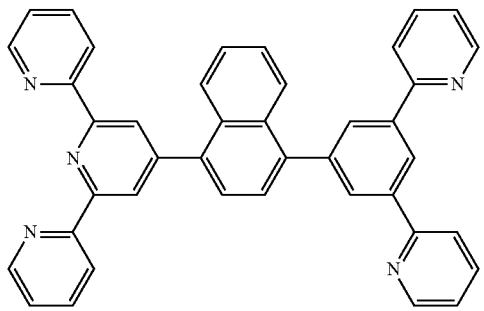
4-2
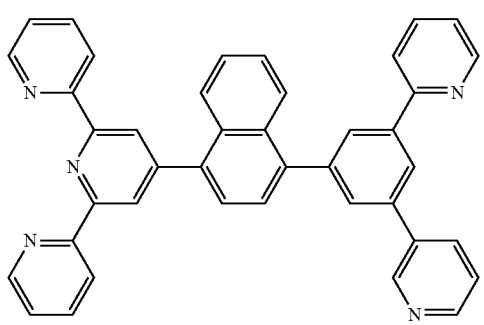
4-3
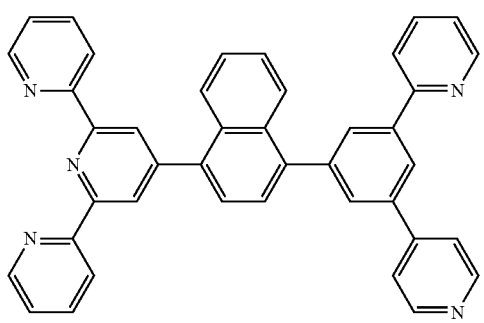
4-4
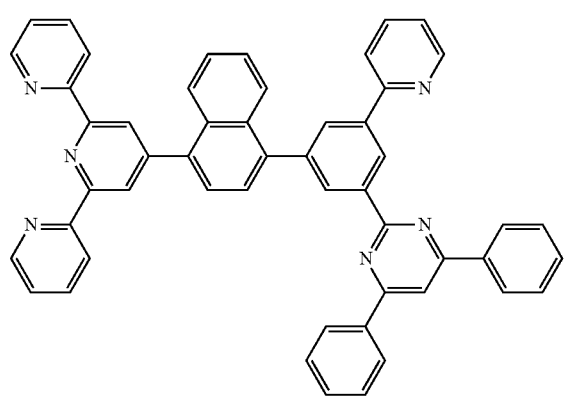

4-5
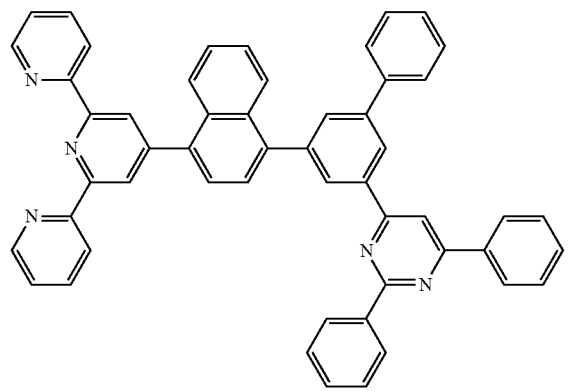
4-9
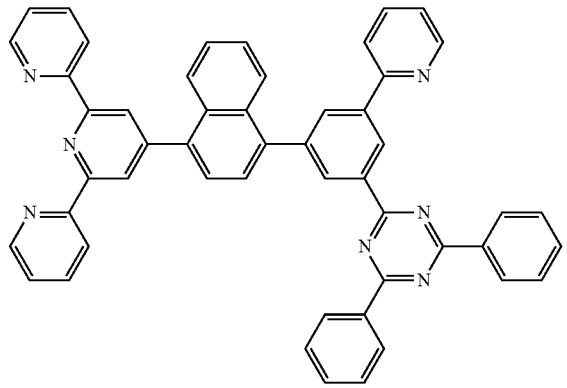
4-6
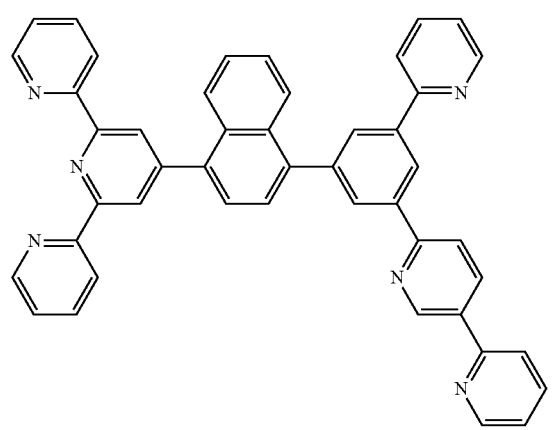
4-7
4-8
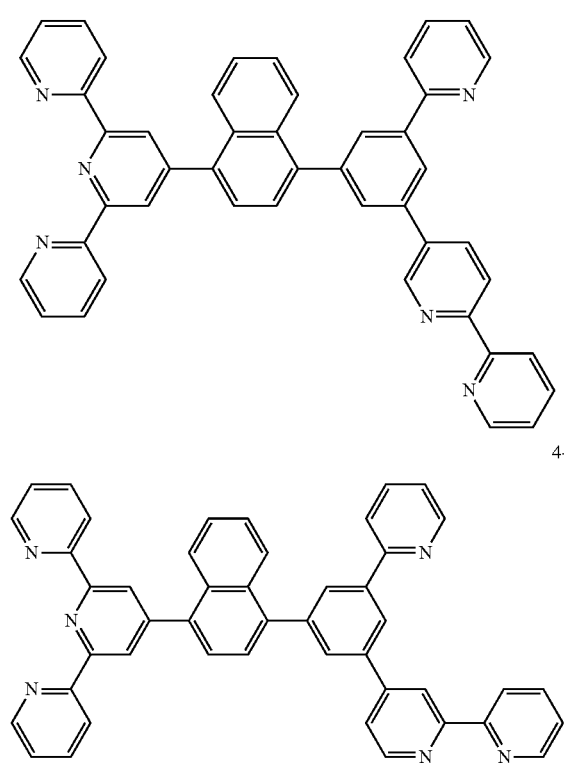
4-10
4-11
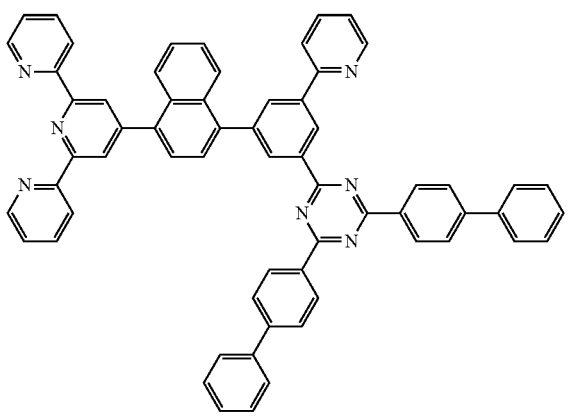

4-12

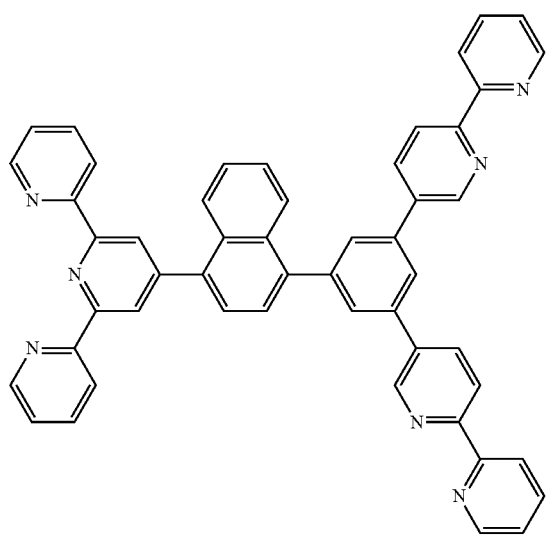

4-13

4-14

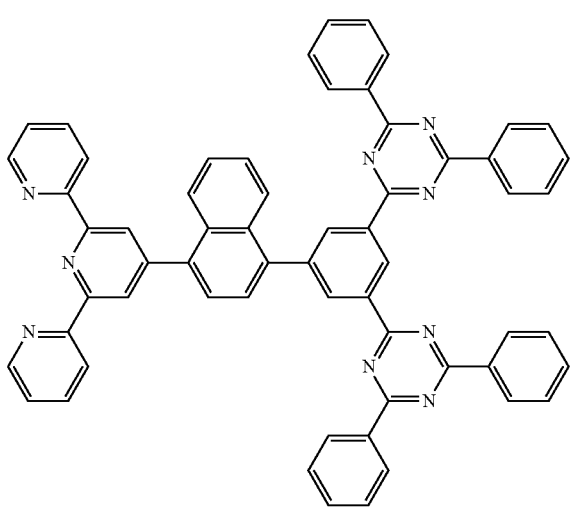

4-15

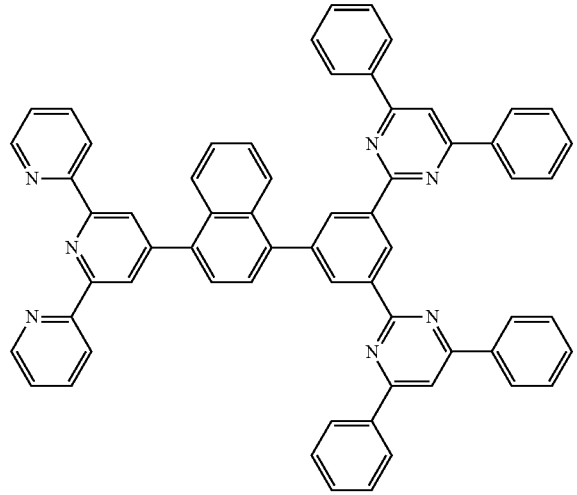

4-16

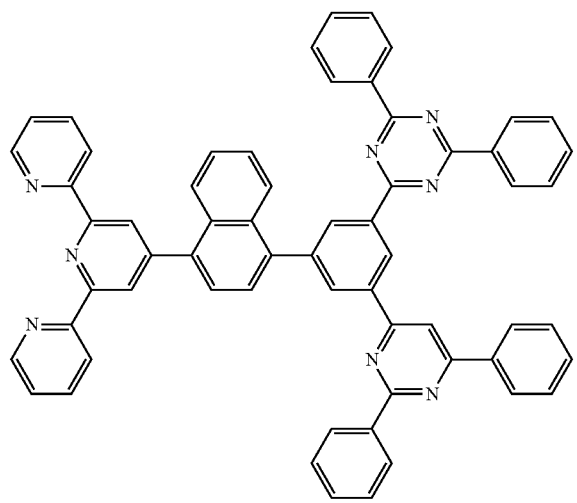

An exemplary embodiment of the present invention provides an organic light emitting display device comprising at least one light emitting part between an anode and a cathode and comprising at least one organic layer and a light emitting layer, wherein the at least one organic layer includes a compound that is represented by the following Chemical Formula 1:

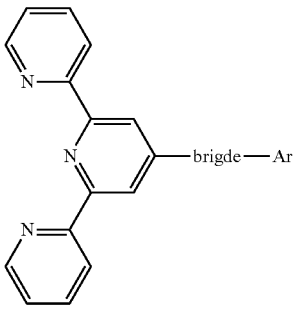

wherein the bridge includes one among biphenyl and naphthylphenyl, Ar is substituted at the meta position of the bridge, Ar includes a substituted or unsubstituted heteroaromatic group having 1 to 3 nitrogen atoms that has a molecular weight of 400 or less.

Ar is substituted at the meta position of the bridge.

The compound having the substituent at the meta position of the bridge enhances efficiency and lifetime and reduces operating voltage compared to the compound having a substituent at a para position of the bridge.

A molecular weight of the Ar is 400 or less so as to break a conjugation of the compound and maintain an electron mobility of the compound.

The compound represented by Chemical Formula 1 includes one among the following compounds represented by Chemical Formulae 2 to 5:

[Chemical Formula 2]

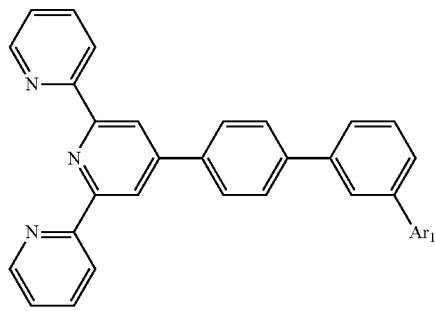

[Chemical Formula 3]

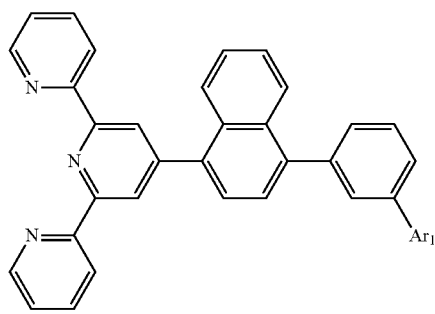

[Chemical Formula 4]

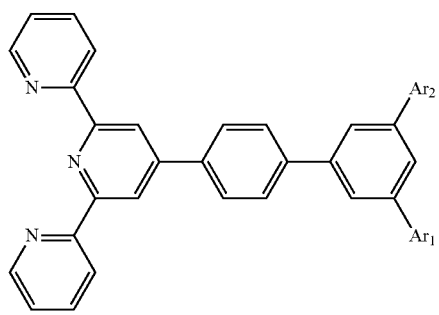

[Chemical Formula 5]

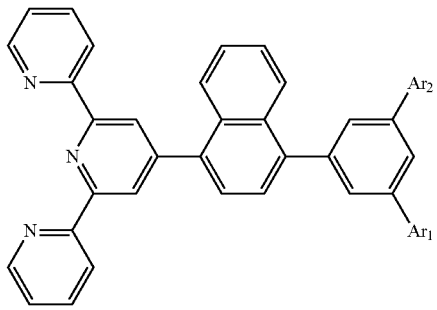

wherein, in Chemical Formulae 2 to 5, $Ar_1$ includes a substituted or unsubstituted heteroaromatic group having 1 to 3 nitrogen atoms that has a molecular weight of 400 or less, and in Chemical Formulae 4 and 5, $Ar_2$ includes a substituted or unsubstituted heteroaromatic group having 1 to 3 nitrogen atoms that has a molecular weight of 400 or less.

The compound represented by Chemical Formula 1 includes one among the following compounds:

1-1

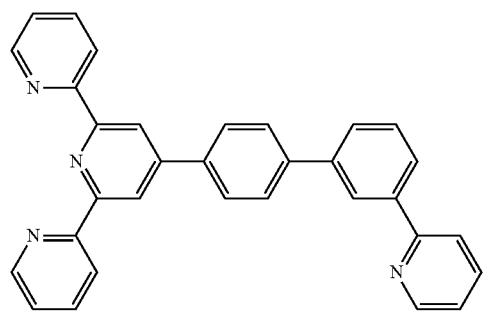

1-2

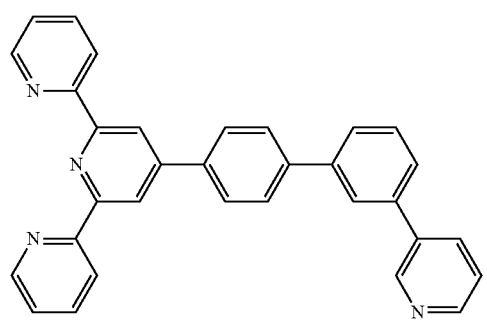

1-3

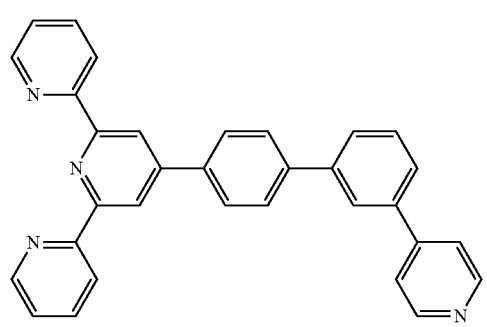

1-4
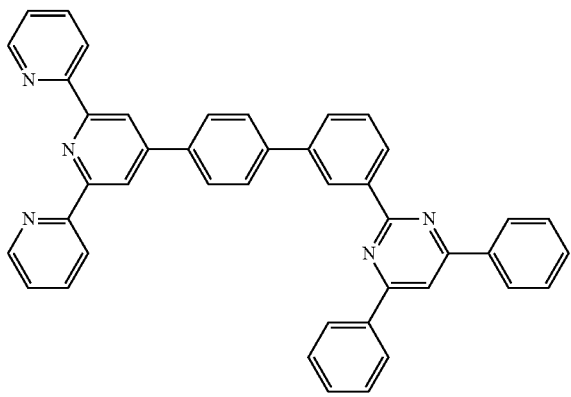
1-5
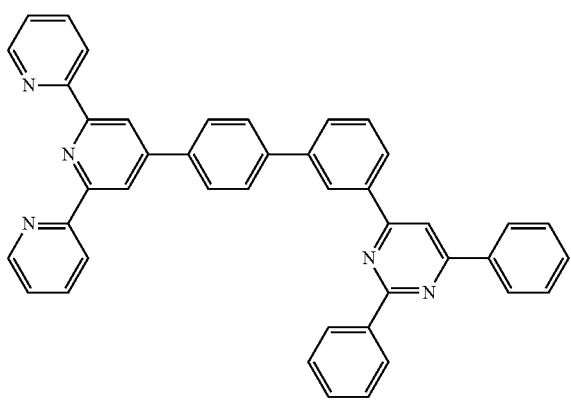
1-6
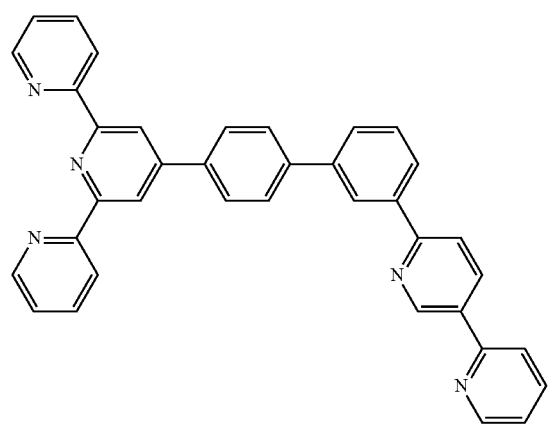
1-7
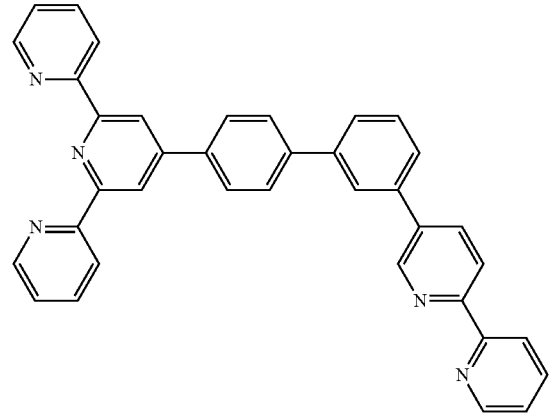
1-8
1-9
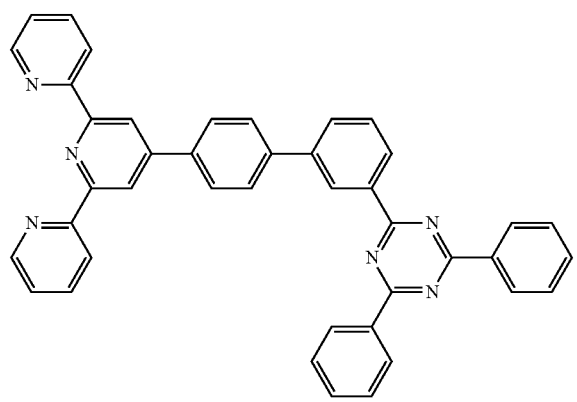

1-10
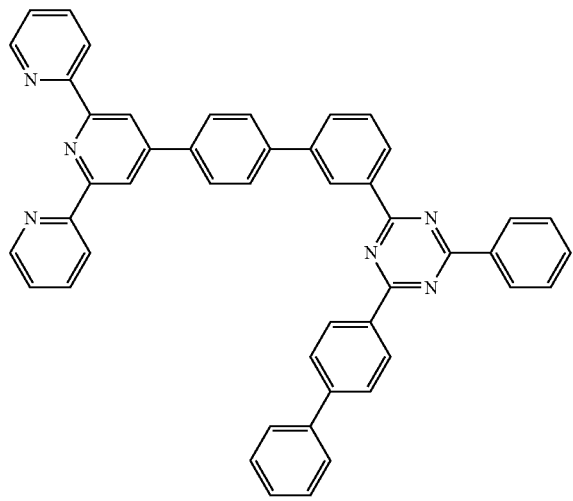
1-11
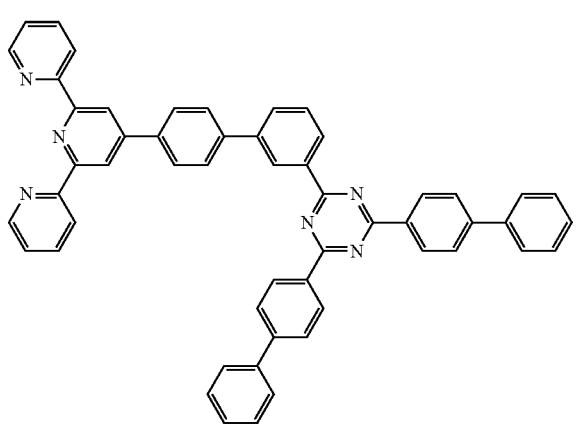
2-1
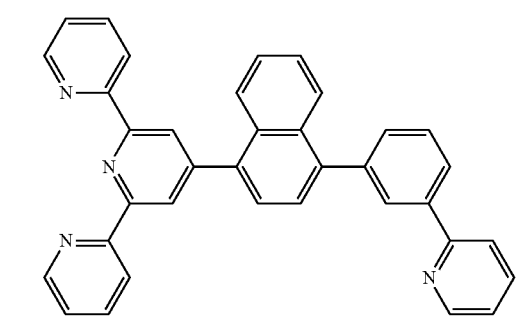
2-2
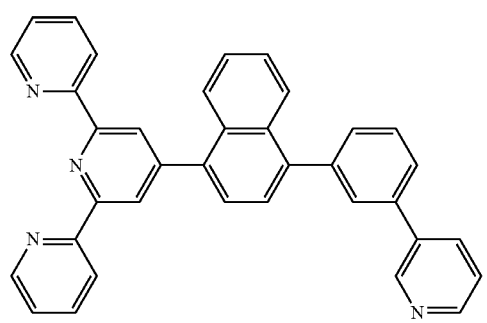
2-3
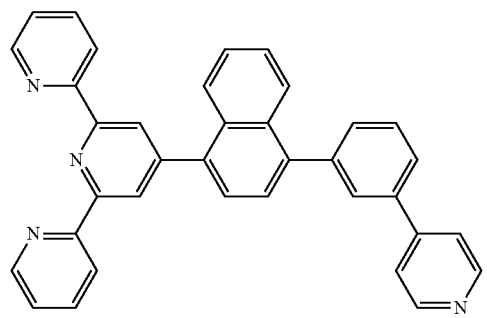
2-4
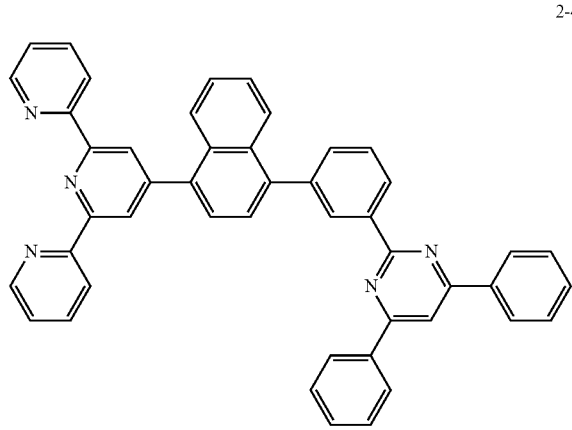
2-5
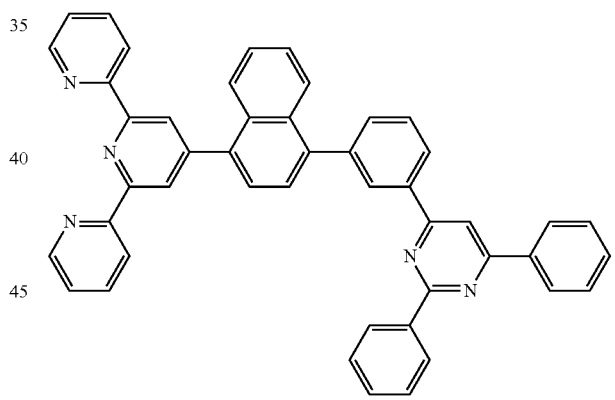
2-6
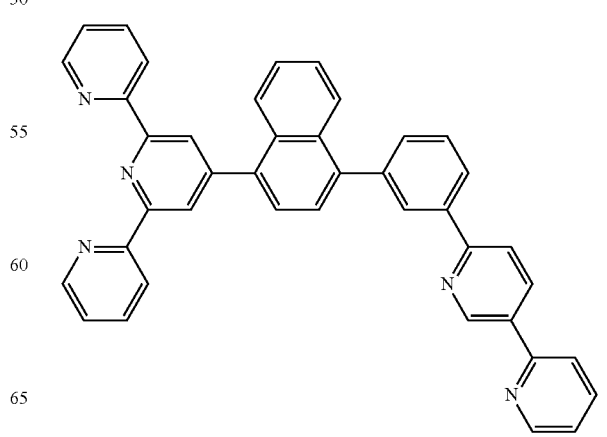

2-7
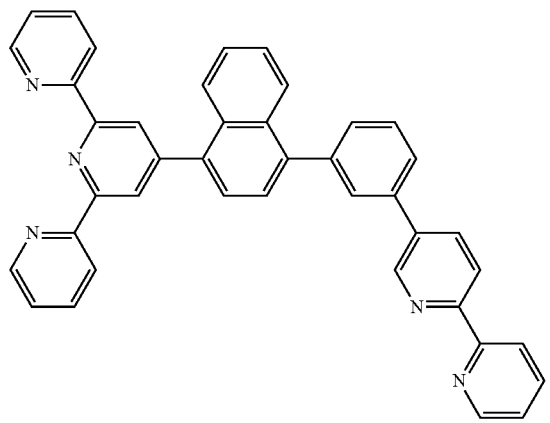
2-8
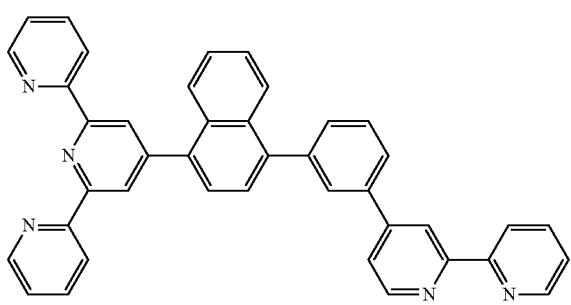
2-9
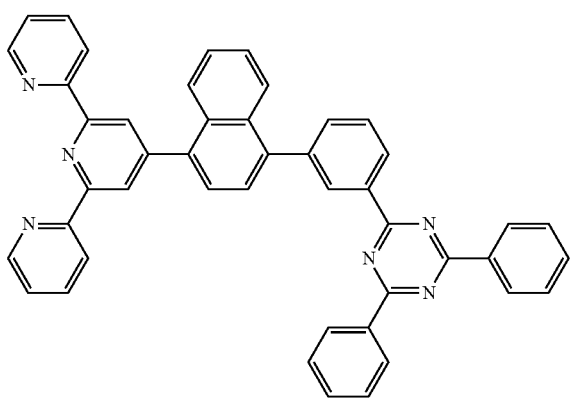
2-10
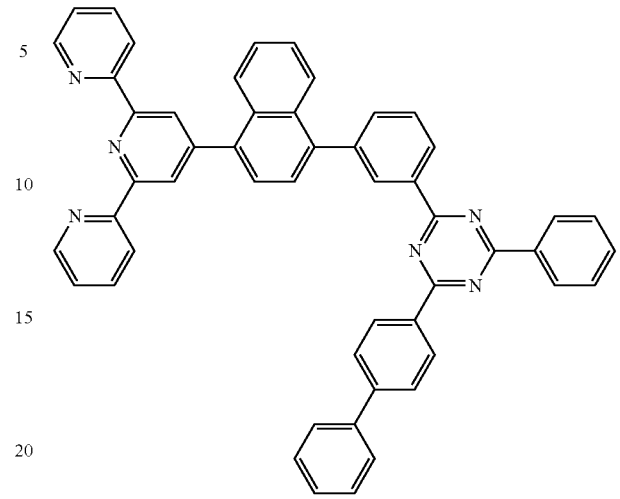
2-11
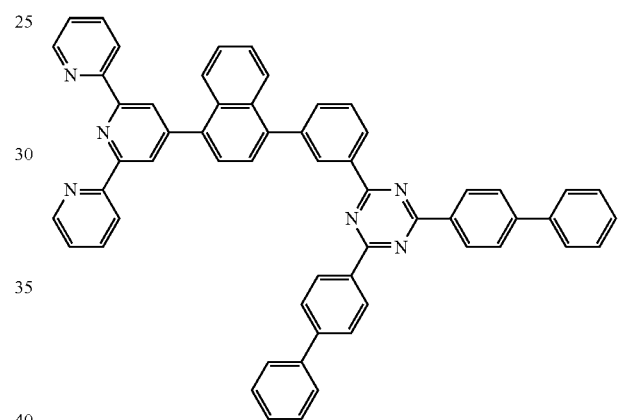
3-1
3-2
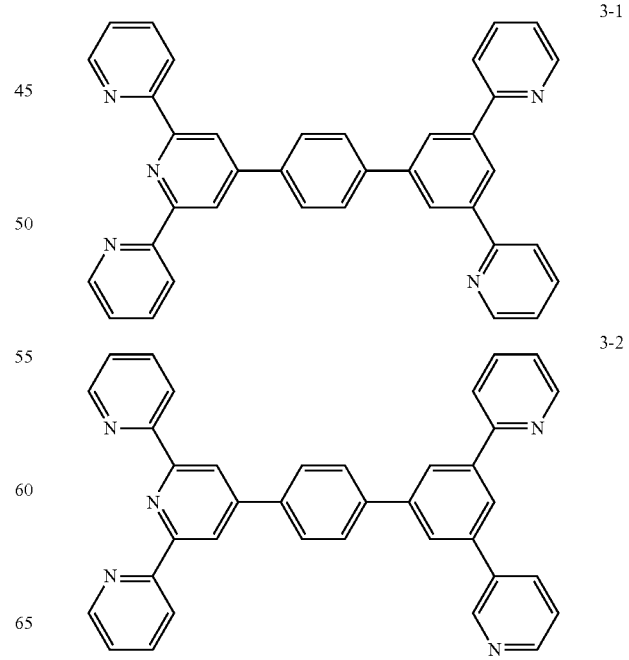

3-3
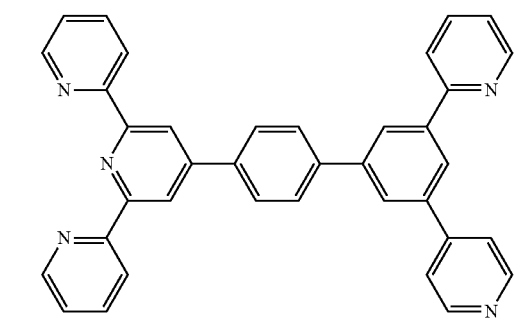
3-4
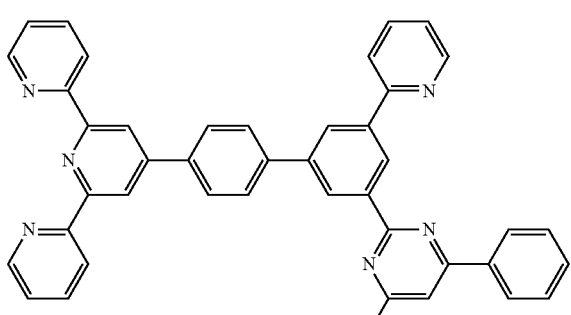
3-5
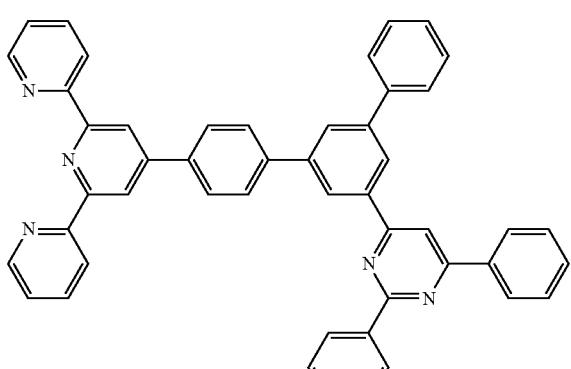
3-6
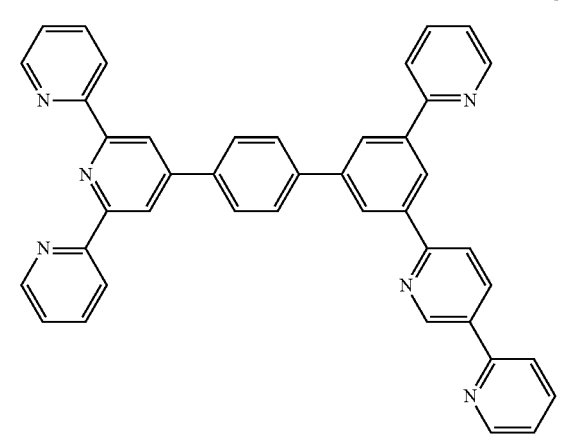
3-7
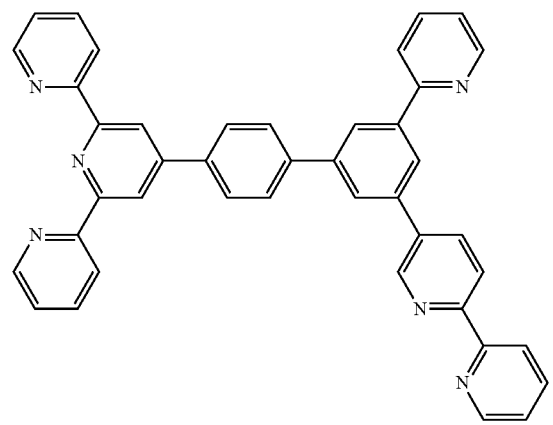
3-8
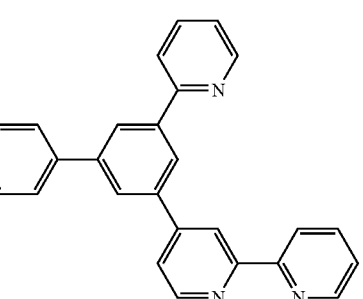
3-9
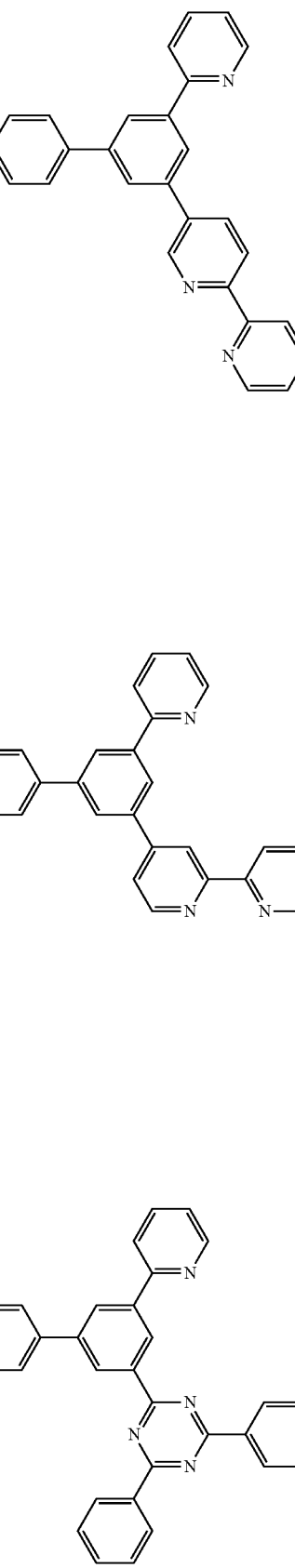

3-10
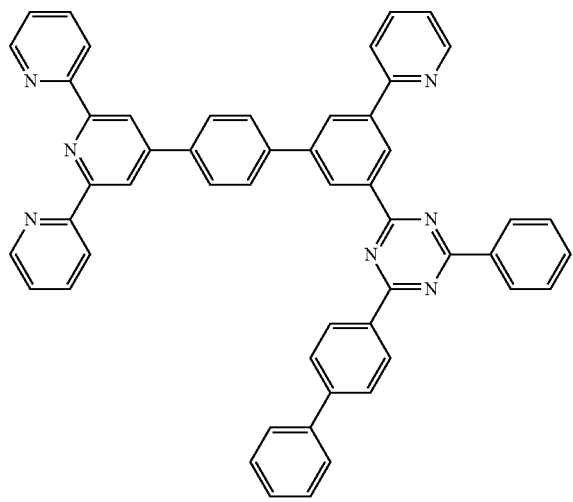
3-13
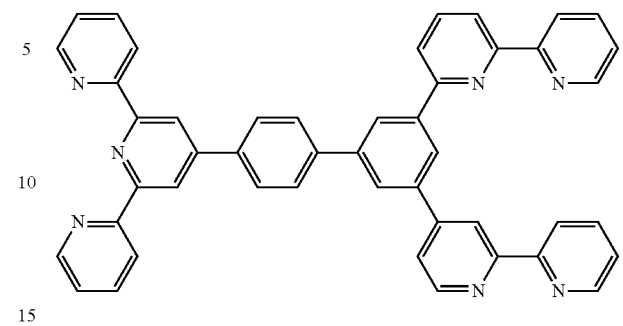
3-11
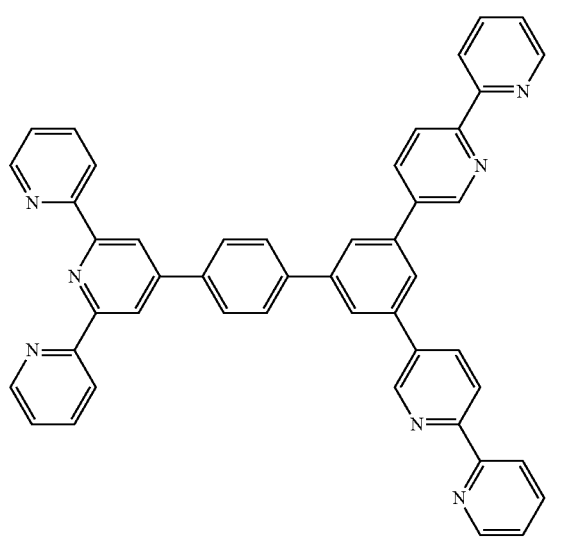
3-14
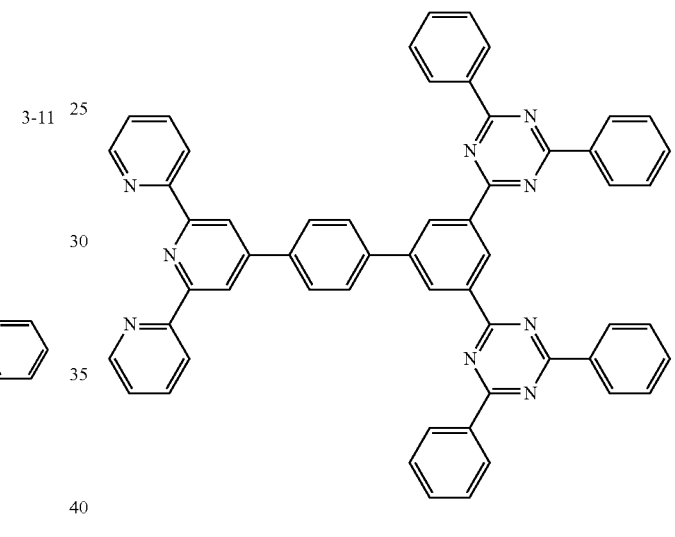
3-12
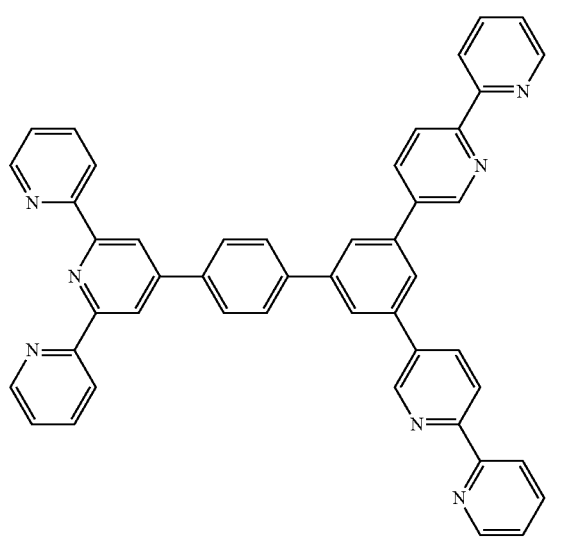
3-15
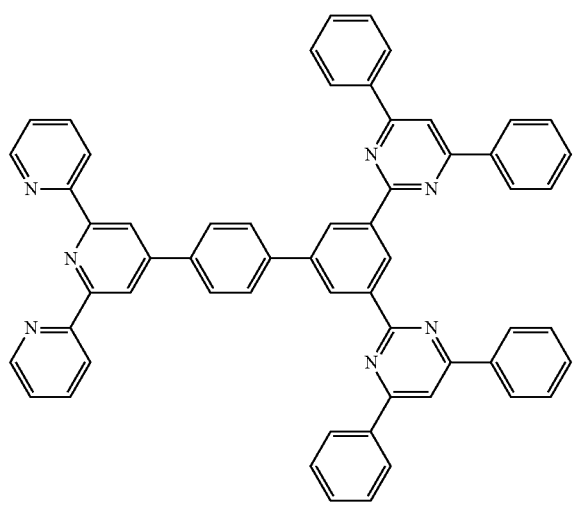

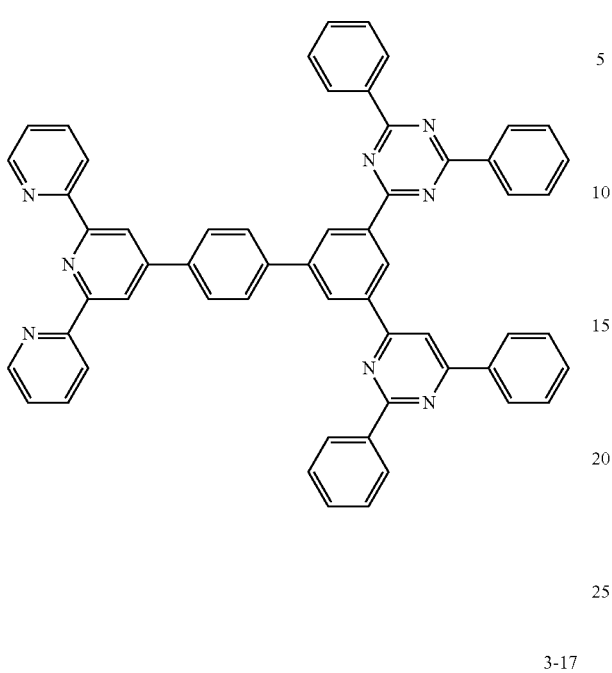
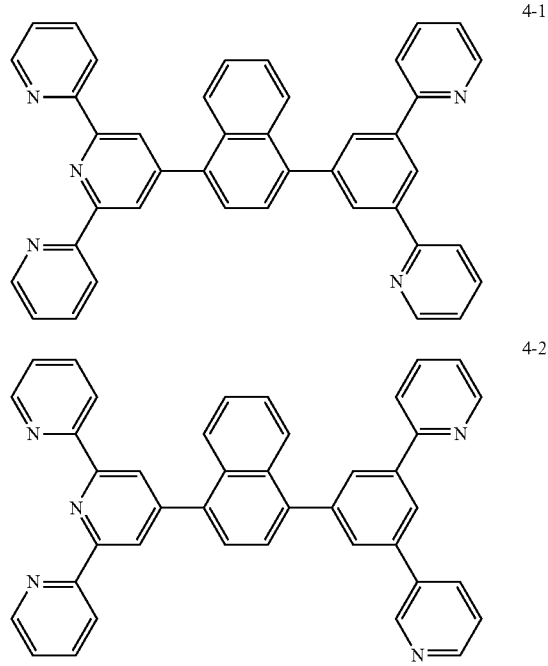

4-5
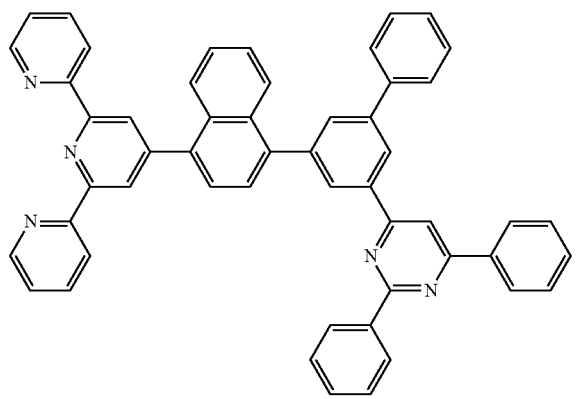
4-6
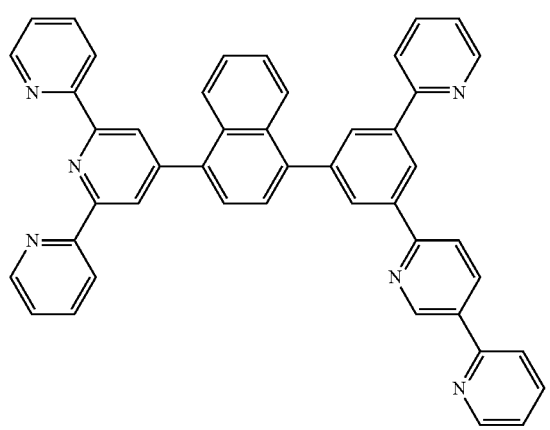
4-7
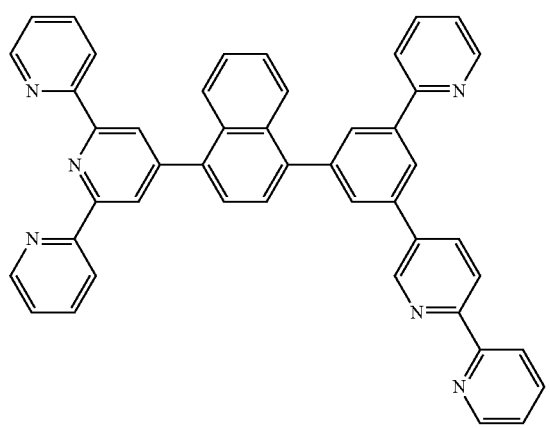
4-8
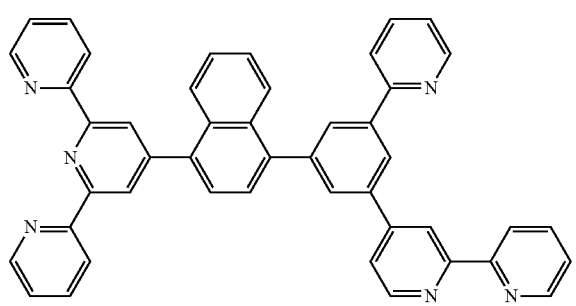
4-9
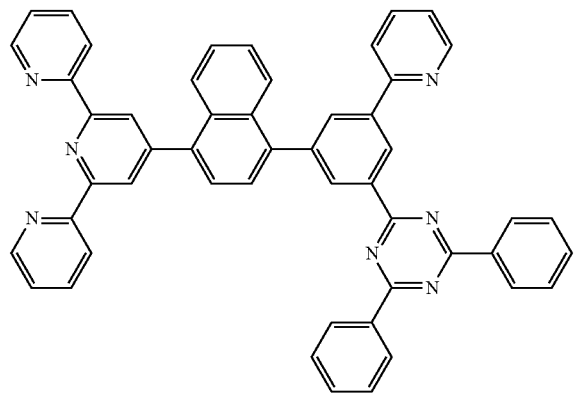
4-10
4-11
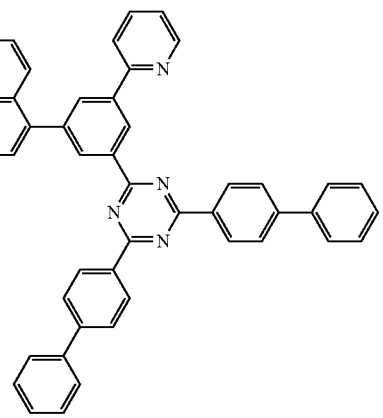

4-12

4-13

4-14

4-15

4-16

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Figure 1:
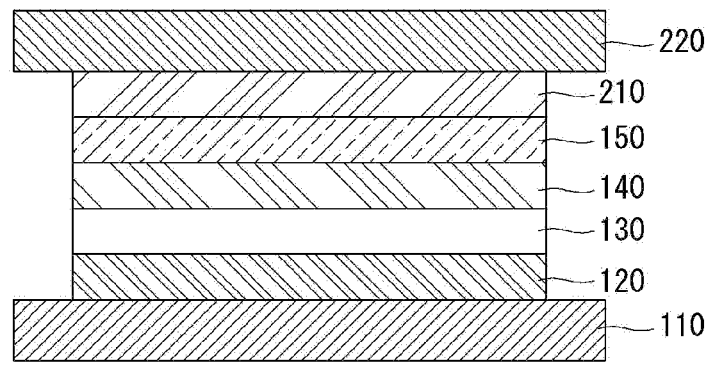
FIG. 1 is a view showing an organic light emitting display device according to a first exemplary embodiment of the present disclosure.

The advantages and features of the present disclosure and methods for accomplishing the same may be understood more readily by reference to the following detailed descriptions of exemplary embodiments and the accompanying drawings. The present disclosure may, however, be embodied in many different forms and should not be construed as being limited to the exemplary embodiments set forth herein. Rather, these exemplary embodiments are provided so that this disclosure will be thorough and complete and will fully convey the concept of the present disclosure to those skilled in the art, and the present disclosure is defined by the appended claims The shapes, sizes, percentages, angles, numbers, etc shown in the figures to describe the exemplary embodiments of the present disclosure are merely examples and not limited to those shown in the figures. Like reference numerals denote like elements throughout the specification. In describing the present disclosure, detailed descriptions of related well-known technologies will be omitted to avoid unnecessary obscuring the present disclosure. When the terms 'comprise', 'have', 'consist of' and the like are used, other parts may be added as long as the term 'only' is not used. The singular forms may be interpreted as the plural forms unless explicitly stated.

The elements may be interpreted to include an error margin even if not explicitly stated.

When the position relation between two parts is described using the terms 'on', 'over', 'under', 'next to' and the like, one or more parts may be positioned between the two parts as long as the term 'immediately' or 'directly' is not used.

When the temporal relationship between two events is described using the terms 'after', 'following', 'next', 'before' and the like, the two events may not occur in succession as long as the term 'immediately' or 'directly' is not used.

It will be understood that, although the terms first, second, etc., may be used to describe various elements, these elements should not be limited by these terms. These terms are only used to distinguish one element from another element. Thus, a first element discussed below could be termed a second element without departing from the technical spirit of the present disclosure.

The features of various exemplary embodiments of the present disclosure may be combined with one another either partly or wholly, and may technically interact or work together in various ways. The exemplary embodiments may be carried out independently or in combination with one another.

Hereinafter, various exemplary embodiments of the present disclosure will be described in detail with reference to the accompanying drawings.

FIG. 1 is a view showing an organic light emitting display device according to a first exemplary embodiment of the present disclosure.

Referring to FIG. 1, an organic light emitting display device 100 according to the first exemplary embodiment of the present disclosure comprises an anode 110, a hole injection layer 120, a hole transport layer 130, a light emitting layer 140, an electron transport layer 150, an electron injection layer 210, and a cathode 220.

The anode 110 is a hole injection electrode, and may be formed of one among ITO (indium tin oxide), IZO (indium zinc oxide), or ZnO (zinc oxide) having a high work function. Also, if the anode 110 is a reflective electrode, the anode 110 may further comprise a reflective layer formed of one among aluminum (Al), silver (Ag), or nickel (Ni) under a layer formed of one among ITO, IZO, or ZnO.

The hole injection layer 120 may function to facilitate hole injection from the anode 110 to the light emitting layer 140, and may be formed of, but is not limited to, one or more among CuPc (copper phthalocyanine), PEDOT (poly(3,4)-ethylenedioxythiophene), PANI (polyaniline), and NPD (N,N'-bis(naphthalene-1-yl)-N,N'-bis(phenyl)-2,2'-dimethylbenzidine). The hole injection layer 120 may be 1 to 150 nm thickness. If the hole injection layer 120 is 1 nm thickness or greater, the hole injection properties may be improved, or if the hole injection layer 120 is 150 nm thickness or less, an increase in the thickness of the hole injection layer 120 may be prevented and a rise in operating voltage may be therefore prevented. The hole injection layer 120 may not be included in the elements of the organic light emitting display device, depending on the structure or characteristics of the organic light emitting display device.

The hole transport layer 130 may function to facilitate hole transport, and may be formed of, but is not limited to, one or more among NPD(N,N'-bis(naphthalene-1-yl)-N,N'-bis(phenyl)-2,2'-dimethylbenzidine), TPD(N,N'-bis-(3-methylphenyl)-N,N'-bis(phenyl)-benzidine), spiro-TAD(2,2'7,7'-tetrakis(N,N-diphenylamino)-9,9'-spirofluorene), and MTDATA(4,4',4"-Tris(N-3-methylphenyl-N-phenylamino)-triphenylamine). The hole transport layer 130 may be 1 to 150 nm thickness. If the hole transport layer 130 is 1 nm thickness or greater, the hole transport properties may be improved, or if the hole transport layer 130 is 150 nm thickness or less, an increase in the thickness of the hole transport layer 130 may be prevented, and a rise in operating voltage may be therefore prevented.

The light emitting layer 140 may emit light of red (R), green (G), or blue (B), and may be formed of a fluorescent material.

If the light emitting layer 140 is a red light emitting layer, it may be formed of, but is not limited to, a fluorescent material comprising PBD:Eu(DBM)3(Phen) or perylene. If the light emitting layer 140 is a green light emitting layer, it may be formed of, but is not limited to, a fluorescent material comprising Alq3(tris(8-hydroxyquinolinato)aluminum). If the light emitting layer 140 is a blue light emitting layer, it may be formed of, but is not limited to, a fluorescent material comprising one among spiro-BDAVBi(2,7-bis)4-diphenylamino)styryl)-9,9-spirofluorene), spiro-CBP(2,2',7,7'-tetrakis(carbazol-9-yl)-9,9-spirofluorene), distyrylbenzene (DSB), distyrylarylene (DSA), a PFO polymer, and a PPV polymer.

In the organic light emitting display device, the electron transport layer 150 is on the light emitting layer 140. The electron transport layer 150 is formed of a material that has electron transport properties, with high electron mobility, to facilitate electron transport. Recently, materials with hole blocking properties are often mixed in, in order to intensify the hole blocking properties of the electron transport layer. Since materials with electron transport properties and materials with hole blocking properties have characteristics suited to their roles, a deposition chamber setup is required for each material before these materials are deposited. Due to this, the process will take a long time, resulting in low productivity. Moreover, the materials with electron transport properties and the materials with hole blocking properties are organic compounds involving high material costs, thus leading to increased manufacturing costs. Accordingly, the present inventors conducted several tests or experiments to reduce the manufacturing costs and improve the efficiency and lifetime of the device by forming an electron transport layer formed of a single material.

Through a number of tests or experiments which were performed on materials that do not affect the lifetime or efficiency of the organic light emitting display device and that cause no rise in operating voltage, the present inventors developed compounds that provide hole blocking properties and electron transport properties with the use of a single material. A compound of this disclosure comprises a terpyridine derivative as a functional group including three nitrogen (N) atoms, in order to increase the mobility of electrons in the electron transport layer, thereby improving the electron transport properties. Also, a non-bulky bridge is connected to the terpyridine derivative, and an aryl substituent is introduced at the meta position, so as to improve the hole blocking properties and enhance the effect of triplet-triplet annihilation (TTA).

Compounds with electron transport properties have a large energy bandgap because of their high triplet energy, so they have poor electron injection properties. Even if they have good electron injection properties, their electron transport properties are poor because of their low electron mobility. Here, if these compounds have electron injection properties, it means that they just have the ability to allow electrons to jump between adjacent organic layers, and if these compounds have electron transport properties, it means that they just have the ability to allow electrons to move in the organic layers. If these compounds have poor electron injection properties, it means that there is a huge energy barrier that keeps electrons from jumping from the electron injection layer because an adjacent organic layer, i.e., the electron transport layer, has a large energy bandgap. If these compounds have poor electron transport properties, it means that electrons move slowly in the electron transport layer because of the low electron mobility of the electron transport layer. Accordingly, a compound of this disclosure improves the electron transport properties of the electron transport layer by comprising a terpyridine derivative with high electron mobility.

A compound of this disclosure comprises a substituent that is substituted at the meta position of a bridge. The compound of this disclosure has a conjugated system extending from the terpyridine derivative to the bridge. If a substituent is substituted at the meta position of the bridge, the conjugation is broken. On the other hand, if a substituent is substituted at the para position of the bridge, the conjugation is maintained. If the conjugation length of the compound is short, it means that the energy bandgap is wide, and the wide energy bandgap involves high triplet energy. The high triplet energy of the compound increases the probability of triplet-triplet annihilation. Triplet-triplet annihilation refers to promoting an exciton from an excited triplet state to an excited singlet state. For high triplet energy, the gap between triplet energy and singlet energy is narrow, making it easy to promote an exciton from an excited triplet state to an excited singlet state. Accordingly, the compound of this disclosure has a substituent that is substituted at the meta position of the bridge, which causes the conjugation to be broken and maximizes the effect of triplet-triplet annihilation, thereby improving light emission efficiency.

A substituent of this disclosure comprises an unbulky aryl group having a molecular weight of 400 or less. As described previously, the substituent serves to break the conjugation of the compound and maintains the compound's aromaticity. Accordingly, an unbulky aryl group is used as a substituent to keep the characteristics of the substituent from affecting the characteristics of the compound.

A compound of this disclosure comprises an unbulky bridge connected to a terpyridine derivative. In general, the characteristics of the compound are mainly affected by the characteristics of a bulky structure. In the present disclosure, an unbulky bridge is connected to a terpyridine derivative in order to maintain the high electron mobility characteristics of the terpyridine derivative. The bridge comprises an unbulky biphenyl or naphthylphenyl to increase the stability of the compound and therefore improve the lifetime. Especially, the phenyl in the bridge makes it easier for a substituent to be substituted at the meta position of the bridge, as compared to naphthyl. Hence, the substituent of this disclosure is preferably substituted by biphenyl or naphthylphenyl as the phenyl in the bridge.

Accordingly, the electron transport layer 150 of this disclosure comprises a compound represented by the following Chemical Formula 1:

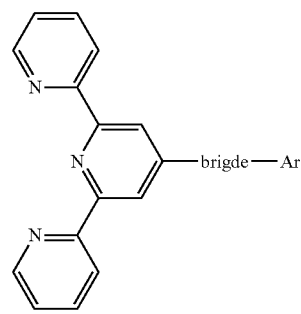

[Chemical Formula 1]

wherein the bridge includes biphenyl or naphthylphenyl, and Ar includes a substituted or unsubstituted heteroaromatic group having 1 to 3 nitrogen atoms that is substituted at the meta position of the bridge and has a molecular weight of 400 or less.

The compound represented by Chemical Formula 1 may be one among the following compounds represented by Chemical Formulae 2 to 5:

[Chemical Formula 2]

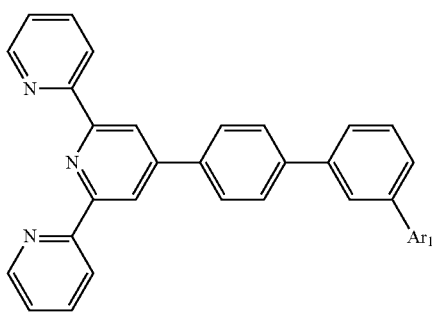

[Chemical Formula 3]

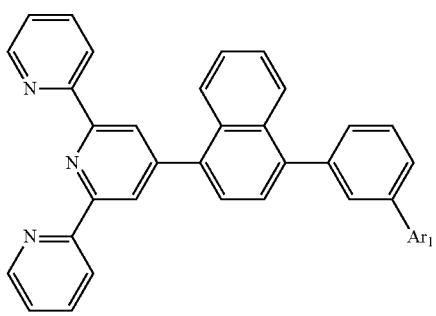

[Chemical Formula 4]

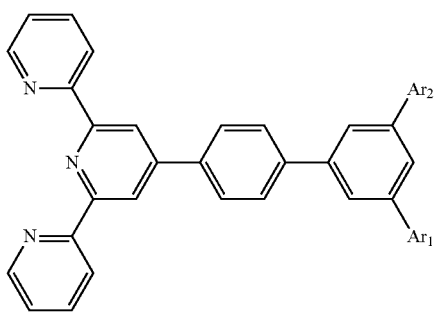

[Chemical Formula 5]

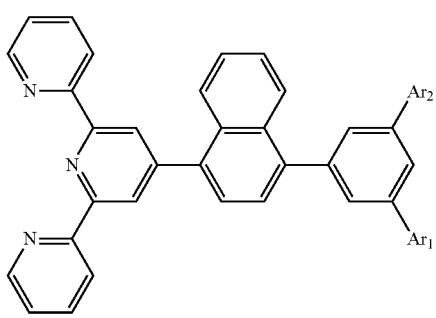

wherein, in Chemical Formulae 2 to 5, Ar$_1$ includes a substituted or unsubstituted heteroaromatic group having 1 to 3 nitrogen atoms that has a molecular weight of 400 or less, and in Chemical Formulae 4 and 5, Ar$_2$ includes a substituted or unsubstituted heteroaromatic group having 1 to 3 nitrogen atoms that has a molecular weight of 400 or less.

The compound represented by Chemical Formula 1 may be one among the following compounds:

1-1

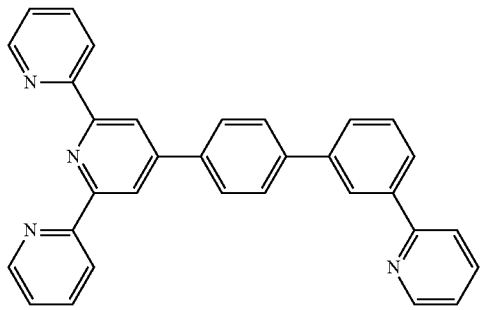

1-2

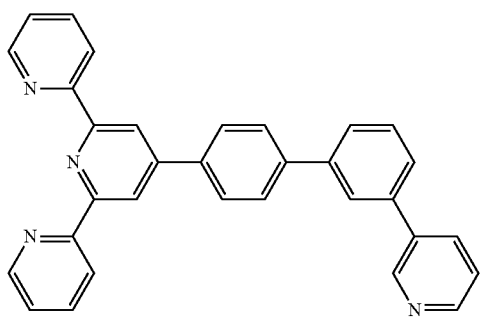

1-3

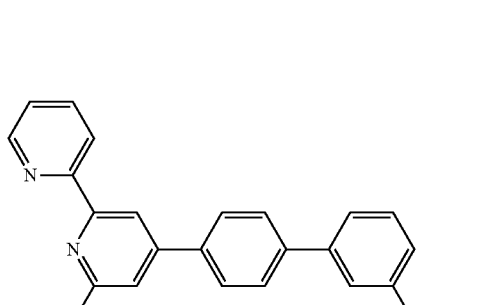

1-4

1-5
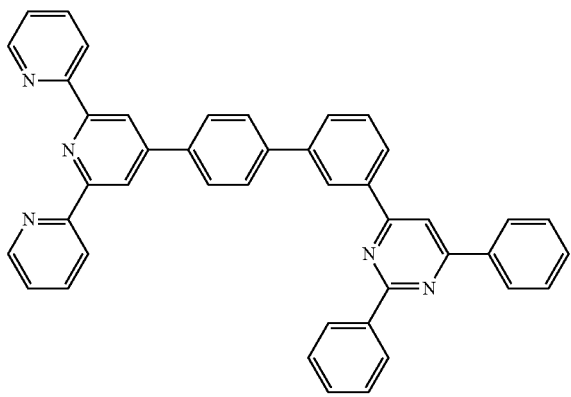
1-6
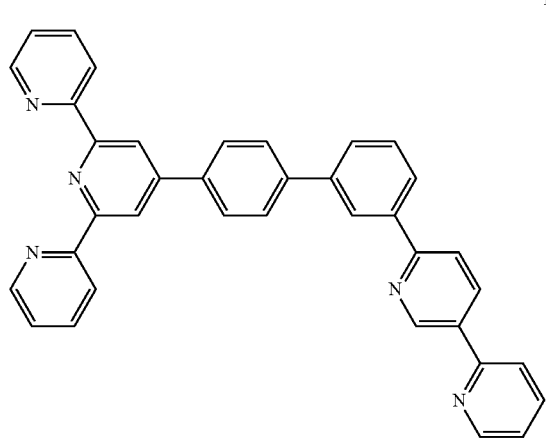
1-7
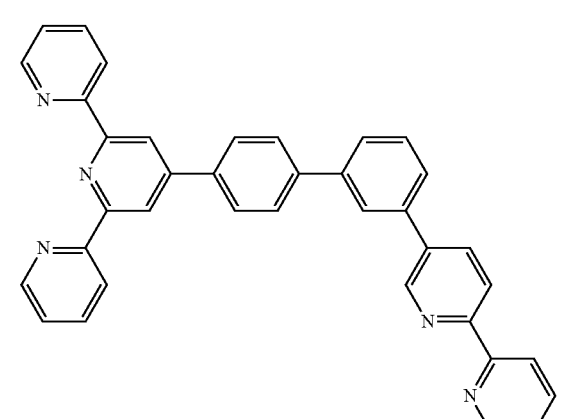
1-8
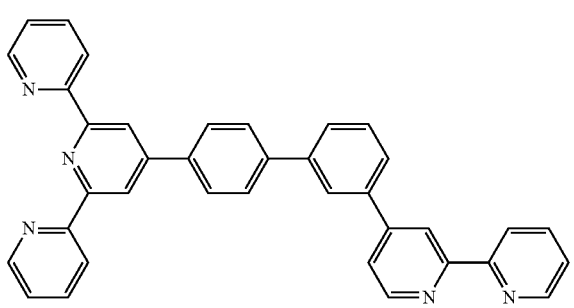
1-9
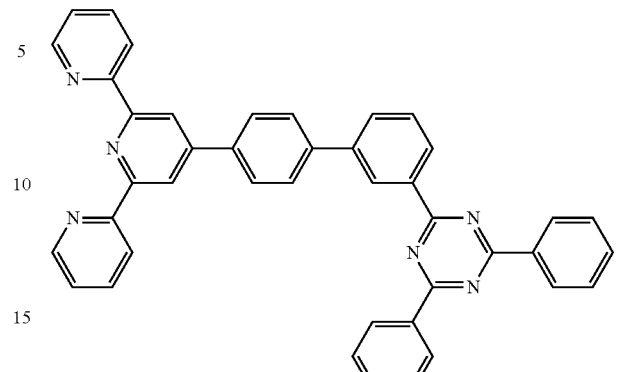
1-10
1-11
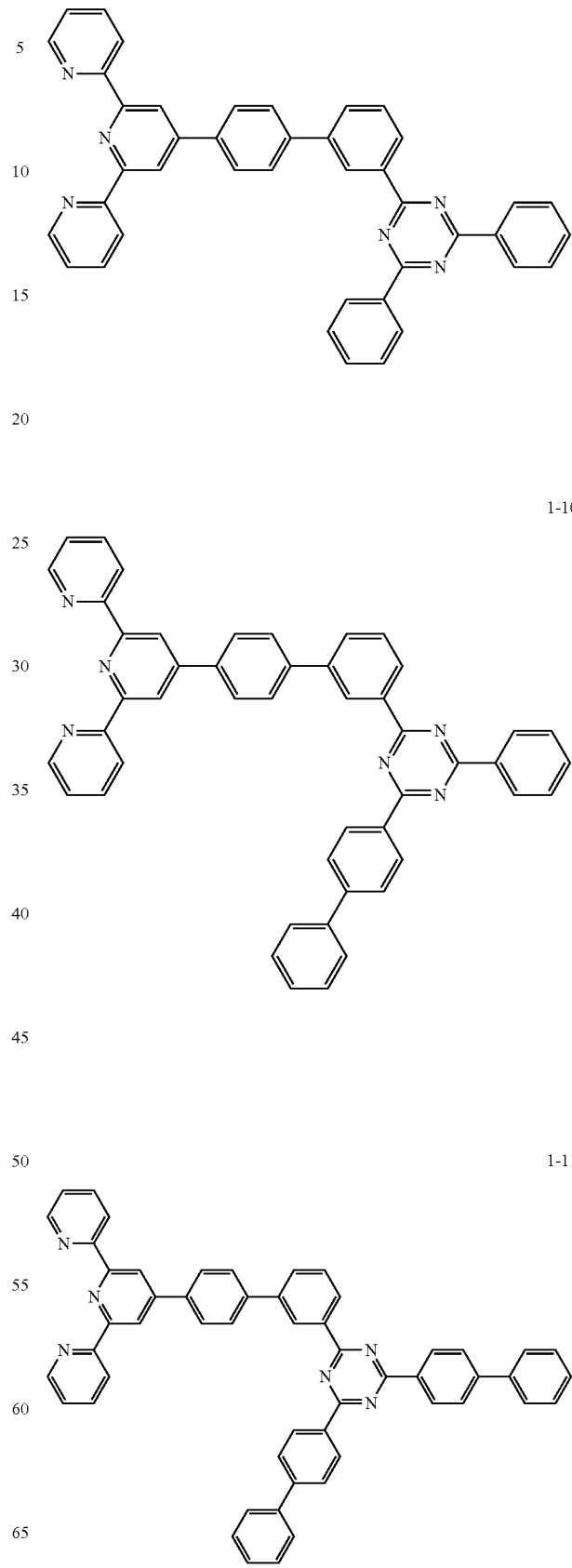

2-1
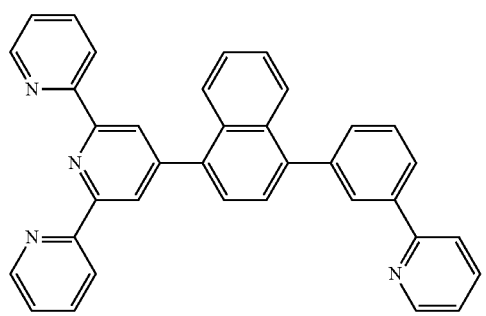
2-2
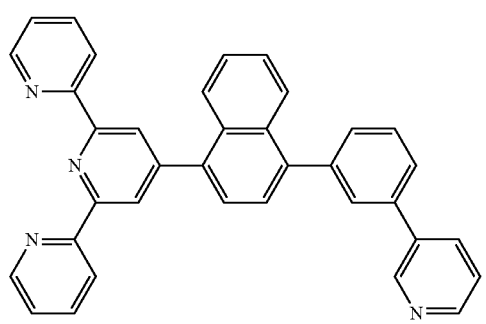
2-3
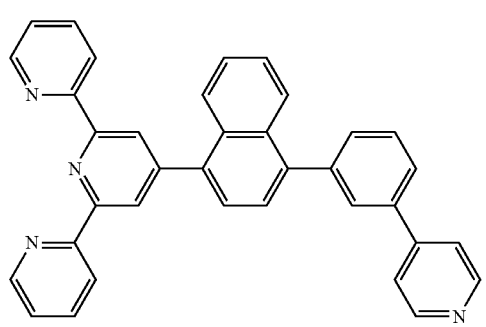
2-4
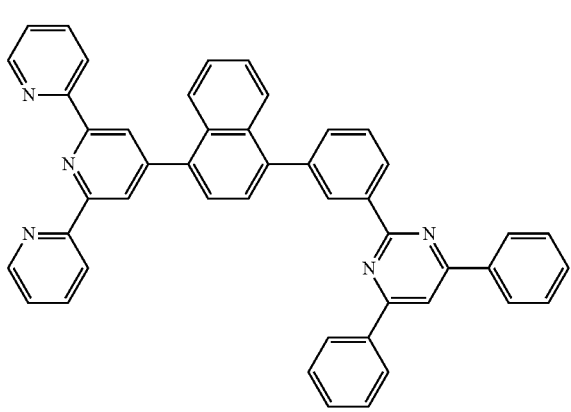
2-5
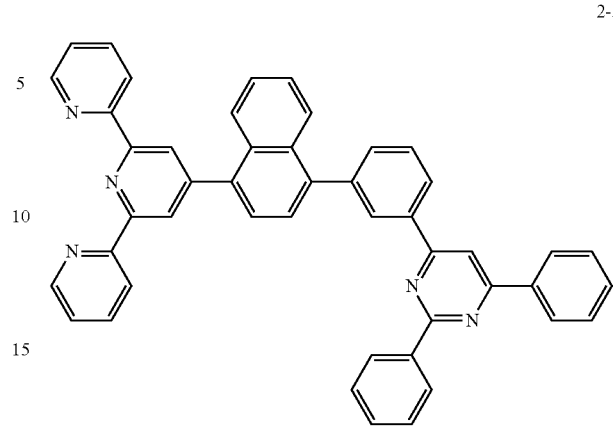
2-6
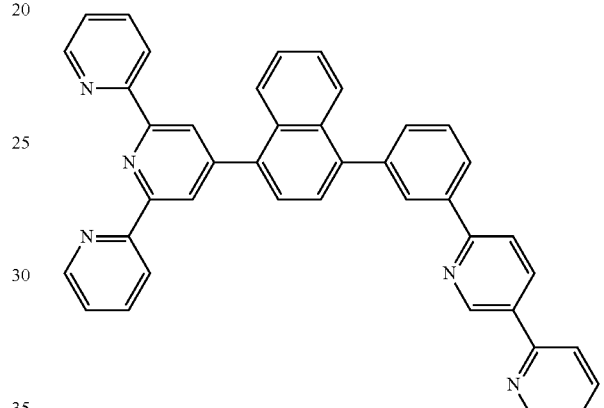
2-7
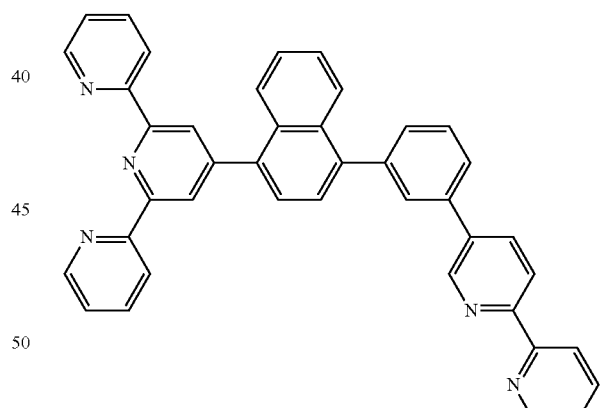
2-8
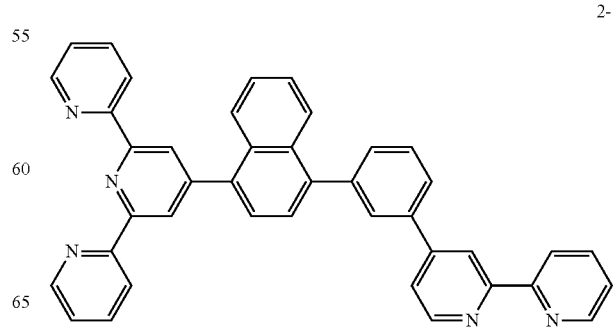

2-9
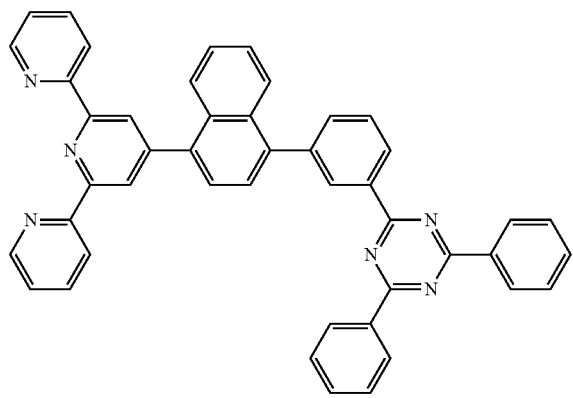
3-1
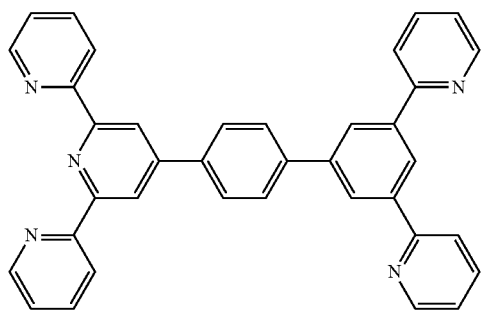
2-10
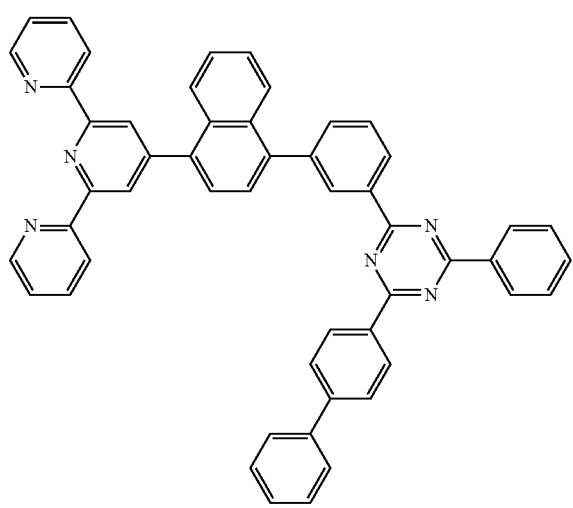
3-2
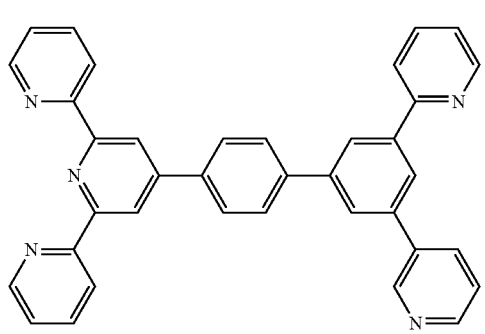
3-3
2-11
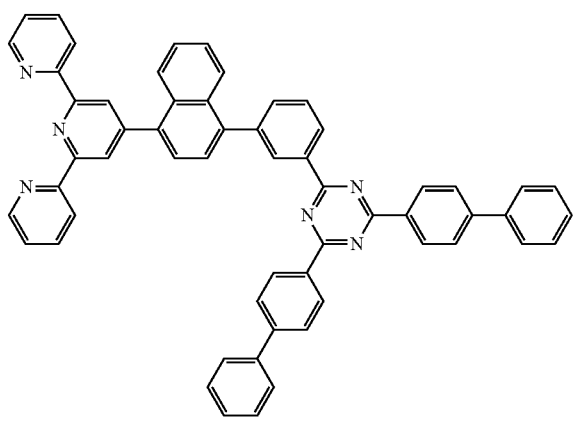
3-4
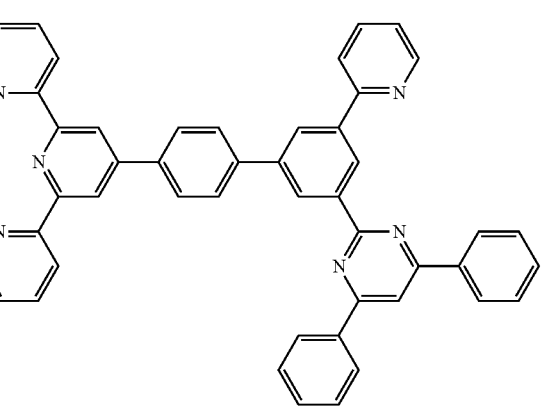

3-5
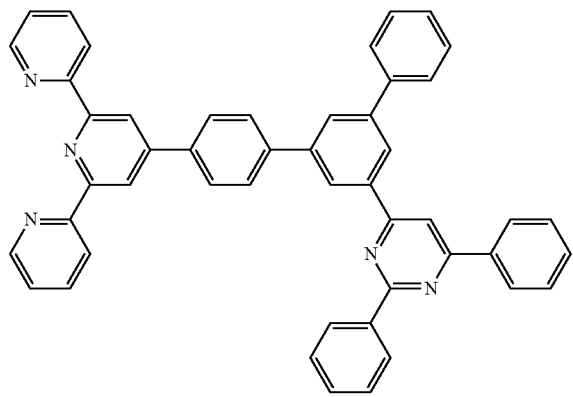
3-6
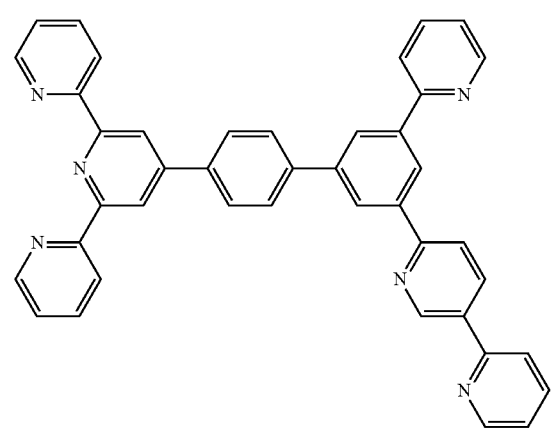
3-7
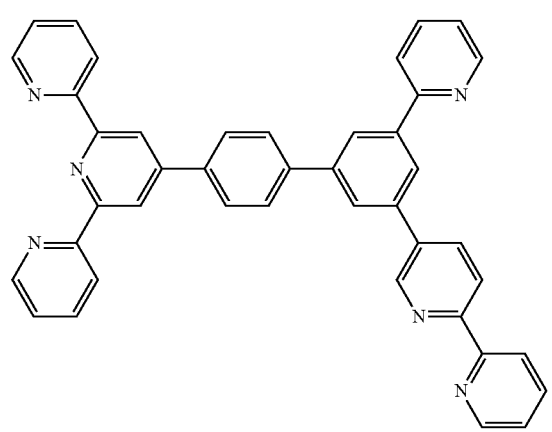
3-8
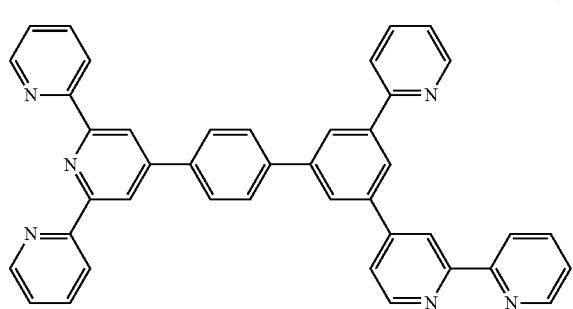
3-9
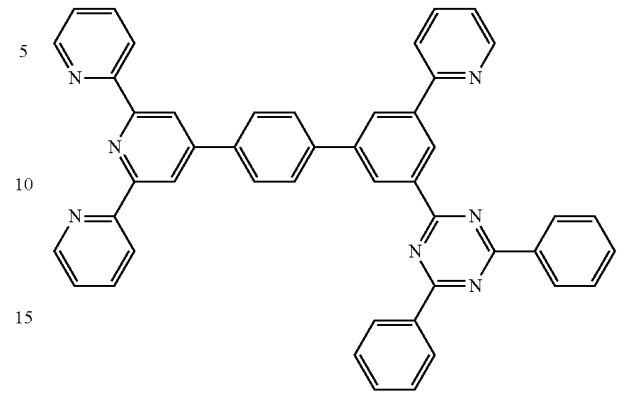
3-10
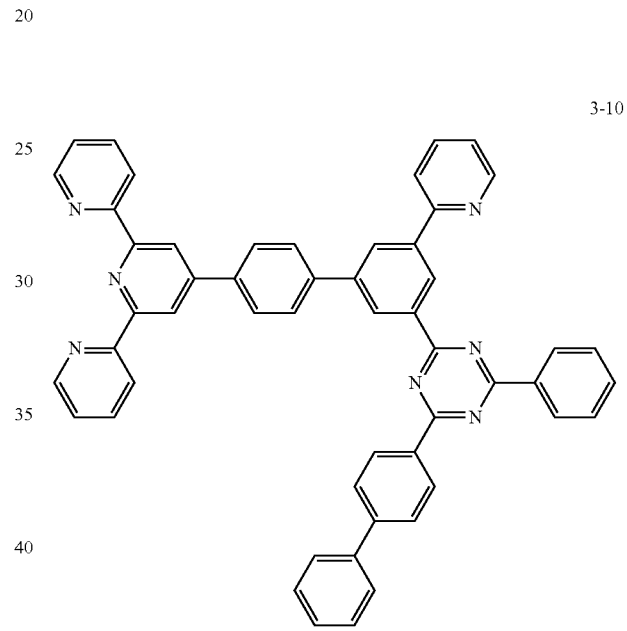
3-11
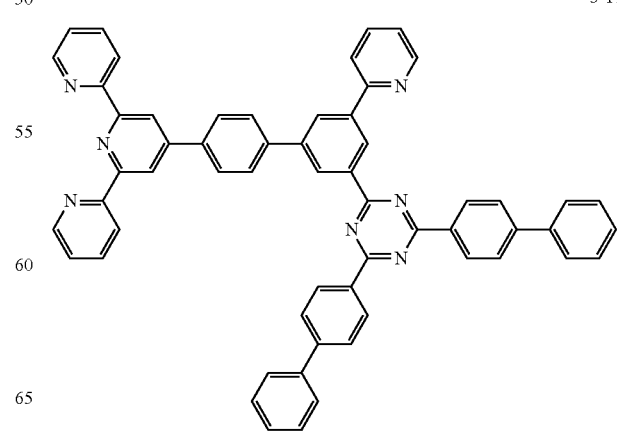

3-12
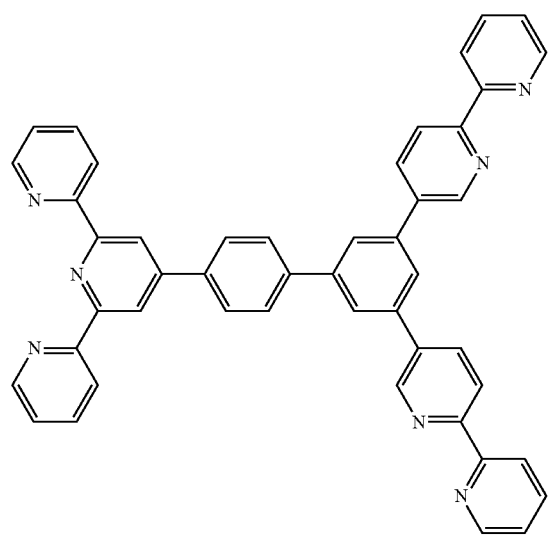
3-15
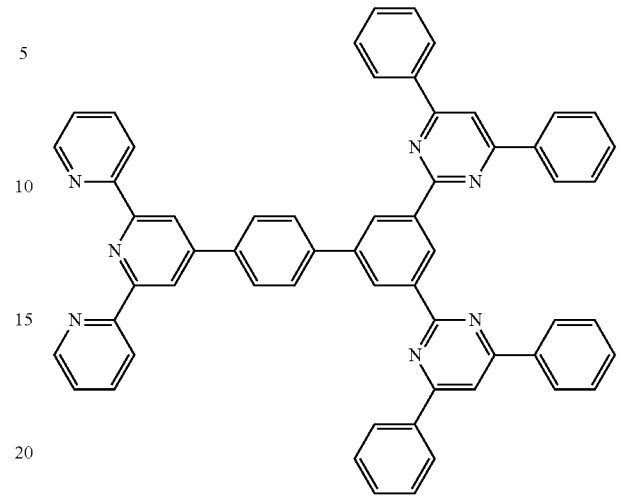
3-13
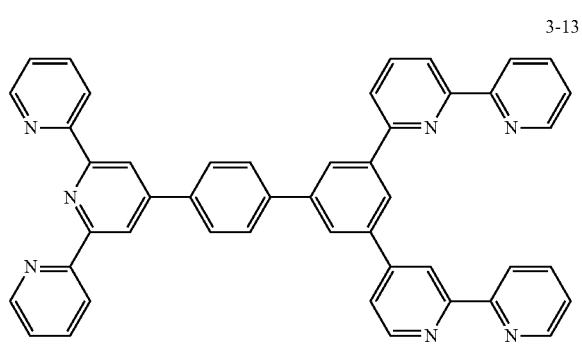
3-16
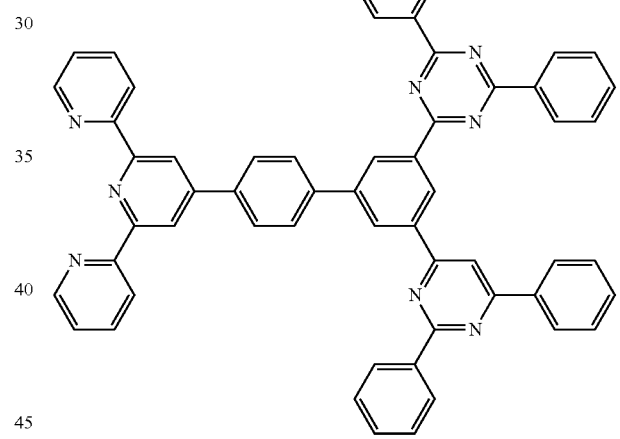
3-14
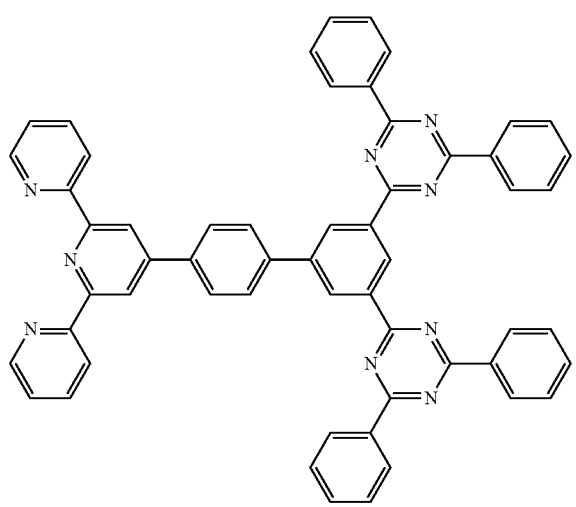
3-17
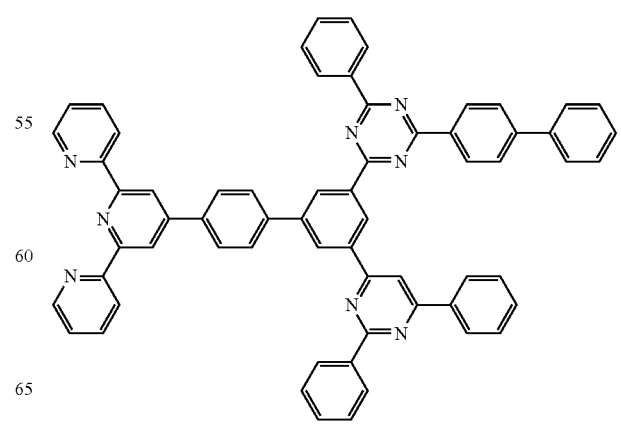

3-18
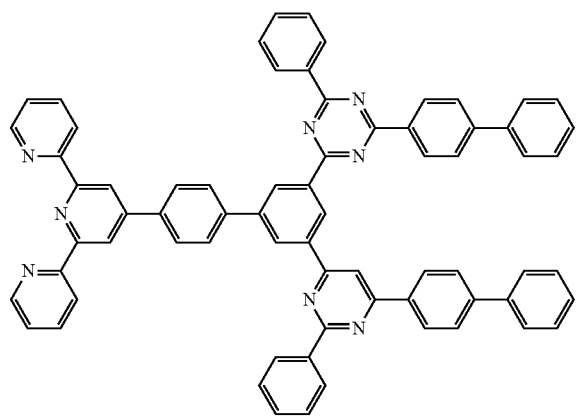
4-4
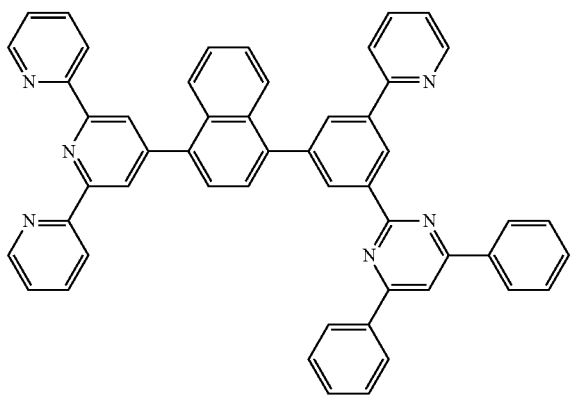
4-1
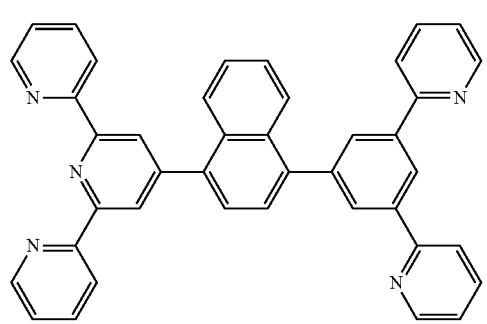
4-5
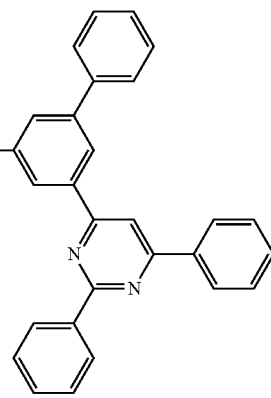
4-2
4-3
4-6
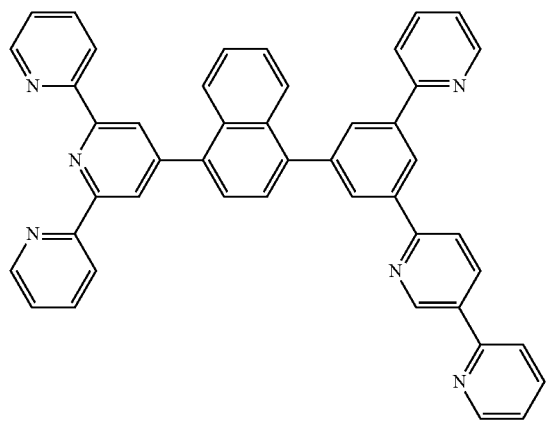

4-7
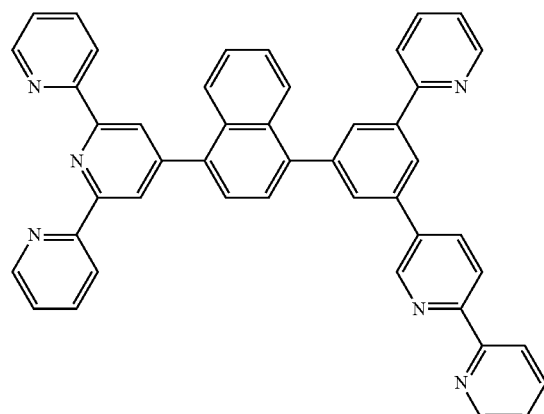
4-8
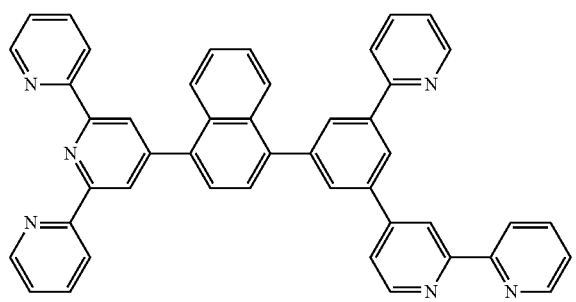
4-9
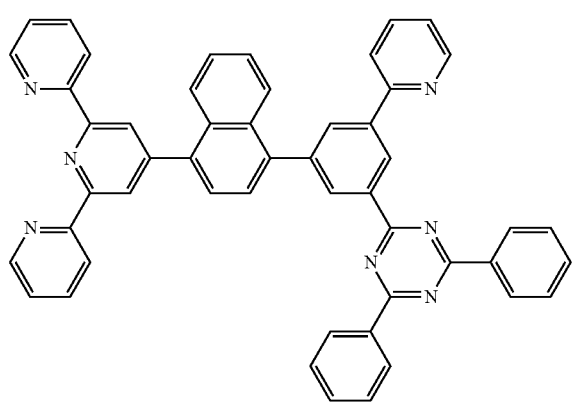
4-10
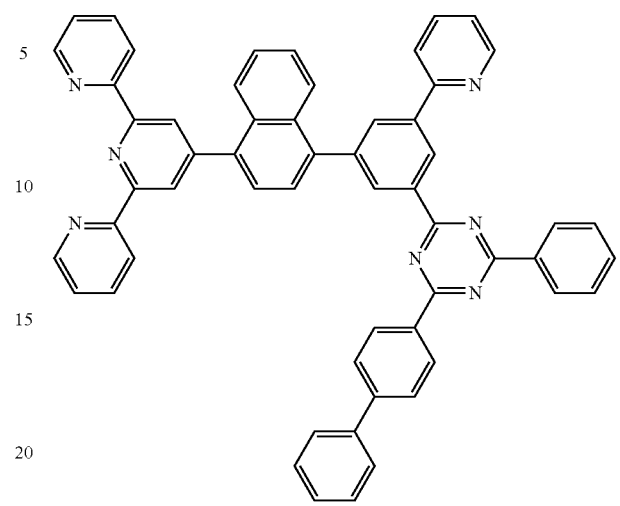
4-11
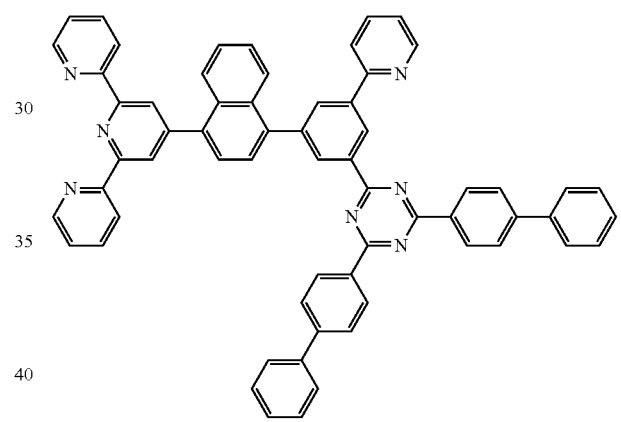
4-12
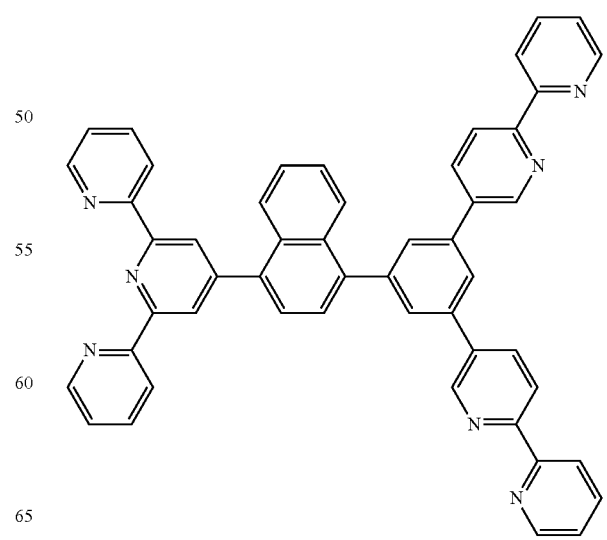

4-13

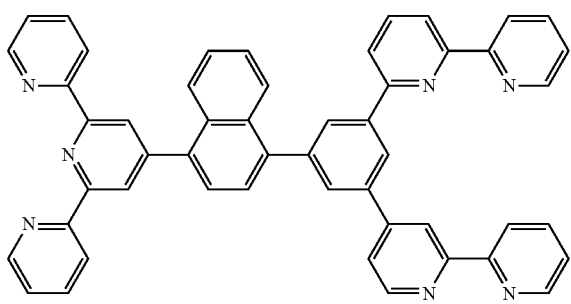

4-14

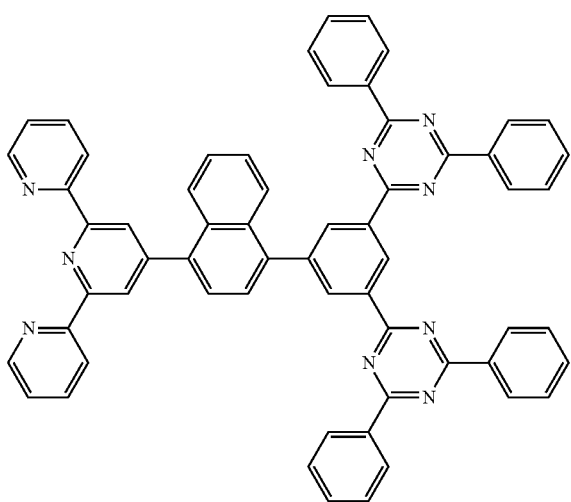

4-15

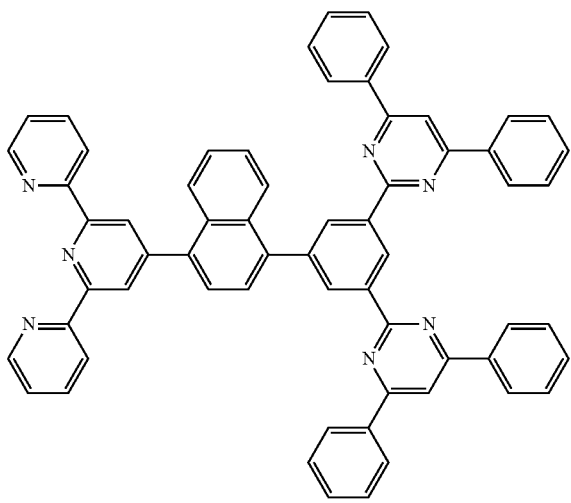

4-16

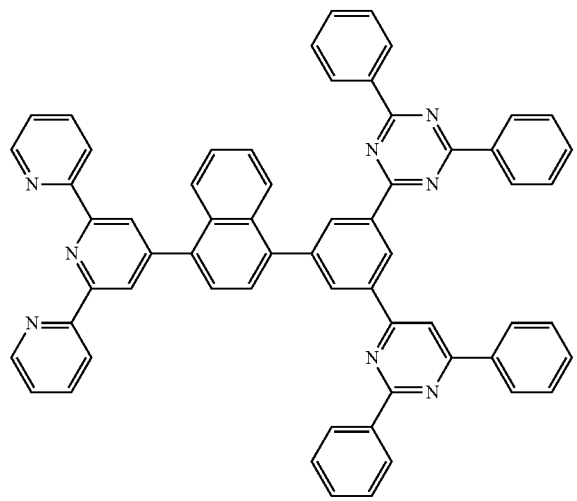

A compound of this disclosure may facilitate the transport of electrons by the electron transport layer by comprising a terpyridine derivative that has high electron mobility by including three electron-rich nitrogen atoms. Also, the compound of this disclosure may maximize the effect of triplet-triplet annihilation and therefore improve fluorescence efficiency by comprising a substituent substituted at the meta position of a bridge. Also, the compound of this disclosure may make it easy for the substituent to be substituted at the meta position while maintaining the characteristics of the terpyridine derivative by comprising an unbulky bridge between the terpyridine derivative and the substituent.

Accordingly, the electron transport properties may be improved by forming an electron transport layer formed of a compound of this disclosure, thereby reducing the operating voltage of the device and improving the efficiency. Also, the compound of this disclosure may improve the light emission efficiency of the device by maximizing the effect of triplet-triplet annihilation. Also, the manufacturing costs of the organic light emitting display device may be reduced by forming an electron transport layer formed of a single material, i.e., the compound of this disclosure.

The electron transport layer 150 may be 1 to 50 nm thickness. If the electron transport layer 150 is 1 nm thickness or greater, a degradation of the electron transport properties may be prevented, or if the electron transport layer 200 is 150 nm thickness or less, an increase in the thickness of the electron transport layer 150 may be prevented, and a rise in operating voltage may be therefore prevented.

The electron injection layer 210 functions to facilitate electron injection, and may be formed of, but is not limited to, one among Alq3 (tris(8-hydroxyquinolinato)aluminum), PBD(2-4-biphenyl)-5-(4-tert-butylphenyl)-1,3,4-oxadiazole), TAZ(3-(4-biphenyl)-4-phenyl-5-tert-butylphenyl-1,2,4-triazole), and BAlq(Bis(2-methyl-8-quinolinolato)-4-(phenylphenolato)aluminum). On the other hand, the electron injection layer 210 may be formed of a metal compound, and the metal compound may be, for example, but is not limited to, one or more among LiQ, LiF, NaF, KF, RbF, CsF, FrF, BeF2, MgF2, CaF2, SrF2, BaF2, and RaF2. The electron injection layer 210 may be 1 to 50 nm thickness. If the electron injection layer 210 is 1 nm thickness or greater, a degradation of the electron injection properties may be prevented, or if the electron injection layer 210 is 50 nm thickness or less, an increase in the thickness of the electron injection layer 210 may be prevented, and a rise in operating voltage may be therefore prevented.

The cathode 220 is an electron injection electrode, and may be formed of magnesium (Mg), calcium (Ca), aluminum (Al), silver (Ag), or an alloy thereof, having a low work function. If the organic light emitting display device is a top-emission type or a dual-emission type, the cathode 220 may be formed thin enough to pass light therethrough. If the organic light emitting display device is a bottom-emission type, the cathode 220 may be formed thick enough to reflect light.

An electron transport layer comprising the above-described compound of this disclosure is included in a fluorescent organic light emitting display device. An electron transport layer provided for phosphorescence is required to have low triplet energy and high electron mobility. On the other hand, the compound of this disclosure has relatively low electron mobility because of its high triplet energy and wide energy bandgap. Accordingly, if an electron transport layer comprising the compound of this disclosure is formed for phosphorescence, this decreases the phosphorescence efficiency and increases the operating voltage. Moreover, the compound of this disclosure is more suitable for fluorescence, which is exciton emission in singlet, than for phosphorescence, which is exciton emission in triplet, because it maximizes the effect of triplet-triplet annihilation.

As stated above, a compound of this disclosure may facilitate the transport of electrons by the electron transport layer by comprising a terpyridine derivative that has high electron mobility by including three electron-rich nitrogen atoms. Also, the compound of this disclosure may maximize the effect of triplet-triplet annihilation and therefore improve fluorescence efficiency by comprising a substituent substituted at the meta position of a bridge. Also, the compound of this disclosure may make it easy for the substituent to be substituted at the meta position while maintaining the characteristics of the terpyridine derivative by comprising an unbulky bridge between the terpyridine derivative and the substituent.

Accordingly, the electron transport properties may be improved by forming an electron transport layer formed of a compound of this disclosure, thereby reducing the operating voltage of the device and improving the efficiency. Also, the compound of this disclosure may improve the light emission efficiency of the device by maximizing the effect of triplet-triplet annihilation. Also, the manufacturing costs of the organic light emitting display device may be reduced by forming an electron transport layer formed of a single material which is the compound of this disclosure.

Figure 2:
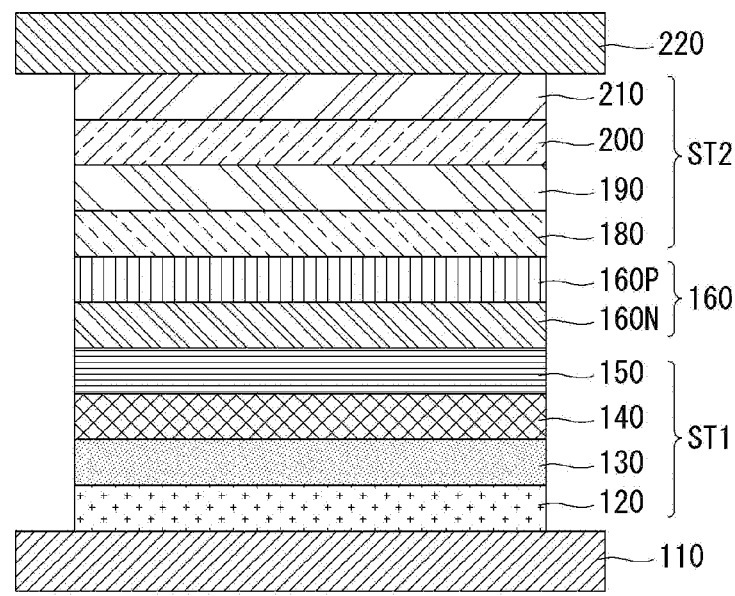
FIG. 2 is a view showing an organic light emitting display device according to a second exemplary embodiment of the present disclosure.

FIG. 2 is a view showing an organic light emitting display device according to a second exemplary embodiment of the present disclosure. The same elements as the first exemplary embodiment are denoted by the same reference numerals, so descriptions of these elements will be omitted below.

Referring to FIG. 2, an organic light emitting display device 100 of the present disclosure comprises light emitting parts ST1 and ST2 between an anode 110 and a cathode 220, and a charge generation layer 160 between the light emitting parts ST1 and ST2.

The first light emitting part ST1 comprises a first light emitting layer 140. The first light emitting layer 140 may emit light of red (R), green (G), blue (B), or yellow-green (YG), and may be formed of a phosphorescent material. In this exemplary embodiment, the first light emitting layer 140 may be a light emitting layer that emits yellow-green light.

The first light emitting layer 140 may have a single layer structure of a yellow-green light emitting layer or green light emitting layer, or a multilayer structure formed of a yellow-green light emitting layer and a green light emitting layer. The first light emitting layer 140 comprises a yellow-green light emitting layer, a green light emitting layer, or a multilayer structure formed of a yellow-green light emitting layer and a green light emitting layer, of a yellow light emitting layer and a red light emitting layer, of a green light emitting layer and a red light emitting layer, or of a yellow-green light emitting layer and a red light emitting layer.

This exemplary embodiment will be described by taking as an example a single layer structure of a first light emitting layer 140 that emits yellow-green light. The first light emitting layer 140 may include, but is not limited to, at least one host of CBP 4,4'-bis(carbazol-9-yl)biphenyl) or BAlq (Bis(2-methyl-8-quinolinolato)-4-(phenylphenolato)aluminum) and a phosphorescent yellow-green dopant that emits yellow-green light.

The first light emitting part ST1 comprises a hole injection layer 120 and a first hole transport layer 130 that are between the anode 110 and the first light emitting layer 140, and a first electron transport layer 150 on the first light emitting layer 140. Accordingly, the first light emitting part ST1 comprising the hole injection layer 120, the first hole transport layer 130, the first light emitting layer 140, and the first electron transport layer 150 is formed on the anode 110. The hole injection layer 120 may not be included in the elements of the first light emitting part ST1, depending on the structure or characteristics of the device.

The first electron transport layer 150 may be formed of, but is not limited to, Alq3 (tris(8-hydroxyquinolinato)aluminum), PBD(2-4-biphenyl)-5-(4-tert-butylphenyl)-1,3,4-oxadiazole), TAZ(3-(4-biphenyl)-4-phenyl-5-tert-butylphenyl-1,2,4-triazole), or BAlq(Bis(2-methyl-8-quinolinolato)-4-(phenylphenolato)aluminum). The first electron transport layer 150 may be 1 to 50 nm thickness. If the first electron transport layer 150 is 1 nm thickness or greater, a degradation of the electron transport properties may be prevented, or if the first electron transport layer 150 is 50 nm thickness or less, an increase in the thickness of the first electron transport layer 150 may be prevented, and a rise in operating voltage may be therefore prevented.

A charge generation layer (CGL) 160 is between the first light emitting part ST1 and the second light emitting part ST2. The first light emitting part ST1 and the second light emitting part ST2 are connected by the charge generation layer 160. The charge generation layer 160 may be a PN-junction charge generation layer formed by joining an N-type charge generation layer 160N and a P-type charge generation layer 160P. The PN junction charge generation layer 160 generates a charge, or injects the charge, i.e., electrons and holes, separately into the light emitting layer. That is, the N-type charge generation layer 160N transfers electrons to the first electron transport layer 150, the first electron transport layer 150 supplies the electrons to the first light emitting layer 140 adjacent to the anode, and the P-type charge generation layer 160P transfers holes to the second hole transport layer 180 to supply the holes to the second light emitting layer 190 of the second light emitting part ST2. As such, the light emission efficiency of the first and second light emitting layers 140 and 190 may be further increased, and the operating voltage may be reduced.

The N-type charge generation layer 160N may be formed of a metal- or N-type-doped organic material. The metal may be one material among Li, Na, K, Rb, Cs, Mg, Ca, Sr, Ba, La, Ce, Sm, Eu, Tb, Dy, and Yb. An N-type dopant and host for the N-doped organic material may be generally-used materials. For example, the N-type dopant may be an alkali metal, an alkali metal compound, an alkali earth metal, or an alkali earth metal compound. Specifically, the N-type dopant may be one among Li, Cs, K, Rb, Mg, Na, Ca, Sr, Eu, and Yb. The percentage of the dopant to be mixed is between 1% and 8% relative to 100% for the host. The dopant may have a work function of 2.5 eV or greater. The host material may be an organic material of 20 to 60 carbon atoms that has a hetero ring with nitrogen atom, for example, one among Alq3(tris(8-hydroxyquinolinato)aluminum), triazine, a hydroxyquinoline derivative, a benzazole derivative, and a silole derivative.

The P-type charge generation layer 160P may be formed of a metal or a P-doped organic material. The metal may be one or more alloys among Al, Cu, Fe, Pb, Zn, Au, Pt, W, In, Mo, Ni, and Ti. A P-type dopant and host for the P-doped organic material may be the following materials. For example, the P-type dopant may be one material among F4-TCNQ(2,3,5,6-tetrafluoro-7,7,8,8,-tetracyanoquinodimethane), a derivative of tetracyanoquinodimethane, iodine, FeCl3, FeF3, and SbCl5. The host may be one material among NPB (N,N'-bis(naphthalene-1-yl)-N,N'-bis(phenyl)-benzidine), TPD (N,N'-bis-(3-methylphenyl)-N,N'-bis(phenyl)-benzidine), and TNB (N,N,N'N'-tetranaphthalenyl-benzidine).

The second light emitting part ST2 comprising the second hole transport layer 180, the second light emitting layer 190, a second electron transport layer 200, and an electron injection layer 210 is on the charge generation layer 160.

The second light emitting layer 190 may emit light of red (R), green (G), or blue (B), and may be formed of a fluorescent material. In this exemplary embodiment, the second light emitting layer 190 may be a blue light emitting layer. The blue light emitting layer comprises one among a blue light emitting layer, a dark blue light emitting layer, and a sky blue light emitting layer. Alternatively, the second light emitting layer 190 may be formed of a blue light emitting layer and a red light emitting layer, of a blue light emitting layer and a yellow-green light emitting layer, or of a blue light emitting layer and a green light emitting layer.

The second light emitting part ST2 comprises the second hole transport layer 180 between the charge generation layer 160 and the second light emitting layer 190, and comprises the second electron transport layer 200 and electron injection layer 210 on the second light emitting layer 190. The second hole transport layer 180 may have the same composition as the first hole transport layer 130 of the first light emitting part ST1 or have a different composition from that of the first hole transport layer 130.

The second electron transport layer 200 has the same composition as the aforementioned electron transport layer of the first exemplary embodiment. The second electron transport layer 200 may facilitate the transport of electrons by the electron transport layer by comprising a terpyridine derivative that has high electron mobility by including three electron-rich nitrogen atoms. Also, the compound of this disclosure may maximize the effect of triplet-triplet annihilation and therefore improve fluorescence efficiency by comprising a substituent substituted at the meta position of a bridge. Also, the compound of this disclosure may make it easy for the substituent to be substituted at the meta position while maintaining the characteristics of the terpyridine derivative by comprising an unbulky bridge between the terpyridine derivative and the substituent. Accordingly, the electron transport properties may be improved by forming the second electron transport layer 200 formed of a compound of this disclosure, thereby reducing the operating voltage of the device and improving the efficiency. Also, the compound of this disclosure may improve the fluorescence efficiency of the device by maximizing the effect of triplet-triplet annihilation. Also, the manufacturing costs of the organic light emitting display device may be reduced by forming an electron transport layer formed of a single material which is the compound of this disclosure.

Accordingly, the second light emitting part ST2 comprising the second hole transport layer 180, the second light emitting layer 190, the second electron transport layer 200, and the electron injection layer 210 is formed on the charge generation layer 160. The cathode 220 is provided on the second light emitting part ST2 to constitute the organic light emitting display device according to the second exemplary embodiment of the present disclosure.

The above-described second exemplary embodiment of the present disclosure has disclosed that the second electron transport layer 200 comprises a compound of this disclosure. However, even if the first light emitting layer 140 is a fluorescent light emitting layer, it is difficult for the first electron transport layer 150 to comprise the compound of this disclosure. The N-type charge generation layer 160N is on the first electron transport layer 150, and the terpyridine derivative of this disclosure interacts with lithium (Li) included in the N-type charge generation layer 160N. Since the characteristics of the first electron transport layer 150 may change by the interaction between the terpyridine derivative of this disclosure and the lithium (Li), it is preferred that an electron transport layer comprising the compound of this disclosure is not used as long as it adjoins the N-type charge generation layer.

As stated above, a compound of this disclosure may facilitate the transport of electrons by the electron transport layer by comprising a terpyridine derivative that has high electron mobility by including three electron-rich nitrogen atoms. Also, the compound of this disclosure may maximize the effect of triplet-triplet annihilation and therefore improve fluorescence efficiency by comprising a substituent substituted at the meta position of a bridge. Also, the compound of this disclosure may make it easy for the substituent to be substituted at the meta position while maintaining the characteristics of the terpyridine derivative by comprising an unbulky bridge between the terpyridine derivative and the substituent.

Accordingly, the electron transport properties may be improved by forming an electron transport layer formed of a compound of this disclosure, thereby reducing the operating voltage of the device and improving the efficiency. Also, the compound of this disclosure may improve the light emission efficiency of the device by maximizing the effect of triplet-triplet annihilation. Also, the manufacturing costs of the organic light emitting display device may be reduced by forming an electron transport layer formed of a single material which is the compound of this disclosure.

Figure 3:
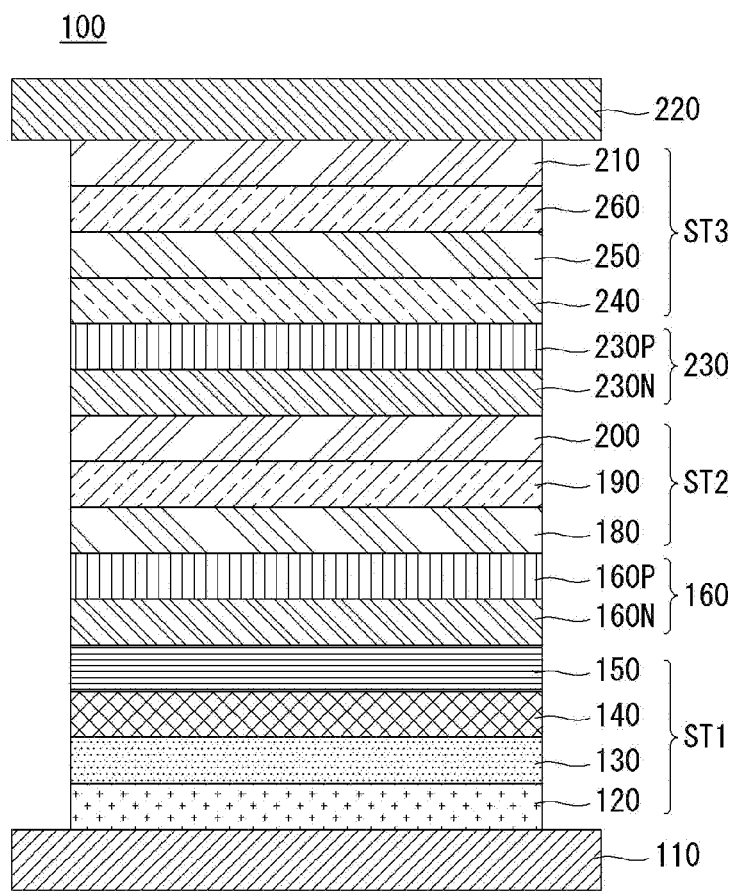
FIG. 3 is a view showing an organic light emitting display device according to a third exemplary embodiment of the present disclosure.

FIG. 3 is a view showing an organic light emitting display device according to a third exemplary embodiment of the present disclosure. The same elements as the first and second exemplary embodiments are denoted by the same reference numerals, so descriptions of these elements will be omitted below.

Referring to FIG. 3, an organic light emitting display device 100 of the present disclosure comprises a plurality of light emitting parts ST1, ST2, and ST3 between an anode 110 and a cathode 220, and a first charge generation layer 160 and a second charge generation layer 230 that are between the light emitting parts ST1, ST2, and ST3.

Although this exemplary embodiment has been illustrated and described with an example where three light emitting parts are between the anode 110 and the cathode 220, the present disclosure is not limited to this example and four or more light emitting parts may be between the anode 110 and the cathode 220.

Among the light emitting parts, the first light emitting part ST1 comprises a first light emitting layer 140. The first light emitting layer 140 may emit light of red, green, or blue: for example, it may be a blue light emitting layer in this exemplary embodiment. The blue light emitting layer comprises one among a blue light emitting layer, a dark blue light emitting layer, and a sky blue light emitting layer. Alternatively, the first light emitting layer 140 may be formed of a blue light emitting layer and a red light emitting layer, of a blue light emitting layer and a yellow-green light emitting layer, or of a blue light emitting layer and a green light emitting layer.

The first light emitting part ST1 comprises a hole injection layer 120 and a first hole transport layer 130 that are between the anode 110 and the first light emitting layer 140, and a first electron transport layer 150 on the first light emitting layer 140. Accordingly, the first light emitting part ST1 comprising the hole injection layer 120, first hole transport layer 130, first light emitting layer 140, and first electron transport layer 150 is formed on the anode 110. The hole injection layer 120 may not be included in the elements of the first light emitting part ST1, depending on the structure or characteristics of the device.

The second light emitting part ST2 comprising a second light emitting layer 190 is on the first light emitting part ST1. The second light emitting layer 190 may emit light of red, green, or blue: for example, it may be a yellow-green light emitting layer in this exemplary embodiment. The second light emitting layer 190 may comprise a yellow-green light emitting layer, a green light emitting layer, or a multilayer structure formed of a yellow-green light emitting layer and a green light emitting layer, of a yellow light emitting layer and a red light emitting layer, of a green light emitting layer and a red light emitting layer, or of a yellow-green light emitting layer and a red light emitting layer. The second light emitting part ST2 further comprises a second hole transport layer 180 on the first light emitting part ST1, and comprises a second electron transport layer 200 on the second light emitting layer 190. Accordingly, the second light emitting part ST2 comprising the second hole transport layer 180, second light emitting layer 190, and second electron transport layer 200 is formed on the first light emitting part ST1.

A first charge generation layer 160 is between the first light emitting part ST1 and the second light emitting part ST2. The first charge generation layer 160 is a PN-junction charge generation layer formed by joining an N-type charge generation layer 160N and a P-type charge generation layer 160P. The first charge generation layer 160 generates a charge, or injects the charge, i.e., electrons and holes, separately into the first and second light emitting layers 140 and 190.

The third light emitting part ST3 comprising a third light emitting layer 250 is on the second light emitting part ST2. The third light emitting layer 250 may emit light of red, green, or blue, and be formed of a fluorescent material. For example, it may be a blue light emitting layer in this exemplary embodiment. The blue light emitting layer comprises one among a blue light emitting layer, a dark blue light emitting layer, and a sky blue light emitting layer. Alternatively, the third light emitting layer 250 may be formed of a blue light emitting layer and a red light emitting layer, of a blue light emitting layer and a yellow-green light emitting layer, or of a blue light emitting layer and a green light emitting layer.

The third light emitting part ST3 further comprises a third hole transport layer 240 on the second light emitting part ST2, and a third electron transport layer 260 and an electron injection layer 210 that are on the third light emitting layer 250.

The third electron transport layer 260 has the same composition as the aforementioned electron transport layer of the first exemplary embodiment. The third electron transport layer 260 may facilitate the transport of electrons by the electron transport layer by comprising a terpyridine derivative that has high electron mobility by including three electron-rich nitrogen atoms. Also, the compound of this disclosure may maximize the effect of triplet-triplet annihilation and therefore improve fluorescence efficiency by comprising a substituent substituted at the meta position of a bridge. Also, the compound of this disclosure may make it easy for the substituent to be substituted at the meta position while maintaining the characteristics of the terpyridine derivative by comprising an unbulky bridge between the terpyridine derivative and the substituent. Accordingly, the electron transport properties may be improved by forming a third electron transport layer 260 formed of a compound of this disclosure, thereby reducing the operating voltage of the device and improving the efficiency. Also, the compound of this disclosure may improve the fluorescence efficiency of the device by maximizing the effect of triplet-triplet annihilation. Also, the manufacturing costs of the organic light emitting display device may be reduced by forming an electron transport layer formed of a single material which is the compound of this disclosure.

Accordingly, the third light emitting part ST3 comprising the third hole transport layer 240, the third light emitting layer 250, the third electron transport layer 260, and the electron injection layer 210 is formed on the second light emitting part ST2. The electron injection layer 210 may not be included in the elements of the third light emitting part ST3, depending on the structure or characteristics of the organic light emitting display device.

The second charge generation layer 230 is between the second light emitting part ST2 and the third light emitting part ST3. The second charge generation layer 230 is a PN junction charge generation layer formed by joining the N-type charge generation layer 230N and the P-type charge generation layer 230P. The second charge generation layer 230 generates a charge, or injects the charge, i.e., electrons and holes, separately into the second and third light emitting layers 190 and 250.

The cathode 220 is provided on the third light emitting part ST3 to constitute the organic light emitting display device according to the third exemplary embodiment of the present disclosure.

Organic light emitting displays using the organic light emitting display device according to the third exemplary embodiment of the present disclosure may include top emission displays, bottom emission displays, dual emission displays, and vehicle lighting. The vehicle lighting may include, but are not necessarily limited to, headlights, high beams, taillights, brake lights, and back-up lights. Moreover, organic light emitting displays using the organic light emitting display device according to the second exemplary embodiment of the present disclosure may be applied to mobile devices, monitors, TVs, etc. In addition, organic light emitting displays using the organic light emitting display device according to the third exemplary embodiment of the present disclosure may be applied to displays in which at least two of the first, second, and third light emitting layers emit light of the same color.

As stated above, a compound of this disclosure may facilitate the transport of electrons by the electron transport layer by comprising a terpyridine derivative that has high electron mobility by including three electron-rich nitrogen atoms. Also, the compound of this disclosure may maximize the effect of triplet-triplet annihilation and therefore improve fluorescence efficiency by comprising a substituent substituted at the meta position of a bridge. Also, the compound of this disclosure may make it easy for the substituent to be substituted at the meta position while maintaining the characteristics of the terpyridine derivative by comprising an unbulky bridge between the terpyridine derivative and the substituent.

Accordingly, the electron transport properties may be improved by forming an electron transport layer formed of a compound of this disclosure, thereby reducing the operating voltage of the device and improving the efficiency. Also, the compound of this disclosure may improve the fluorescence efficiency of the device by maximizing the effect of triplet-triplet annihilation. Also, the manufacturing costs of the organic light emitting display device may be reduced by forming an electron transport layer formed of a single material which is the compound of this disclosure.

Hereinafter, synthesis examples of compounds of the present disclosure will be described in detail. However, the following examples are only for illustration, and the present disclosure is not limited thereto.

Synthesis of Compound 1-4

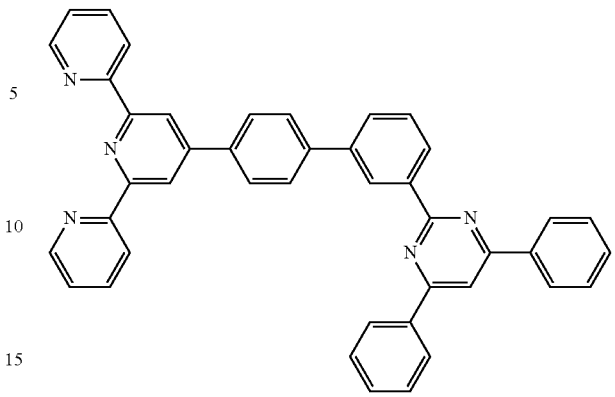

2-(4-(4-bromophenyl)-6-(pyridin-2-yl)pyridin-2-yl)pyridine (5.00 g, 12.8 mmol), 3-(4,6-diphenylpyrimidin-2-yl)phenylboronic acid (3.52 g 10 mmol), tetrakis triphenylphosphine palladium (0)(Pd(PPh3)4) (0.53 g, 0.46 mmol), a potassium carbonate solution (4M, 10 ml), 30 ml of toluene, and 10 ml of ethanol were put under a nitrogen atmosphere, and then refluxed and stirred for 12 hours. After the reaction, 50 ml of water (H₂O) was added, and the mixture was stirred for 3 hours, then vacuum-filtered, and then subjected to column chromatography using methylene chloride/hexane as the eluent, followed by MC recrystallization, to obtain Compound 1-4 (5.1 g, yield: 82.83%).

Synthesis of Compound 1-9

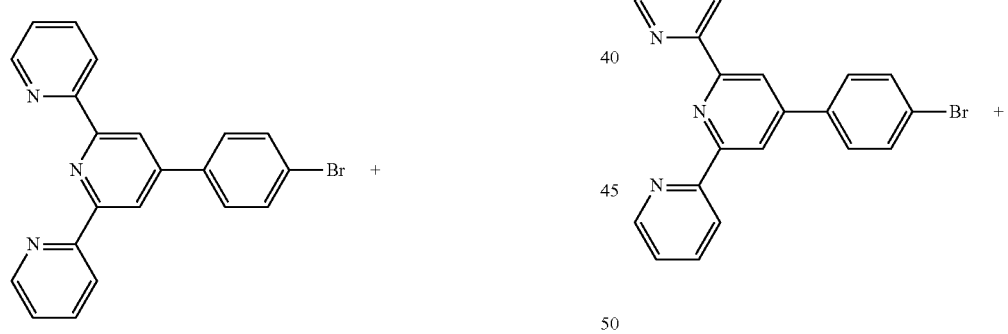

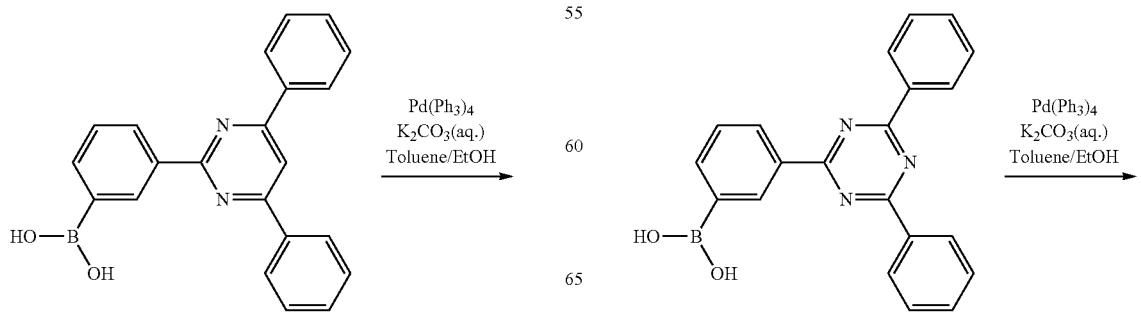

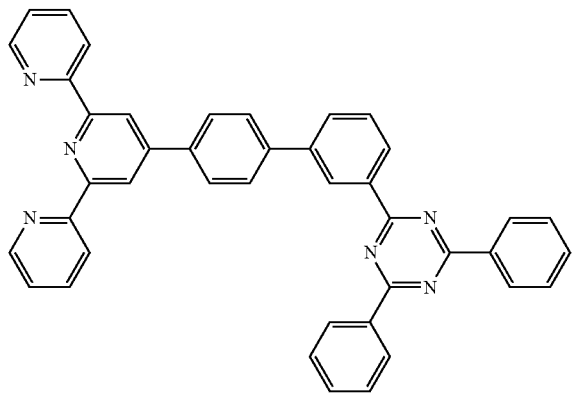

2-(4-(4-bromophenyl)-6-(pyridin-2-yl)pyridin-2-yl)pyridine) (5.00 g, 12.8 mmol), 3-(4,6-diphenyl-1,3,5-triazin-2-yl)phenylboronic acid) (3.53 g, 10 mmol), tetrakis triphenylphosphine palladium (0) (Pd(PPh3)4) (0.53 g, 0.46 mmol), a potassium carbonate solution (4M, 10 ml), 30 ml of toluene, and 10 ml of ethanol were put under a nitrogen atmosphere, and then refluxed and stirred for 12 hours. After the reaction, 50 ml of water (H₂O) was added, and the mixture was stirred for 3 hours, then vacuum-filtered, and then subjected to column chromatography using methylene chloride/hexane as the eluent, followed by MC recrystallization, to obtain Compound 1-9 (4.5 g, yield: 72.97%).

Synthesis of Compound 3-1

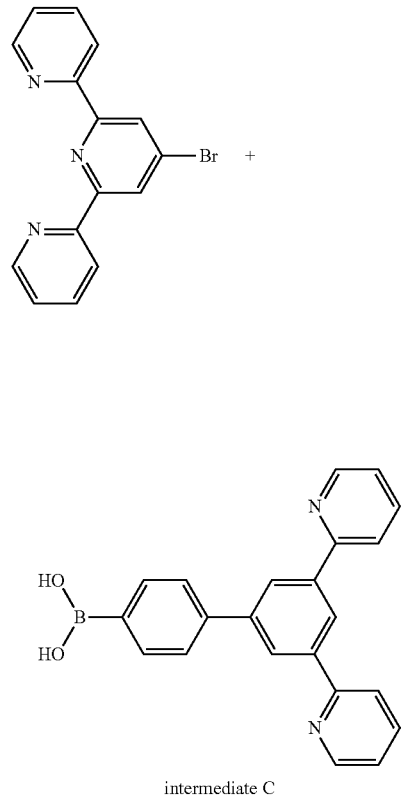

intermediate C

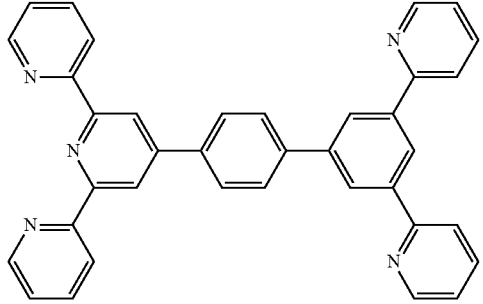

2-(4-bromo-6-(pyridin-2-yl)pyridin-2-yl)pyridine) (4.00 g 12.8 mmol), intermediate C (3.52 g 10 mmol), tetrakis triphenylphosphine palladium (0)(Pd(PPh3)4) (0.53 g, 0.46 mmol), a potassium carbonate solution (4M, 10 ml), 30 ml of toluene, and 10 ml of ethanol were put under a nitrogen atmosphere, and then refluxed and stirred for 12 hours. After the reaction, 50 ml of water (H₂O) was added, and the mixture was stirred for 3 hours, then vacuum-filtered, and then subjected to column chromatography using methylene chloride/hexane as the eluent, followed by MC recrystallization, to obtain Compound 3-1 (4.8 g, yield: 88.94%).

Synthesis of Comparative Compound

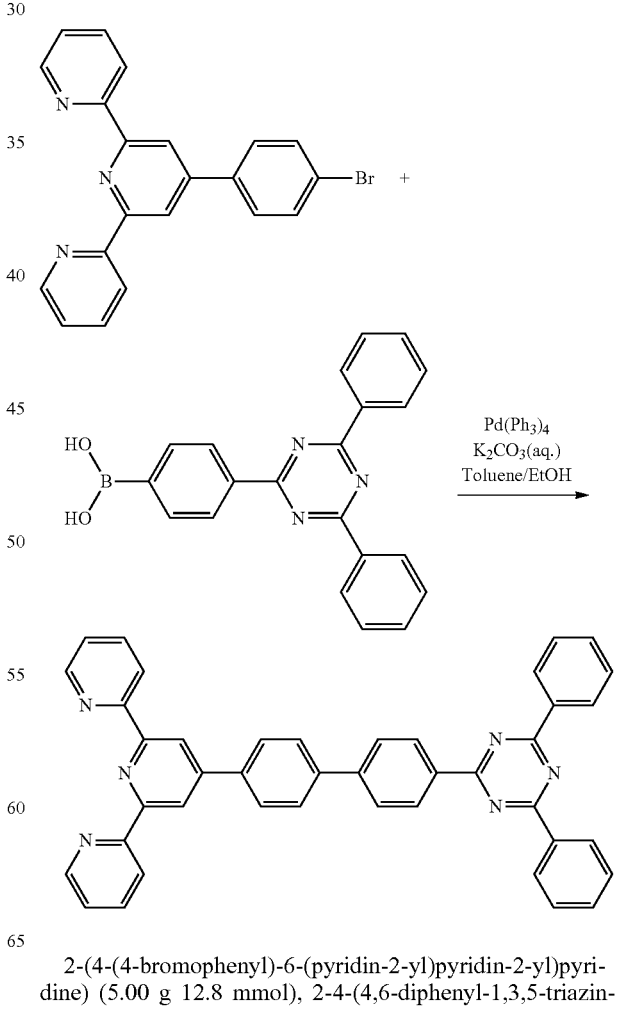

2-(4-(4-bromophenyl)-6-(pyridin-2-yl)pyridin-2-yl)pyridine) (5.00 g 12.8 mmol), 2-4-(4,6-diphenyl-1,3,5-triazin- 2-yl)phenylboronic acid (3.53 g 10 mmol), tetrakis triphenylphosphine palladium (0)(Pd(PPh3)4) (0.53 g, 0.46 mmol), a potassium carbonate solution (4M, 10 ml), 30 ml of toluene, and 10 ml of ethanol were put under a nitrogen atmosphere, and then refluxed and stirred for 12 hours. After the reaction, 50 ml of water ($H_2O$) was added, and the mixture was stirred for 3 hours, then vacuum-filtered, and then subjected to column chromatography using methylene chloride/hexane as the eluent, followed by MC recrystallization, to obtain Compound 3-1 (5.6 g, yield: 90.80%).

Hereinafter, embodiments for the manufacture of an organic light emitting display device according to the present disclosure will be disclosed. However, the following materials for the electron transport layer do not limit the scope of the present disclosure.

Test 1: Characteristics of Monolithic Device

Comparative Example 1

An organic light emitting display device was manufactured by forming, on a substrate, an anode, a hole injection layer, a hole transport layer, a blue light emitting layer, an electron transport layer, an electron injection layer, and a cathode. Here, the electron transport layer was formed of an anthracene compound and a carbazole compound with a 50:50 volume ratio.

Comparative Example 2

It has the same elements as the above-described Comparative Example 1, and the electron transport layer was formed only of the above Comparative Compound.

Embodiment 1

It has the same elements as the above-described Comparative Example 1, and the electron transport layer was formed only of the above Compound 1-4.

Embodiment 2

It has the same elements as the above-described Comparative Example 1, and the electron transport layer was formed only of the above Compound 1-9.

Embodiment 3

It has the same elements as the above-described Comparative Example 1, and the electron transport layer was formed only of the above Compound 3-1.

The operating voltage, efficiency, chromaticity coordinates, and lifetime of the devices manufactured according to the above-described Comparative Examples 1 and 2 and Embodiments 1, 2, and 3 were measured and shown in the following Table 1. (The devices operated at a current density of 10 $mA/cm^2$ to measure the operating voltage, efficiency, and chromaticity coordinates, and the devices operated at a current density of 50 $mA/cm^2$ to measure the lifetime. T95 is the time it takes for the luminance to decrease to 95% of the initial luminance).

Figure 4:
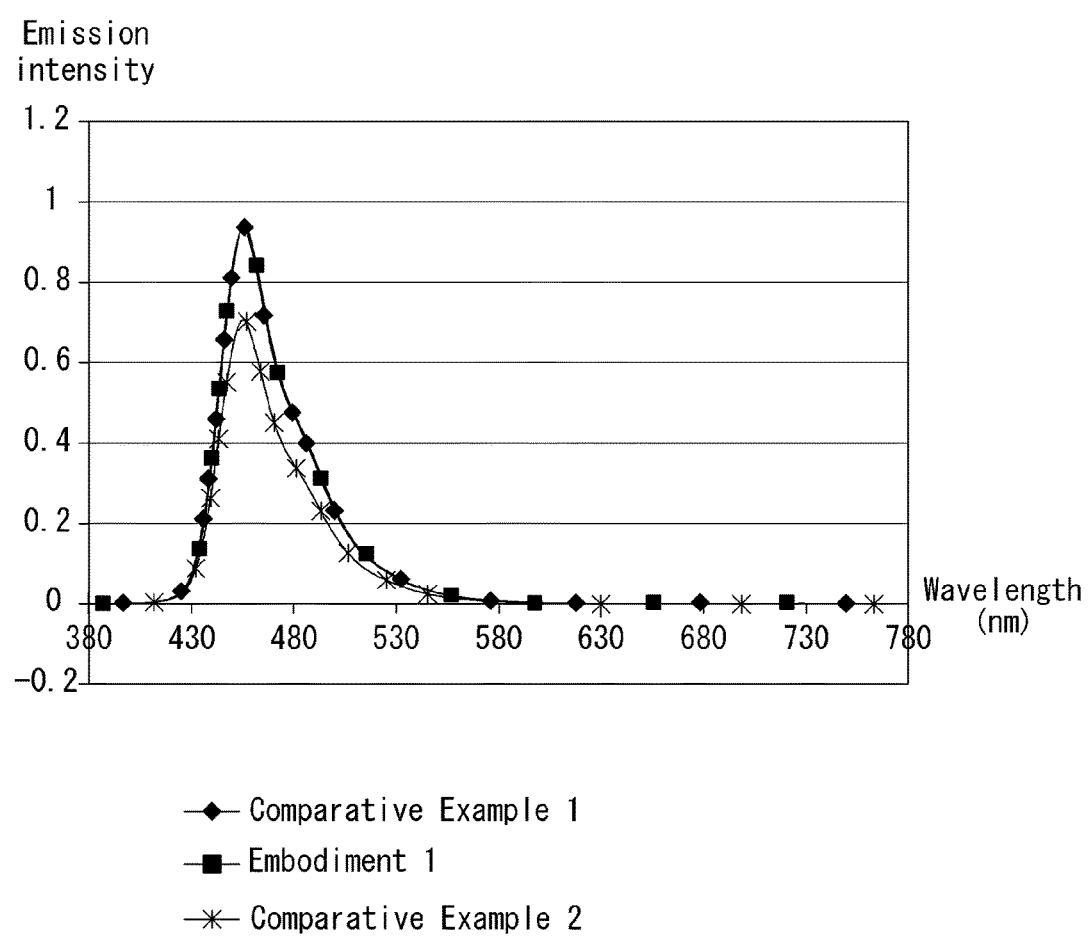
FIG. 4 is a graph showing the light emission spectra of devices manufactured according to Comparative Examples 1 and 2 and Embodiment 1 according to the present disclosure.
Figure 5:
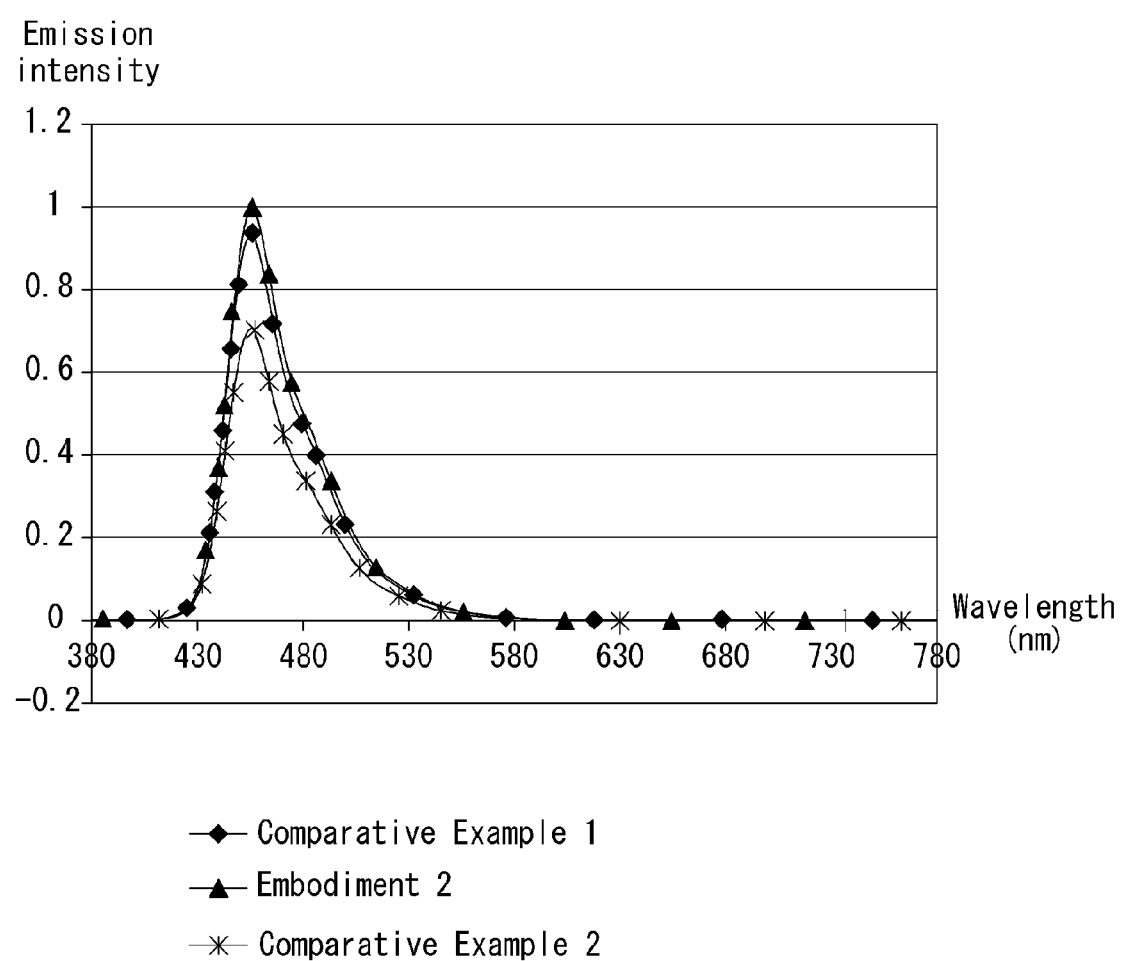
FIG. 5 is a graph showing the light emission spectra of devices manufactured according to Comparative Examples 1 and 2 and Embodiment 2 according to the present disclosure.
Figure 6:
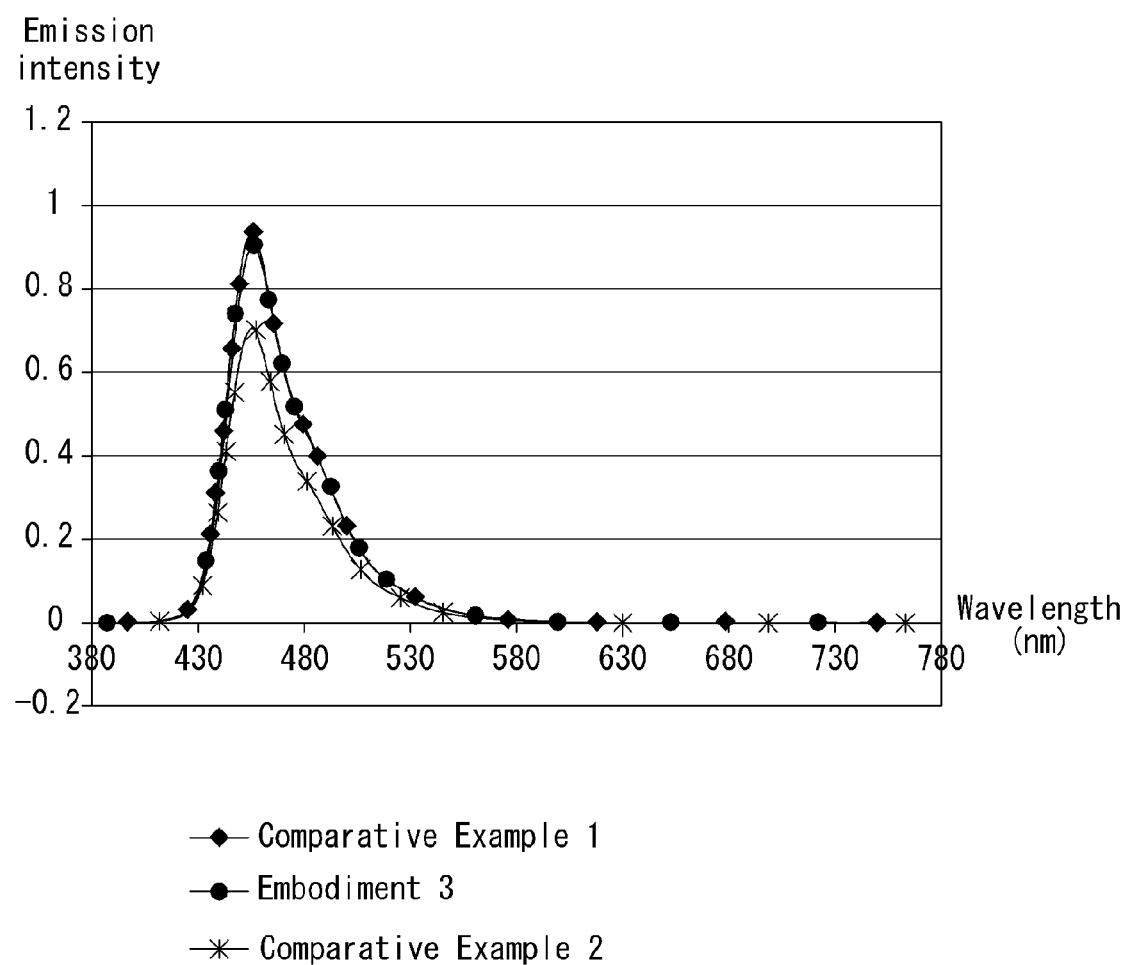
FIG. 6 is a graph showing the light emission spectra of devices manufactured according to Comparative Examples 1 and 2 and Embodiment 3 according to the present disclosure.

The light emission spectra of the organic light emitting display devices manufactured according to Comparative Examples 1 and 2 and Embodiment 1 were measured and shown in FIG. 4, the light emission spectra of the organic light emitting display devices manufactured according to Comparative Examples 1 and 2 and Embodiment 2 were measured and shown in FIG. 5, and the light emission spectra of the organic light emitting display devices manufactured according to Comparative Examples 1 and 2 and Embodiment 3 were measured and shown in FIG. 6. In FIGS. 4 to 6, the horizontal axis represents wavelength, and the vertical axis represents intensity.

TABLE 1

| | Operative voltage (V) | Efficiency (Cd/A) | Chromaticity coordinates | | Lifetime (T95, @50 $mA/cm^2$) |
|---|---|---|---|---|---|
| | | | CIE_x | CIE_y | |
| Comparative Example 1 | 3.8 | 5.9 | 0.139 | 0.099 | 50 |
| Comparative Example 2 | 4.3 | 4.4 | 0.139 | 0.098 | 50 |
| Embodiment 1 | 3.8 | 6.1 | 0.139 | 0.102 | 56 |
| Embodiment 2 | 3.7 | 6.4 | 0.139 | 0.101 | 62 |
| Embodiment 3 | 3.8 | 6.0 | 0.139 | 0.103 | 51 |

Referring to Table 1, Embodiment 1 comprising Compound 1-4 of this disclosure showed similar chromaticity coordinate values, the same operating voltage, an increase of 0.2 Cd/A in efficiency, and an increase of 6 hours in lifetime, compared to Comparative Example 1 in which an anthracene compound and a carbazole compound were mixed in with an electron transport layer. Embodiment 2 comprising Compound 1-9 of this disclosure showed similar chromaticity coordinate values, a decrease of 0.1 V in operating voltage, an increase of 0.5 Cd/A in efficiency, and an increase of 12 hours in lifetime, compared to Comparative Example 1. Embodiment 3 comprising Compound 3-1 of this disclosure showed similar chromaticity coordinate values, the same operating voltage, an increase of 0.1 Cd/A in efficiency, and an increase of 1 hour in lifetime, compared to Comparative Example 1. Comparative Example 2 comprising Comparative Compound of this disclosure showed similar chromaticity coordinate values, the same lifetime, an increase of 0.5 V in operating voltage, and a decrease of 1.5 Cd/A in efficiency, compared to Comparative Example 1.

From these results, it can be found out that the organic light emitting display devices according to the embodiments using an electron transport layer comprising a compound of this disclosure showed similar chromaticity coordinate values, the same operating voltage, and improved efficiency and lifetime, compared to the organic light emitting display device according to Comparative Example 1 using an electron transport layer formed of different materials.

Moreover, it can be found out that Comparative Example 2 in which the electron transport layer was formed of a comparative compound comprising a substituent substituted at the para position of a bridge, in this disclosure, showed a significant reduction in the operating voltage and a significant enhancement in the efficiency of the organic light emitting display device.

Referring to FIG. 4, the device according to Embodiment 1 of the present disclosure showed a similar emission intensity level as Comparative Example 1 and a higher emission intensity level than Comparative Example 2. Referring to FIG. 5, the device according to Embodiment 2 of the present disclosure showed a higher emission intensity level than Comparative Examples 1 and 2. Referring to FIG. 6, the device according to Embodiment 3 of the present disclosure showed a similar emission intensity level as Comparative Example 1 and a higher emission intensity level than Comparative Example 2.

These results demonstrate that the organic light emitting display devices according to the present disclosure have similar light emission spectra, while using an electron transport layer formed of a single material, in place of two different materials.

Test 2: Characteristics of Multilayer Light Emitting Display Device

Comparative Example 3

An organic light emitting display device was manufactured by forming, on a substrate, a first light emitting part comprising a hole injection layer, first hole transport layer, fluorescent blue light emitting layer, and first electron transport layer, a first charge generation layer comprising an N-type charge generation layer and a P-type charge generation layer, a second light emitting part comprising a second hole transport layer, phosphorescent yellow-green light emitting layer, and second electron transport layer, a second charge generation layer comprising an N-type charge generation layer and a P-type charge generation layer, a third light emitting part comprising a third hole transport layer, fluorescent blue light emitting layer, third electron transport layer, and electron injection layer, and a cathode. Here, the third electron transport layer was formed of an anthracene compound and a carbazole compound with a 50:50 volume ratio.

Comparative Example 4

It has the same elements as the above-described Comparative Example 3, and the third electron transport layer was formed only of the above Comparative Compound.

Embodiment 4

It has the same elements as the above-described Comparative Example 3, and the third electron transport layer was formed only of the above Compound 1-9.

Embodiment 5

It has the same elements as the above-described Comparative Example 3, and the third electron transport layer was formed only of the above Compound 3-1.

The operating voltage, efficiency, chromaticity coordinates, and lifetime of the devices manufactured according to the above-described Comparative Examples 3 and 4 and Embodiments 4 and 5 were measured and shown in the following Table 2. (The devices operated at a current density of 10 mA/cm² to measure the operating voltage, efficiency, and chromaticity coordinates, and the devices operated at a current density of 50 mA/cm² to measure the lifetime. T98 is the time it takes for the luminance to decrease to 98% of the initial luminance. The initial luminance was 3000 nit).

Figure 7:
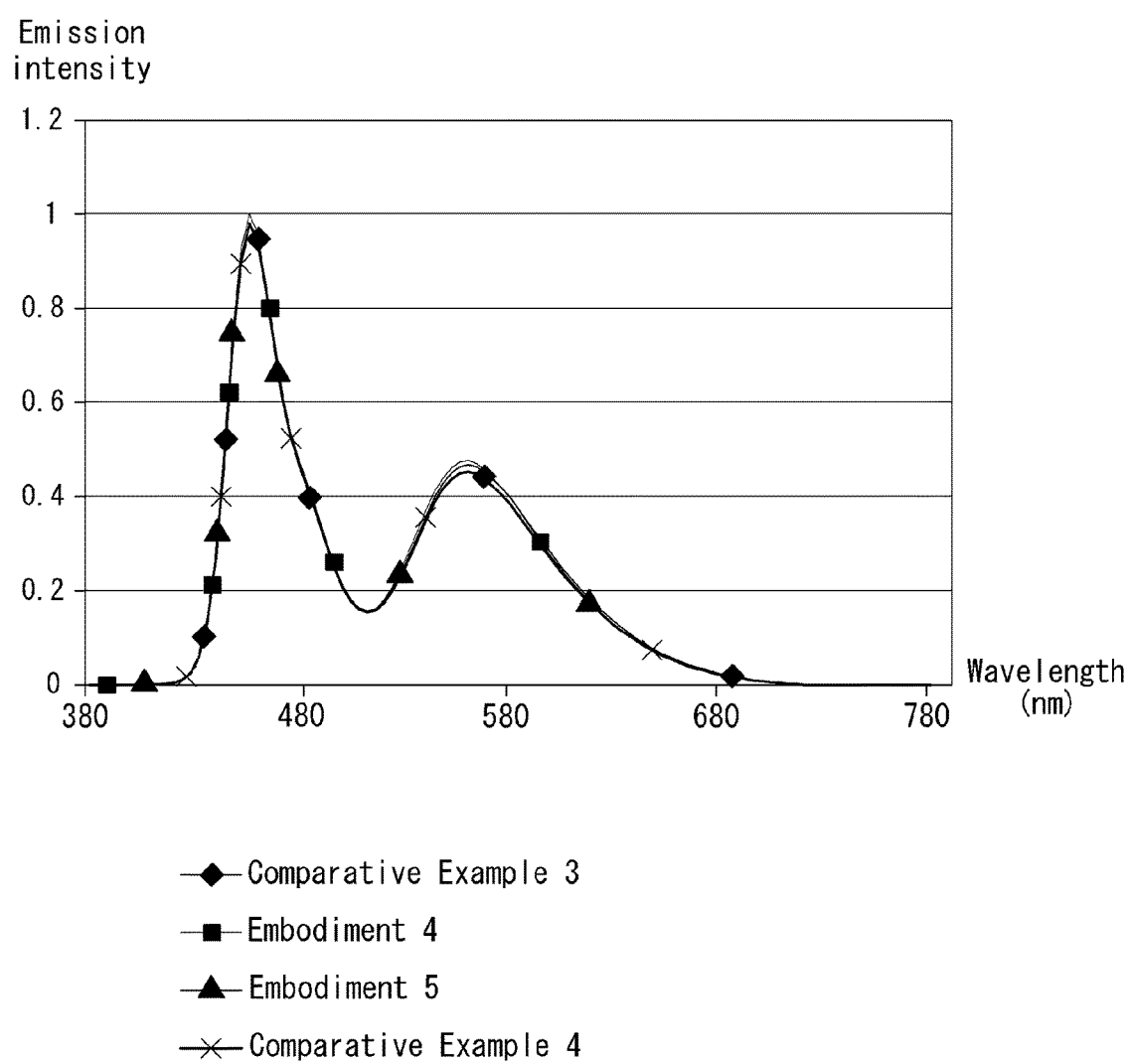
FIG. 7 is a graph showing the light emission spectra of devices manufactured according to Comparative Examples 3 and 4 and Embodiments 4 and 5 according to the present disclosure.

The light emission spectra of the organic light emitting display devices manufactured according to Comparative Examples 3 and 4 and Embodiments 4 and 5 were measured and shown in FIG. 7. In FIG. 7, the horizontal axis represents wavelength, and the vertical axis represents intensity.

TABLE 2

| | Operative voltage (V) | Efficiency (Cd/A) | Chromaticity coordinates | | Lifetime (T98, @50 mA/cm²) | |
|---|---|---|---|---|---|---|
| | | | CIE_x | CIE_y | Blue | White |
| Comparative Example 3 | 11.7 | 72.4 | 0.278 | 0.288 | 564 | 1051 |
| Comparative Example 4 | 12.2 | 72.1 | 0.285 | 0.297 | 511 | 957 |
| Embodiment 4 | 11.7 | 74.6 | 0.281 | 0.292 | 677 | 989 |
| Embodiment 5 | 11.9 | 75.1 | 0.279 | 0.291 | 747 | 1034 |

Referring to Table 2, Embodiment 4 comprising Compound 1-9 of this disclosure showed similar chromaticity coordinate values, the same operating voltage, an increase of 2.2 Cd/A in efficiency, an increase of 113 hours in blue lifetime, and an increase of 62 hours in white lifetime, compared to Comparative Example 3 in which an anthracene compound and a carbazole compound were mixed in with an electron transport layer. Embodiment 5 comprising Compound 3-1 of this disclosure showed similar chromaticity coordinate values, a decrease of 0.2 V in operating voltage, an increase of 2.7 Cd/A in efficiency, and an increase of 183 hours in blue lifetime, and an increase of 17 hours in white lifetime, compared to Comparative Example 3. Comparative Example 4 comprising Comparative Compound of this disclosure showed similar chromaticity coordinate values, an increase of 0.5 V in operating voltage, and a decrease of 0.3 Cd/A in efficiency, a decrease of 53 hours in blue lifetime, and a decrease of 94 hours in white lifetime, compared to Comparative Example 3.

From these results, it can be determined that the organic light emitting display devices according to the embodiments using an electron transport layer comprising a compound of this disclosure showed similar chromaticity coordinate values, the same operating voltage, improved efficiency, and improved lifetime, especially, the lifetime of fluorescent blue light, compared to the organic light emitting display device according to Comparative Example 3 using an electron transport layer formed of different materials.

Moreover, it can be determined that Comparative Example 4 in which the electron transport layer was formed of a comparative compound comprising a substituent substituted at the para position of a bridge, this disclosure showed a significant reduction in the operating voltage, and a significant enhancement in efficiency, and lifetime of the organic light emitting display device.

Referring to FIG. 7, the devices according to Embodiments 4 and 5 of the present disclosure showed a similar emission intensity level as Comparative Examples 3 and 4.

These results demonstrate that the organic light emitting display devices according to the present disclosure have similar white light emission spectra, while using an electron transport layer formed of a single material, in place of two different materials.

A compound of this disclosure may facilitate the transport of electrons by the electron transport layer by comprising a terpyridine derivative that has high electron mobility by including three electron-rich nitrogen atoms. Also, the compound of this disclosure may maximize the effect of triplet-triplet annihilation and therefore improve fluorescence efficiency by comprising a substituent substituted at the meta position of a bridge. Also, the compound of this disclosure may make it easy for the substituent to be substituted at the meta position while maintaining the characteristics of the terpyridine derivative by comprising an unbulky bridge between the terpyridine derivative and the substituent.

Accordingly, the electron transport properties may be improved by forming an electron transport layer formed of a compound of this disclosure, thereby reducing the operating voltage of the device and improving the efficiency. Also, the compound of this disclosure may improve the fluorescence efficiency of the device by maximizing the effect of triplet-triplet annihilation. Also, the manufacturing costs of the organic light emitting display device may be reduced by forming an electron transport layer formed of a single material which is the compound of this disclosure.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting display device comprising at least one light emitting part between an anode and a cathode and comprising at least one organic layer and a light emitting layer,
wherein the at least one organic layer comprises a compound represented by the following Chemical Formula 1:

[Chemical Formula 1]

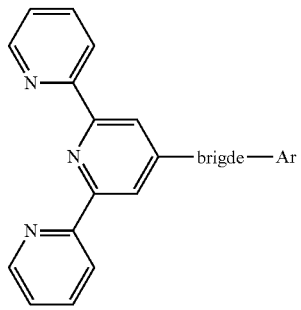

wherein the bridge includes one among biphenyl and naphthylphenyl groups, Ar is substituted at the meta position of the bridge, and Ar includes a substituted or unsubstituted heteroaromatic group having 1 to 3 nitrogen atoms.

2. The organic light emitting display device of claim 1, wherein the substituent maximizes the effect of triplet-triplet annihilation by breaking a conjugation of the compound.

3. The organic light emitting display device of claim 1, wherein the at least one organic layer includes an electron transport layer.

4. The organic light emitting display device of claim 3, wherein the at least one light emitting part comprises at least two or more light emitting parts, and one of the at least two or more light emitting parts is a blue light emitting part and the another one of the at least two or more light emitting parts is a yellow-green light emitting part.

5. The organic light emitting display device of claim 4, wherein the organic layer is included in the blue light emitting part.

6. The organic light emitting display device of claim 1, wherein the compound having the substituent at the meta position of the bridge enhances efficiency and lifetime and reduces operating voltage compared to the compound having a substituent at a para position of the bridge.

7. The organic light emitting display device of claim 1, wherein the compound represented by Chemical Formula 1 includes one among the following compounds represented by Chemical Formulae 2 to 5:

[Chemical Formula 2]

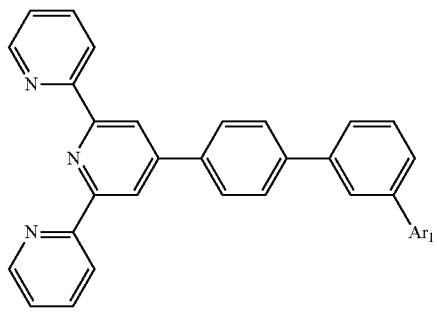

[Chemical Formula 3]

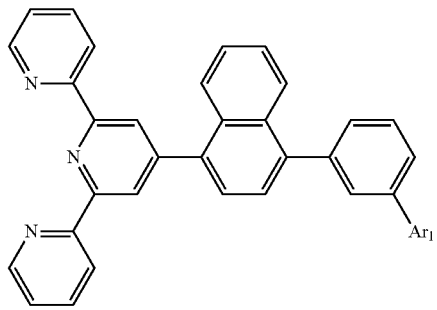

[Chemical Formula 4]

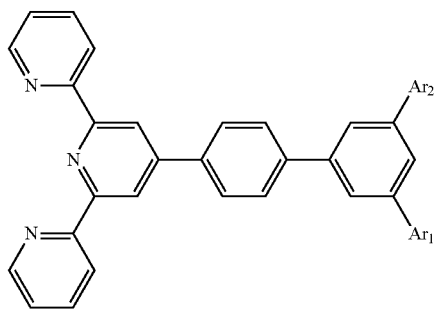

[Chemical Formula 5]

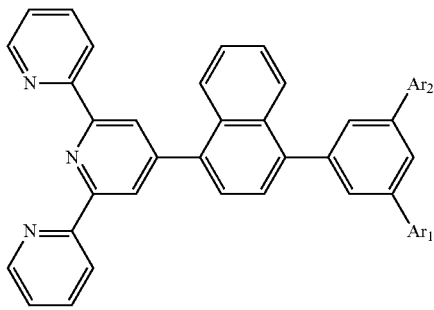

wherein, in Chemical Formulae 2 to 5, Ar₁ includes a substituted or unsubstituted heteroaromatic group having 1 to 3 nitrogen atoms that has a molecular weight of 400 or less, and in Chemical Formulae 4 and 5, Ar₂ includes a substituted or unsubstituted heteroaromatic group having 1 to 3 nitrogen atoms that has a molecular weight of 400 or less.

8. The organic light emitting display device of claim 1, wherein the compound represented by Chemical Formula 1 includes one among the following compounds:

1-1

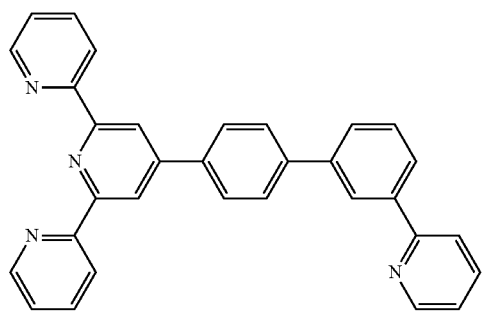

1-2

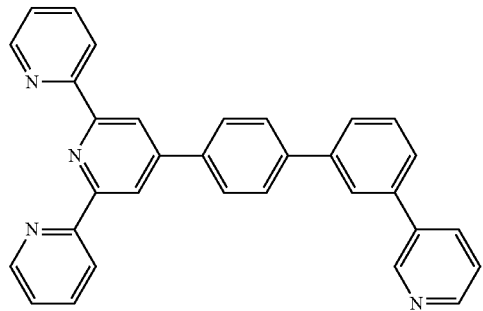

1-3

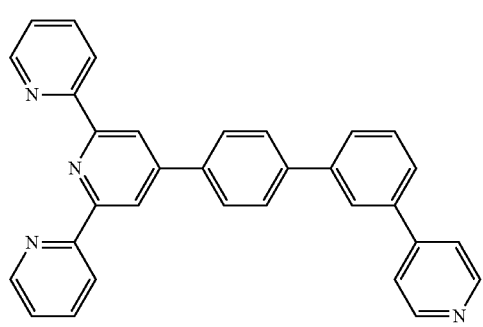

1-4

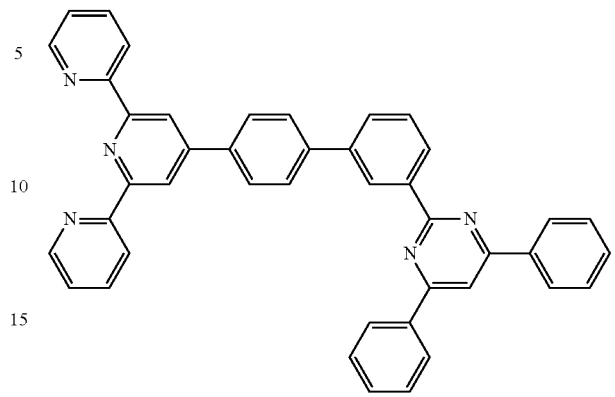

1-5

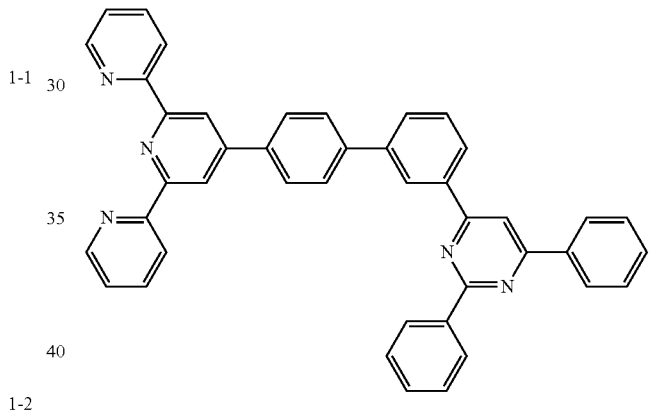

1-6

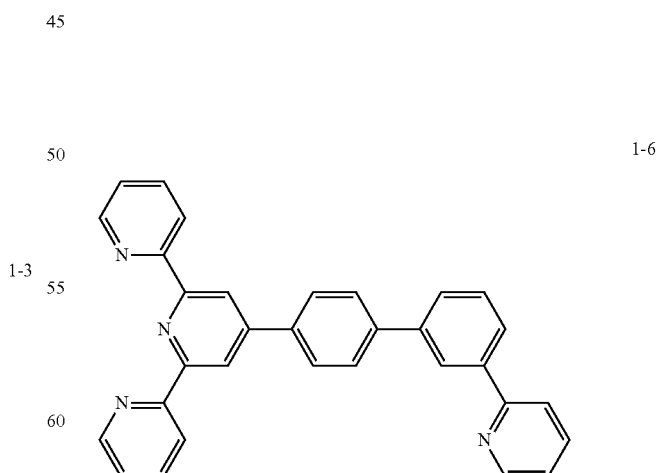

-continued
1-7
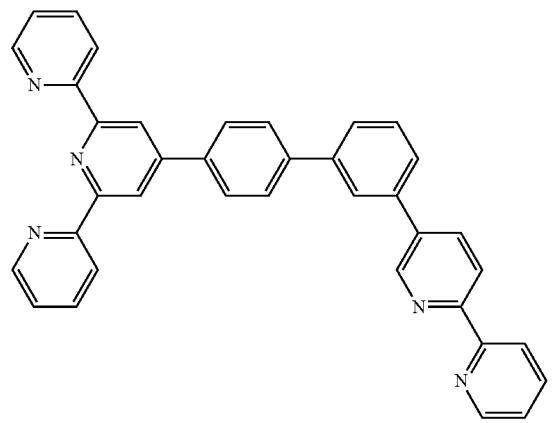
1-8
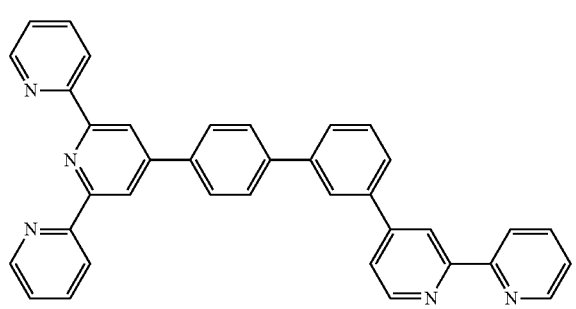
1-9
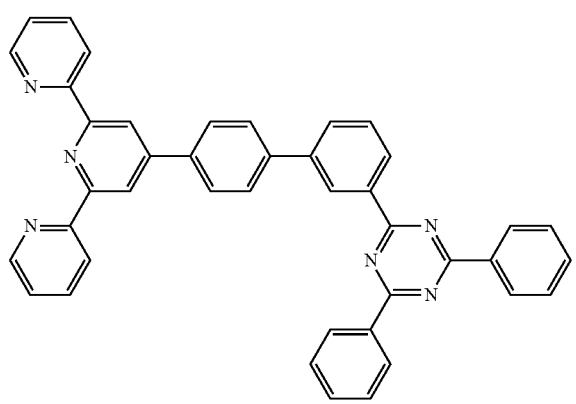
-continued
1-10
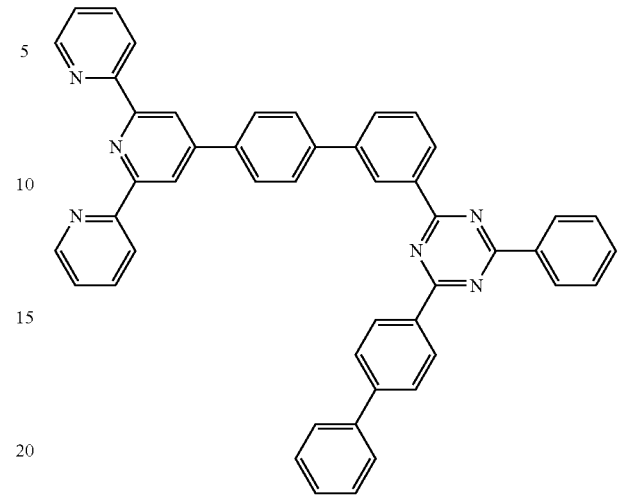
1-11
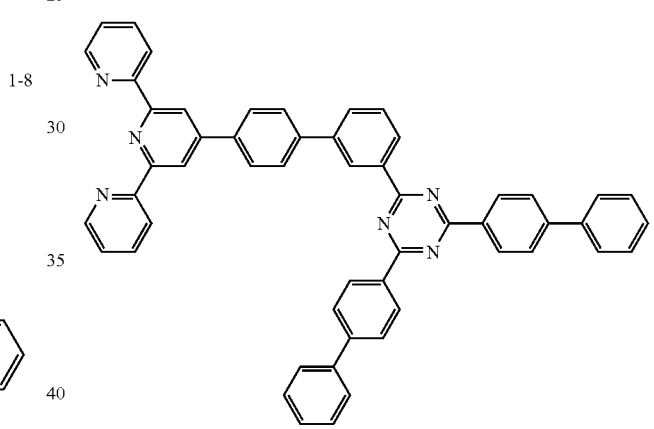
2-1
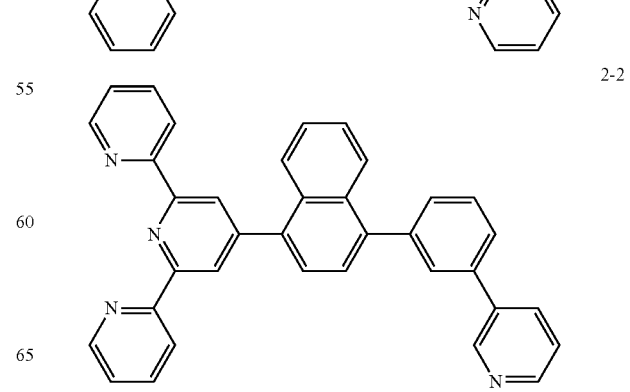
2-2

2-3
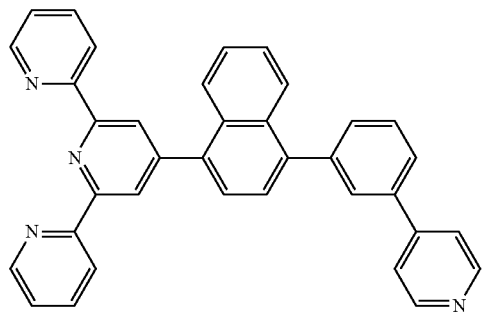
2-4
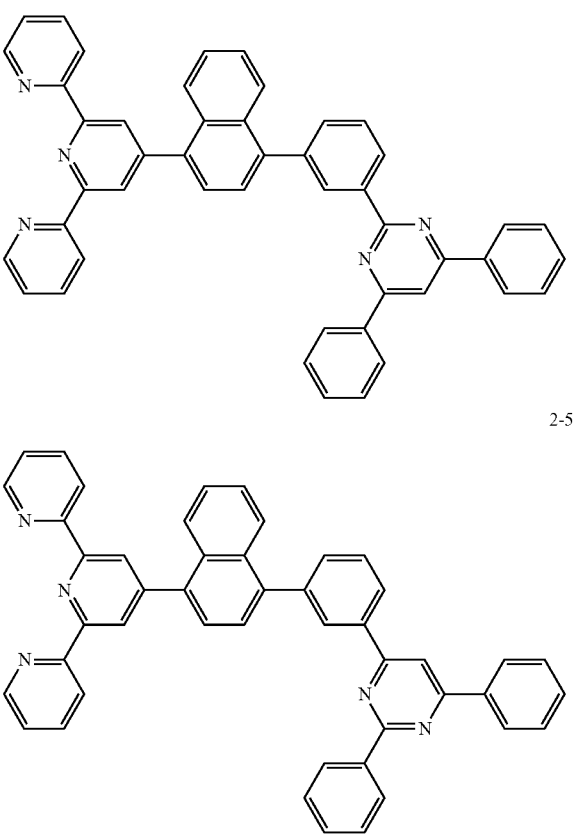
2-5
2-6
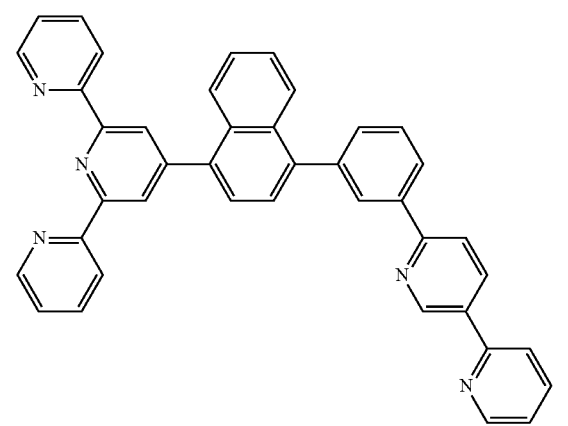
2-7
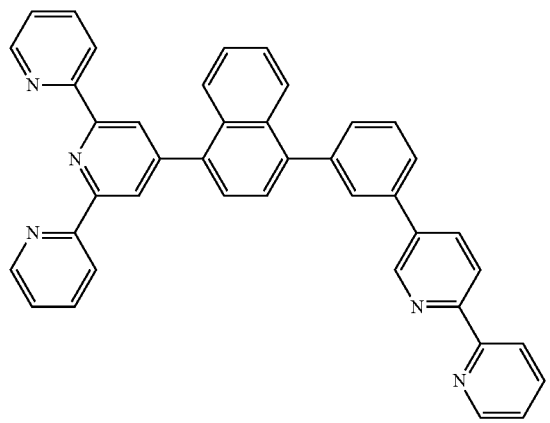
2-8
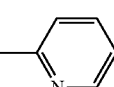
2-9
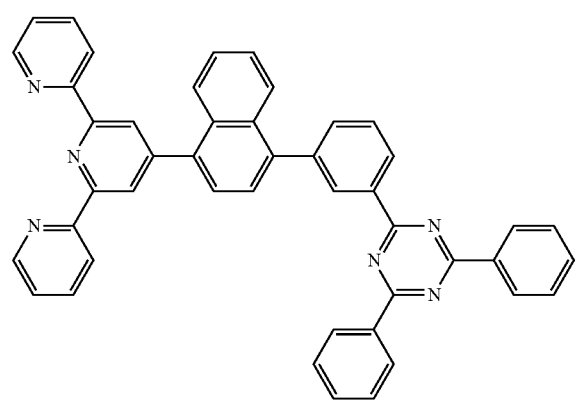

2-10
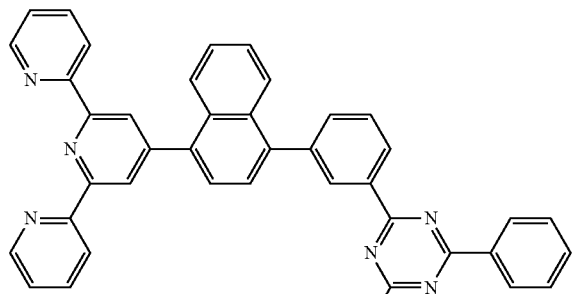
2-11
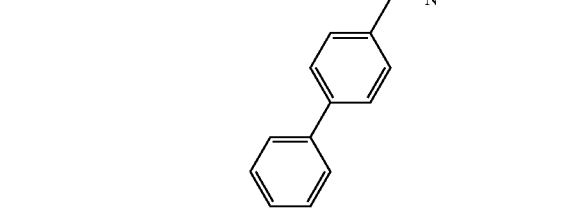
3-1
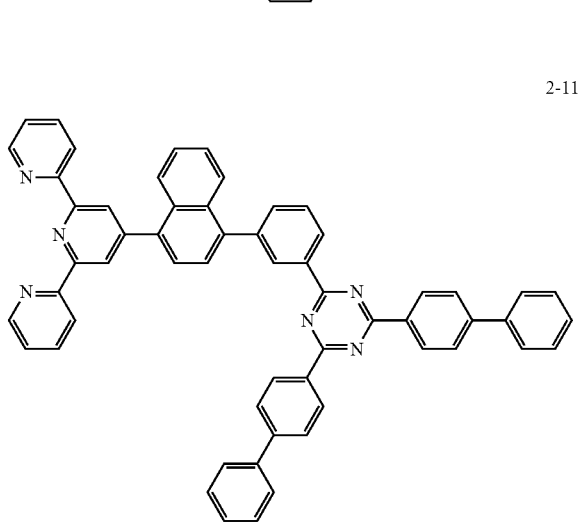
3-2
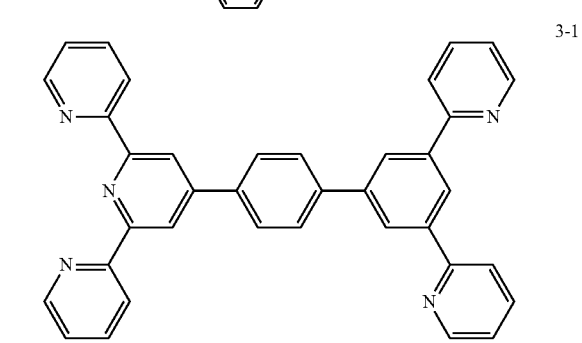
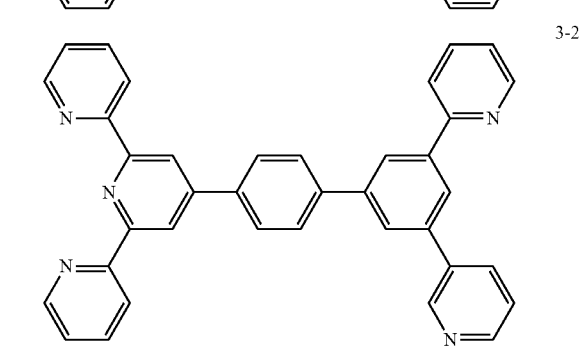
3-3
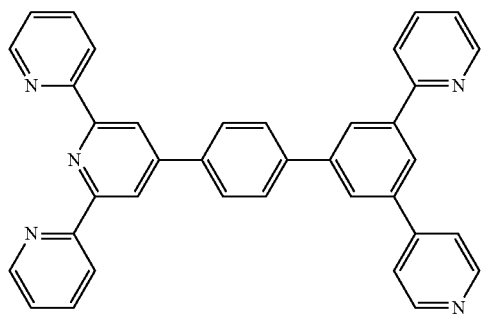
3-4
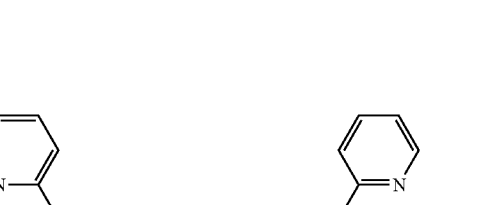
3-5
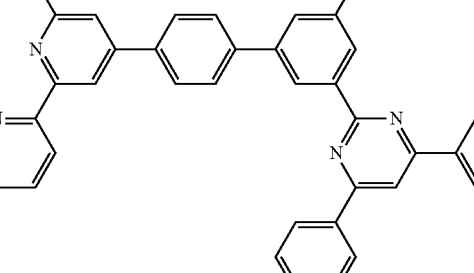
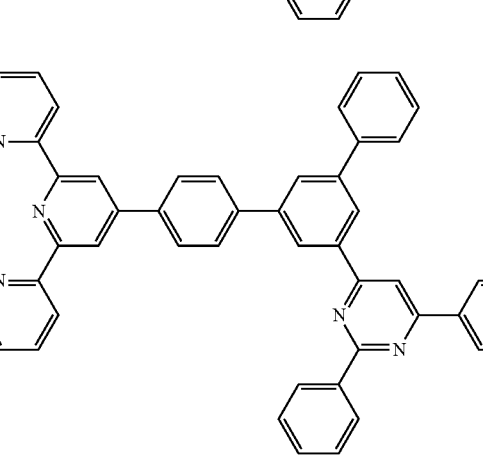
3-6
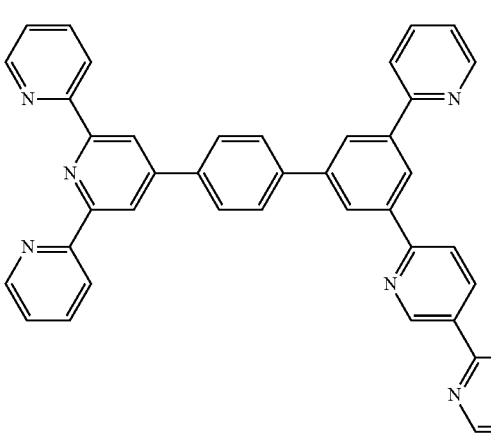

3-7
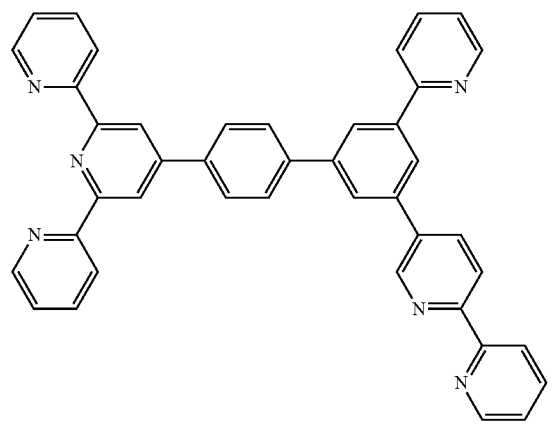
3-8
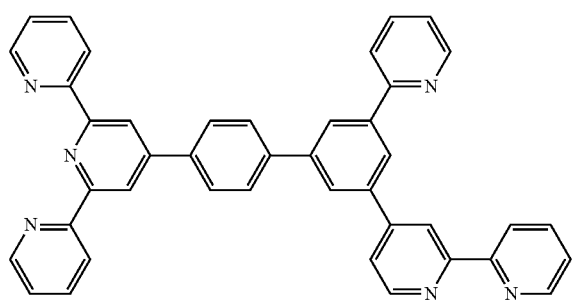
3-9
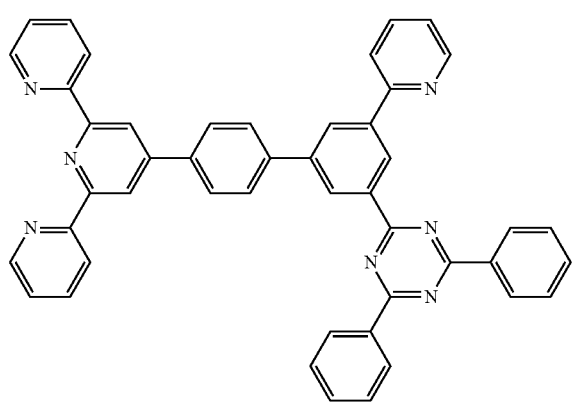
3-10
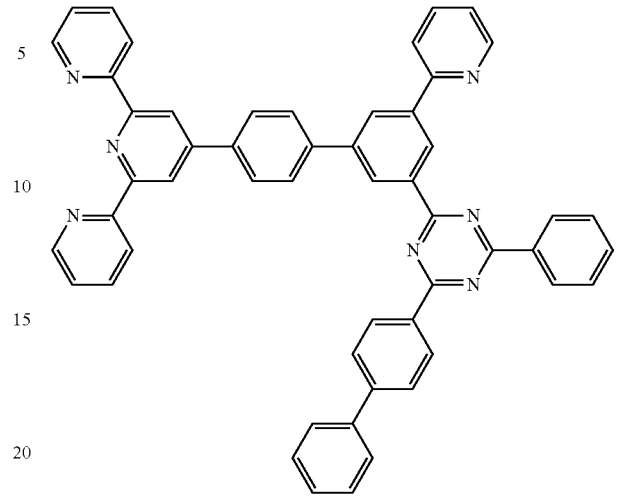
3-11
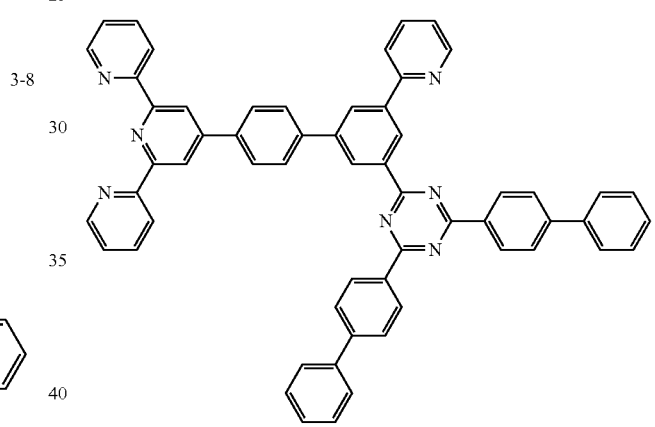
3-12
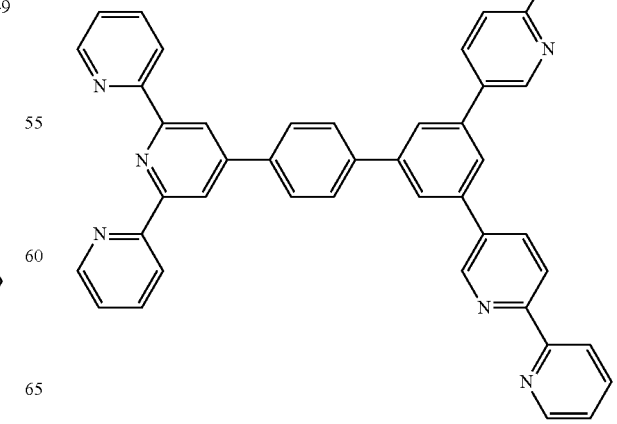

3-13
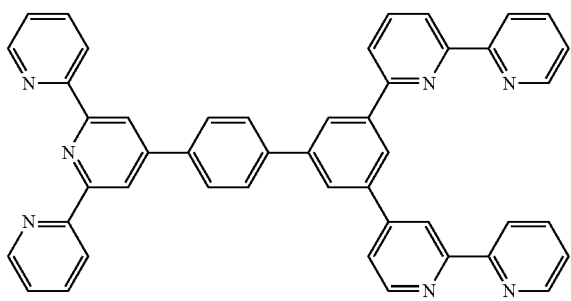
3-14
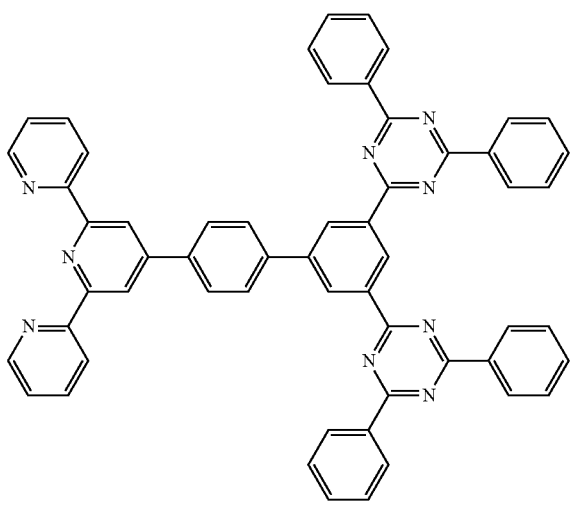
3-15
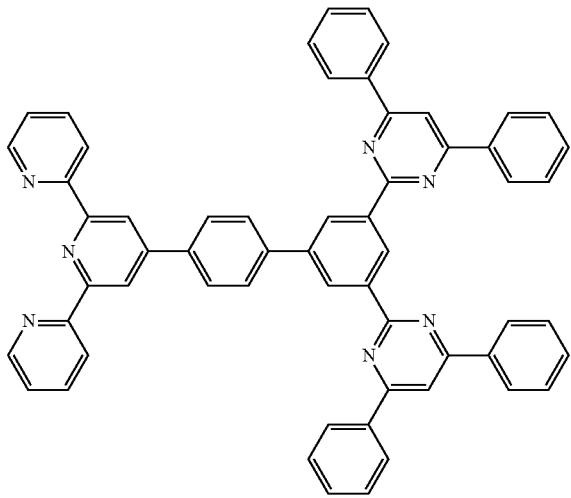
3-16
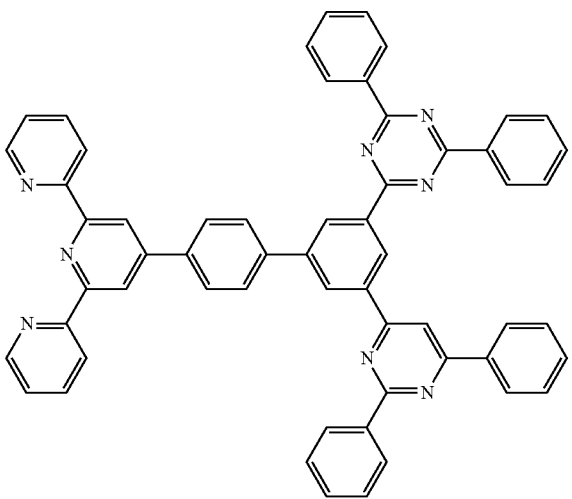
3-17
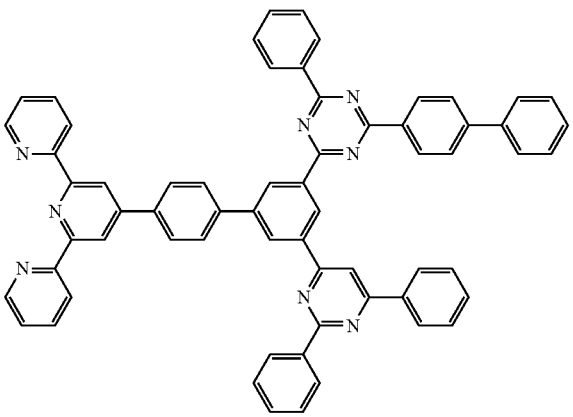
3-18
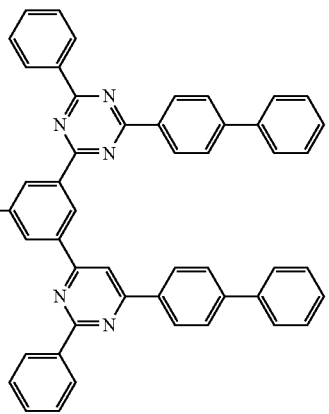

4-1
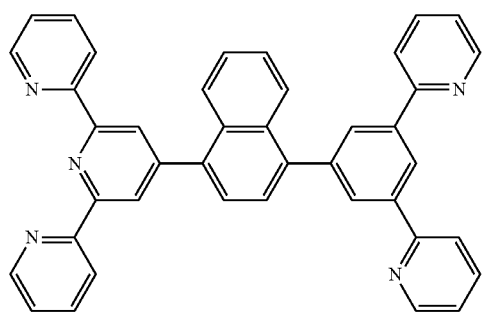
4-4
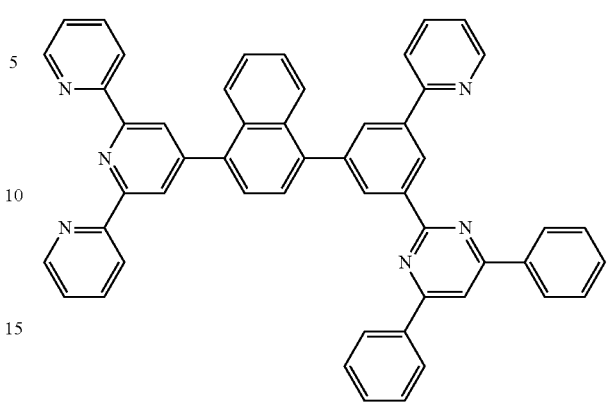
4-2
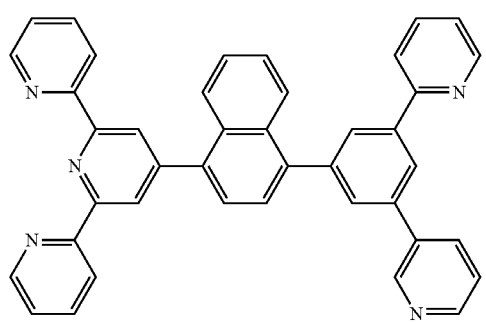
4-5
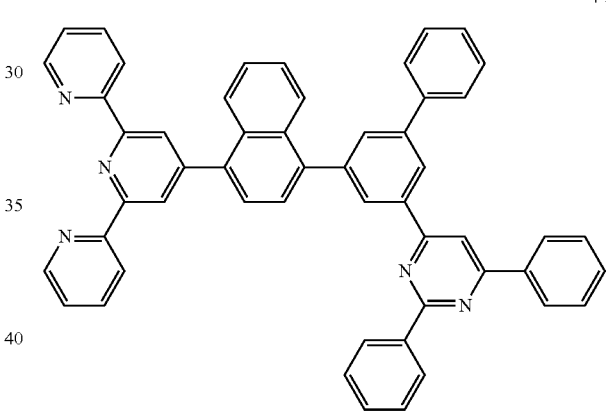
4-3
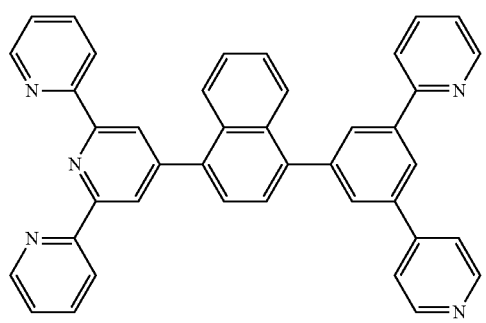
4-6
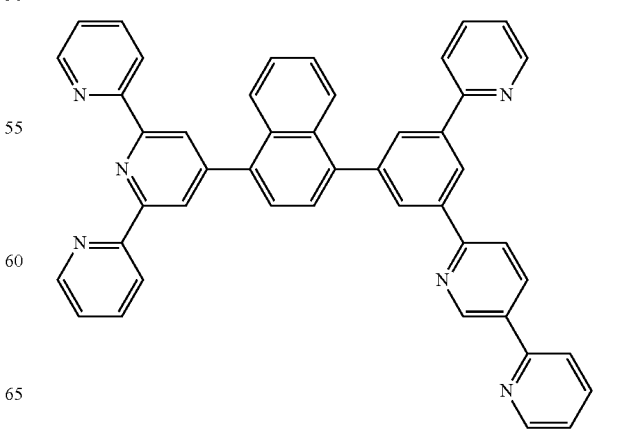

4-7
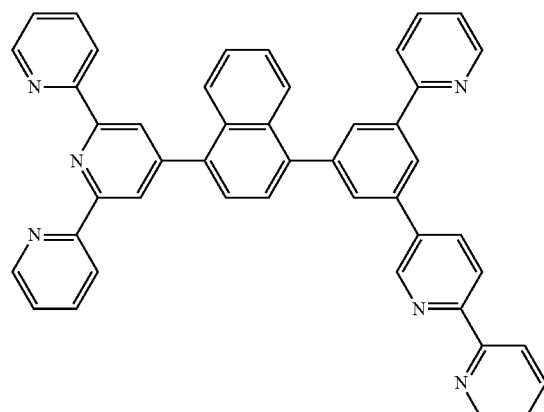
4-10
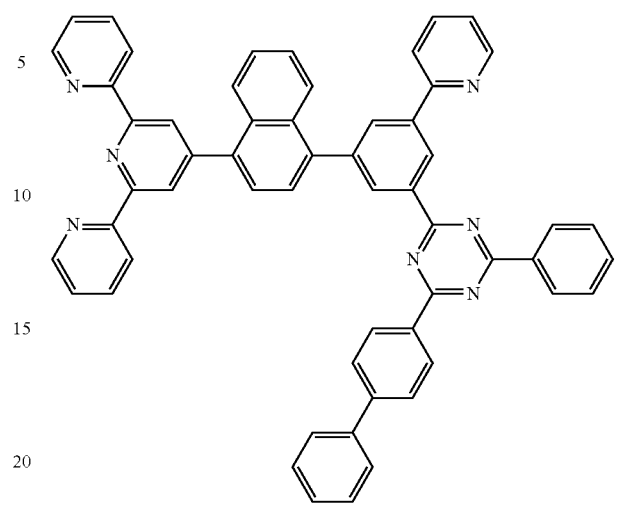
4-8
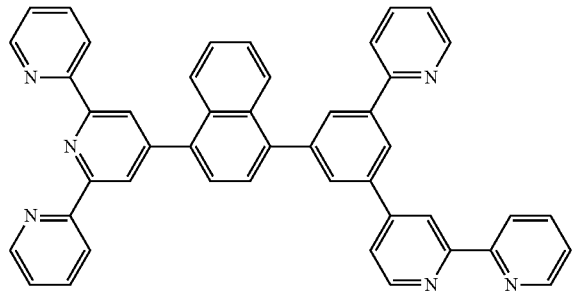
4-11
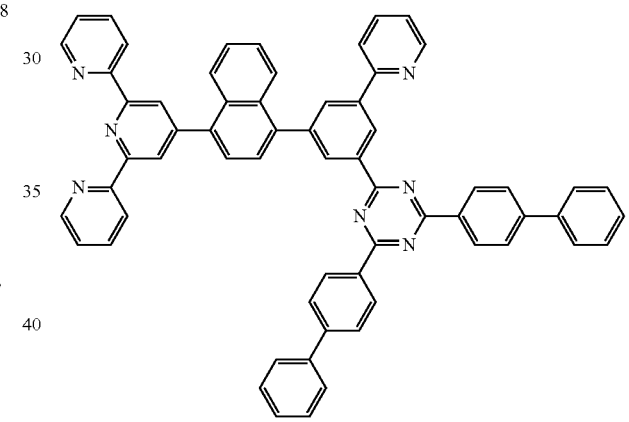
4-9
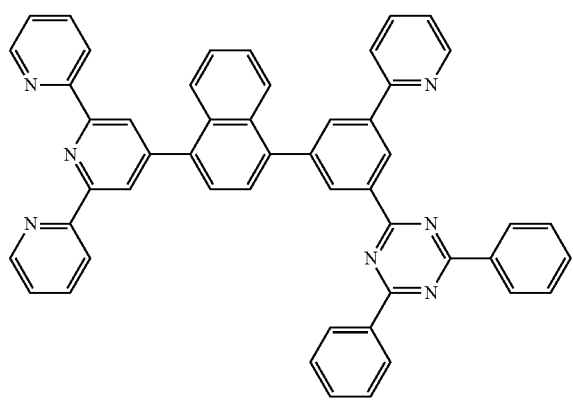
4-12
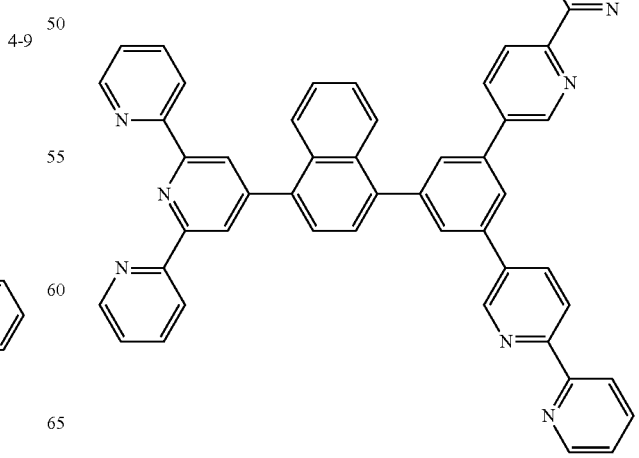

4-13
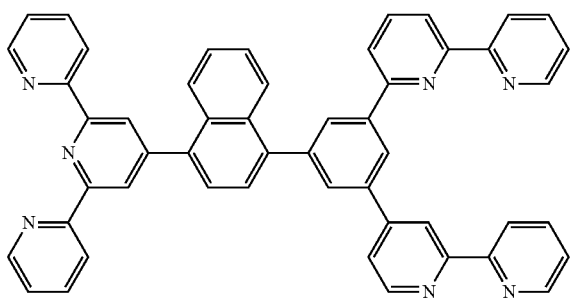
4-14
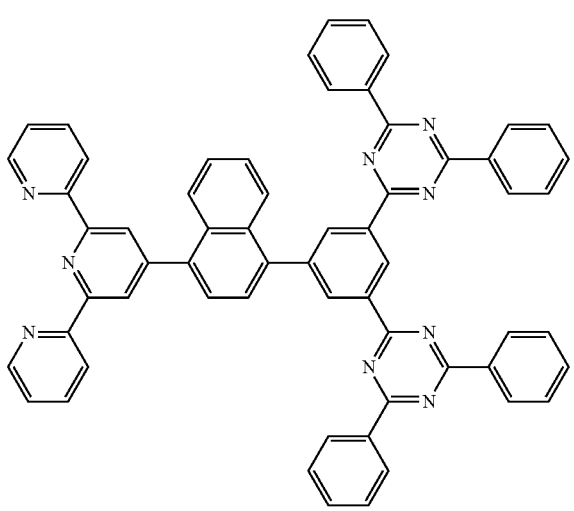
4-15
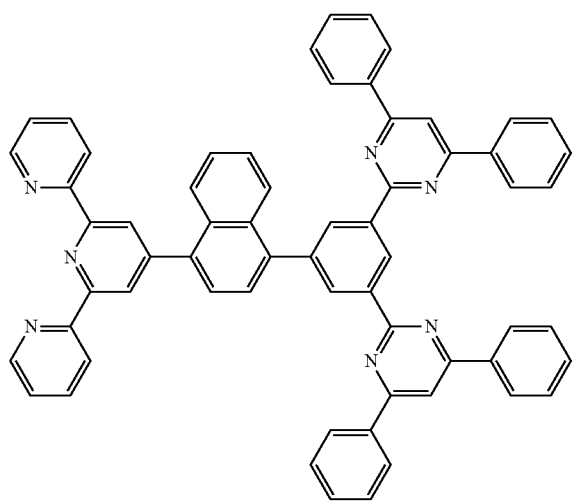
4-16
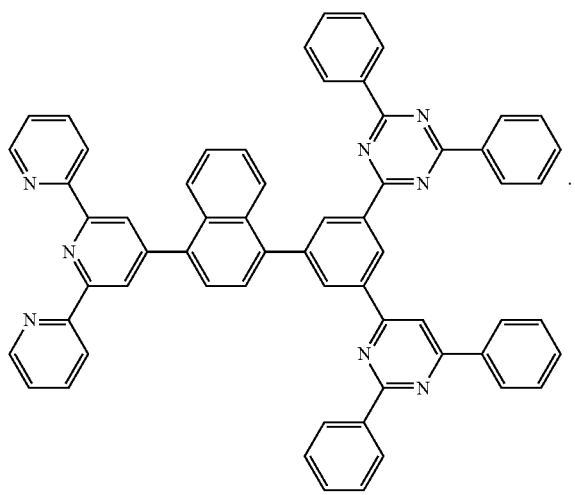
9. The organic light emitting display device of claim 1, wherein a molecular weight of the Ar is 400 or less so as to break a conjugation of the compound and maintain an electron mobility of the compound.
* * * * *